US012125959B2

(12) United States Patent
Morris et al.

(10) Patent No.: US 12,125,959 B2
(45) Date of Patent: *Oct. 22, 2024

(54) BONDING INTERFACE FOR HYBRID TFT-BASED MICRO DISPLAY PROJECTOR

(71) Applicant: Meta Platforms Technologies, LLC, Menlo Park, CA (US)

(72) Inventors: Daniel Henry Morris, Mountain View, CA (US); John Goward, Redmond, WA (US); Chloe Astrid Marie Fabien, Seattle, WA (US); Michael Grundmann, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,484

(22) Filed: Apr. 26, 2022

(65) Prior Publication Data
US 2022/0254974 A1 Aug. 11, 2022

Related U.S. Application Data

(63) Continuation of application No. 16/660,648, filed on Oct. 22, 2019, now Pat. No. 11,349,052.
(Continued)

(51) Int. Cl.
H01L 25/16 (2023.01)
G02B 27/01 (2006.01)
(Continued)

(52) U.S. Cl.
CPC .......... H01L 33/62 (2013.01); G02B 27/0172 (2013.01); G06F 1/163 (2013.01);
(Continued)

(58) Field of Classification Search
CPC combination set(s) only.
See application file for complete search history.

(56) References Cited

U.S. PATENT DOCUMENTS 6,150,668 A 11/2000 Bao et al.
6,335,541 B1 1/2002 Ohtani et al.
(Continued)

FOREIGN PATENT DOCUMENTS

CN 101529593 A 9/2009
CN 101807550 A 8/2010
(Continued)

OTHER PUBLICATIONS

Oppermann, Hermann et al. (hereinafter refer to Oppermann) "Nanoporous interconnects." 3rd Electronics System Integration Technology Conference ESTC (2010): 1-4.*
(Continued)

Primary Examiner — Bitew A Dinke
(74) Attorney, Agent, or Firm — Weaver Austin Villeneuve & Sampson LLP

(57) ABSTRACT

For small, high-resolution, light-emitting diode (LED) displays, such as for a near-eye display in an artificial-reality headset, LEDs are spaced closely together. A backplane can be used to drive an array of LEDs in an LED display. A plurality of interconnects electrically couple the backplane with the array of LEDs. The backplane can have a different coefficient of thermal expansion (CTE) than the array of LEDs. During bonding of the backplane to the array of LEDs, CTE mismatch can cause misalignment of bonding sites. The higher the bonding temperature, the greater the misalignment of bonding sites. Lower temperature bonding, using materials with lower melting or bonding temperatures, can be used to mitigate misalignment during bonding so that interconnects can be more closely spaced, which can allow
(Continued)

LEDs to be more closely spaced, to enable a higher-resolution display.

20 Claims, 44 Drawing Sheets

Related U.S. Application Data

(60) Provisional application No. 62/863,659, filed on Jun. 19, 2019, provisional application No. 62/861,254, filed on Jun. 13, 2019, provisional application No. 62/801,424, filed on Feb. 5, 2019.

(51) Int. Cl.
   *G06F 1/16* (2006.01)
   *G09G 3/32* (2016.01)
   *H01L 23/00* (2006.01)
   *H01L 25/075* (2006.01)
   *H01L 27/12* (2006.01)
   *H01L 33/24* (2010.01)
   *H01L 33/46* (2010.01)
   *H01L 33/58* (2010.01)
   *H01L 33/62* (2010.01)

(52) U.S. Cl.
   CPC ............ *G09G 3/32* (2013.01); *H01L 24/08* (2013.01); *H01L 24/80* (2013.01); *H01L 25/0753* (2013.01); *H01L 25/167* (2013.01); *H01L 27/1255* (2013.01); *H01L 33/24* (2013.01); *H01L 33/46* (2013.01); *H01L 33/58* (2013.01); *G02B 2027/0178* (2013.01); *G09G 2310/08* (2013.01); *G09G 2320/064* (2013.01); *H01L 2224/08145* (2013.01); *H01L 2224/80895* (2013.01); *H01L 2224/80896* (2013.01); *H01L 2933/0033* (2013.01); *H01L 2933/0066* (2013.01)

(56) References Cited

U.S. PATENT DOCUMENTS

| | | | |
|---|---|---|---|
| 8,489,837 B1 | 7/2013 | Lee | |
| 9,653,642 B1 | 5/2017 | Raring et al. | |
| 9,666,677 B1 | 5/2017 | Raring et al. | |
| 10,733,930 B2 | 8/2020 | Goward | |
| 10,923,023 B1 | 2/2021 | Bibl et al. | |
| 11,239,399 B2* | 2/2022 | Morris | G06F 1/1694 |
| 11,349,052 B2* | 5/2022 | Morris | G06F 1/1694 |
| 11,355,665 B2* | 6/2022 | Fabien | G09G 3/3233 |
| 11,574,586 B1* | 2/2023 | Pappas | H03K 3/037 |
| 2002/0097350 A1 | 7/2002 | Haven et al. | |
| 2005/0023656 A1 | 2/2005 | Leedy | |
| 2010/0213819 A1 | 8/2010 | Cok et al. | |
| 2011/0233676 A1 | 9/2011 | Or-Bach et al. | |
| 2014/0226329 A1 | 8/2014 | Oraw et al. | |
| 2014/0367633 A1* | 12/2014 | Bibl | H01L 25/0753 257/13 |
| 2014/0367705 A1* | 12/2014 | Bibl | H01L 33/0008 438/27 |
| 2015/0249197 A1 | 9/2015 | Shieh et al. | |
| 2015/0255438 A1 | 9/2015 | Oraw et al. | |
| 2015/0267907 A1 | 9/2015 | Thompson et al. | |
| 2015/0295154 A1 | 10/2015 | Tu et al. | |
| 2015/0309316 A1 | 10/2015 | Osterhout et al. | |
| 2015/0325598 A1 | 11/2015 | Pfeuffer et al. | |
| 2015/0362165 A1* | 12/2015 | Chu | H01L 33/32 362/235 |
| 2016/0035924 A1 | 2/2016 | Oraw et al. | |
| 2016/0192496 A1* | 6/2016 | Wang | H01L 24/92 361/767 |
| 2017/0069611 A1* | 3/2017 | Zhang | H01L 33/52 |
| 2017/0179097 A1 | 6/2017 | Zhang et al. | |
| 2017/0179192 A1 | 6/2017 | Zhang et al. | |
| 2017/0186907 A1 | 6/2017 | Chaji et al. | |
| 2017/0301724 A1* | 10/2017 | Lee | H01L 33/52 |
| 2017/0358562 A1* | 12/2017 | Banna | H01L 25/50 |
| 2017/0373228 A1 | 12/2017 | Chang et al. | |
| 2018/0007750 A1* | 1/2018 | Meitl | H01L 22/24 |
| 2018/0017801 A1 | 1/2018 | Chang et al. | |
| 2018/0084614 A1* | 3/2018 | Bower | H05K 3/225 |
| 2018/0114800 A1* | 4/2018 | Pan | H01L 27/1218 |
| 2018/0158987 A1* | 6/2018 | Lee | H01L 33/32 |
| 2018/0182831 A1 | 6/2018 | Ahmed et al. | |
| 2018/0190615 A1* | 7/2018 | Pan | G06F 3/044 |
| 2018/0190672 A1* | 7/2018 | Lee | H01L 27/156 |
| 2018/0198024 A1 | 7/2018 | Lai et al. | |
| 2018/0211945 A1* | 7/2018 | Cok | H01L 33/0093 |
| 2018/0226386 A1* | 8/2018 | Cok | H01L 27/124 |
| 2018/0261785 A1 | 9/2018 | Ahmed et al. | |
| 2018/0358339 A1 | 12/2018 | Iguchi | |
| 2019/0019449 A1* | 1/2019 | Pappas | G09G 3/32 |
| 2019/0066571 A1* | 2/2019 | Goward | H01L 23/49827 |
| 2019/0088633 A1 | 3/2019 | Tao et al. | |
| 2019/0237420 A1* | 8/2019 | Goward | H01L 24/16 |
| 2019/0252312 A1 | 8/2019 | Yu et al. | |
| 2019/0302917 A1 | 10/2019 | Pan | |
| 2019/0319020 A1 | 10/2019 | Pan | |
| 2019/0324577 A1* | 10/2019 | Pan | H01L 33/62 |
| 2019/0333442 A1* | 10/2019 | Pan | G09G 3/2003 |
| 2019/0355702 A1* | 11/2019 | Herner | H01L 33/30 |
| 2019/0355874 A1* | 11/2019 | Herner | H01L 33/62 |
| 2019/0385513 A1 | 12/2019 | Iguchi et al. | |
| 2020/0035134 A1 | 1/2020 | Pahlevaninezhad et al. | |
| 2020/0118988 A1* | 4/2020 | Yueh | H01L 25/167 |
| 2020/0219820 A1* | 7/2020 | Chen | H01L 27/156 |
| 2020/0251049 A1 | 8/2020 | Morris et al. | |
| 2020/0251638 A1 | 8/2020 | Morris et al. | |
| 2020/0403117 A1 | 12/2020 | Fabien et al. | |
| 2021/0111302 A1 | 4/2021 | Pan | |
| 2022/0254952 A1 | 8/2022 | Fabien et al. | |

FOREIGN PATENT DOCUMENTS

| | | |
|---|---|---|
| CN | 106876406 A | 6/2017 |
| CN | 107112330 A | 8/2017 |
| CN | 108091633 A | 5/2018 |
| CN | 109119436 A | 1/2019 |
| CN | 109148482 A | 1/2019 |
| CN | 109479354 A | 3/2019 |
| CN | 110651318 A | 1/2020 |
| CN | 113366372 A | 9/2021 |
| CN | 113383263 A | 9/2021 |
| EP | 3877803 A1 | 9/2021 |
| EP | 3877804 A1 | 9/2021 |
| JP | 2009246359 A | 10/2009 |
| JP | 2016139078 A | 8/2016 |
| JP | 2020511700 A | 4/2020 |
| KR | 20110098707 A | 9/2011 |
| KR | 20150094739 A | 8/2015 |
| KR | 20190129972 A | 11/2019 |
| TW | 201508140 A | 3/2015 |
| TW | 201717445 A | 5/2017 |
| TW | 201801284 A | 1/2018 |
| WO | WO-2014123734 A1 | 8/2014 |
| WO | WO-2018170599 A1 | 9/2018 |
| WO | WO-2020163127 A1 | 8/2020 |
| WO | WO-2020163436 A1 | 8/2020 |

OTHER PUBLICATIONS

Office Action mailed Sep. 5, 2023 for European Patent Application No. 20709380.8, filed on Jan. 29, 2020, 9 pages.
Advisory Action and Interview Summary mailed May 5, 2021 for U.S. Appl. No. 16/660,643, filed Oct. 22, 2019, 4 Pages.
Final Office Action mailed Sep. 8, 2021 for U.S. Appl. No. 16/660,648, filed Oct. 22, 2019, 25 Pages.
Final Office Action mailed Feb. 9, 2021 for U.S. Appl. No. 16/660,643, filed Oct. 22, 2019, 26 Pages.

(56) References Cited

OTHER PUBLICATIONS

International Search Report and Written Opinion for International Application No. PCT/US2020/015553, mailed Jul. 24, 2020, 18 Pages.
International Search Report and Written Opinion for International Application No. PCT/US2020/016727, mailed Jul. 24, 2020, 20 Pages.
Mohan K., et al., "A Review of Nanoporous Metals in Interconnects," Journal of Metals, Springer, New York LLC., US, Aug. 27, 2018 [Retrieved on Aug. 27, 2018], vol. 70 (10), pp. 2192-2204, XP036599683.
Non-Final Office Action mailed Jun. 1, 2021 for U.S. Appl. No. 16/660,648, filed Oct. 22, 2019, 28 Pages.
Non-Final Office Action mailed Aug. 21, 2020 for U.S. Appl. No. 16/660,643, filed Oct. 22, 2019, 24 Pages.
Non-Final Office Action mailed Jun. 24, 2021 for U.S. Appl. No. 16/780,486, filed Feb. 3, 2020, 16 Pages.
Non-Final Office Action mailed Oct. 26, 2022 for U.S. Appl. No. 17/729,524, filed Apr. 26, 2022, 9 pages.
Notice of Allowance mailed Jun. 1, 2021 for U.S. Appl. No. 16/660,643, filed Oct. 22, 2019, 10 Pages.
Notice of Allowance mailed Sep. 21, 2021 for U.S. Appl. No. 16/660,643, filed Oct. 22, 2019, 23 Pages.
Notice of Allowance mailed Feb. 22, 2023 for U.S. Appl. No. 17/729,524, filed Apr. 26, 2022, 8 pages.
Notice of Allowance mailed Jan. 26, 2022 for U.S. Appl. No. 16/660,648, filed Oct. 22, 2019, 8 pages.
Notice of Allowance mailed Jan. 27, 2022 for U.S. Appl. No. 16/780,486, filed Feb. 3, 2020, 8 pages.
Office Action mailed Aug. 1, 2023 for Japanese Patent Application No. 2021-534969, filed on Jun. 17, 2021, 4 pages.
Office Action mailed Oct. 21, 2022 for Chinese Application No. 202080012397.X, filed Aug. 3, 2021, 23 pages.
Office Action mailed Jun. 27, 2023 for Japanese Patent Application No. 2021-535760, filed on Jun. 18, 2021, 6 pages.
Office Action mailed Aug. 28, 2023 for European Patent Application No. 20713122.8, filed on Feb. 5, 2020, 6 pages.
Office Action mailed Oct. 9, 2022 for Chinese Application No. 202080012219.7, filed Feb. 5, 2020, 28 pages.
Restriction Requirement mailed Jan. 13, 2021 for U.S. Appl. No. 16/660,648, filed Oct. 22, 2019, 12 Pages.
Restriction Requirement mailed Mar. 18, 2021 for U.S. Appl. No. 16/780,486, filed Feb. 3, 2020, 9 Pages.
Office Action mailed May 8, 2024 for Korean Application No. 10-2021-7027793, filed Jan. 29, 2020, 19 pages.
Office Action mailed May 14, 2024 for Taiwan Application No. 109103357, filed Feb. 5, 2020, 9 pages.

\* cited by examiner

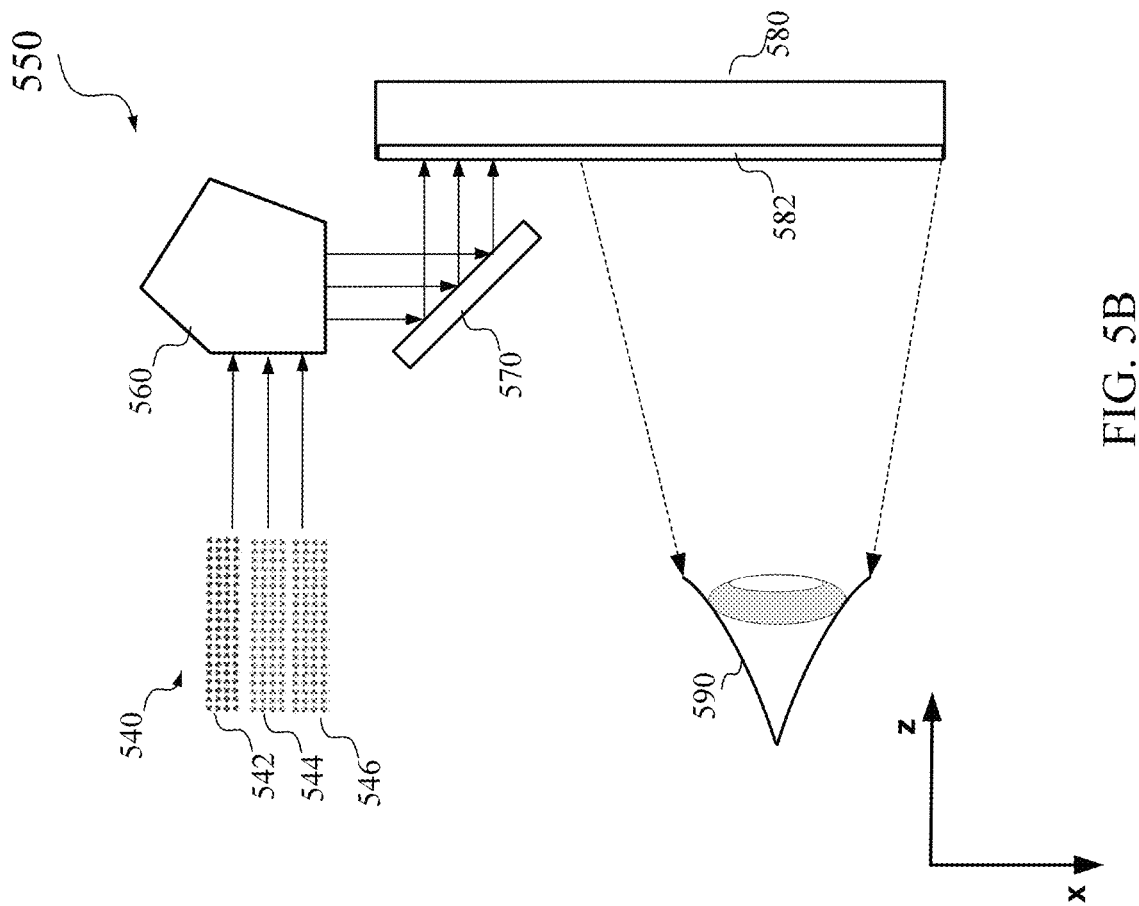
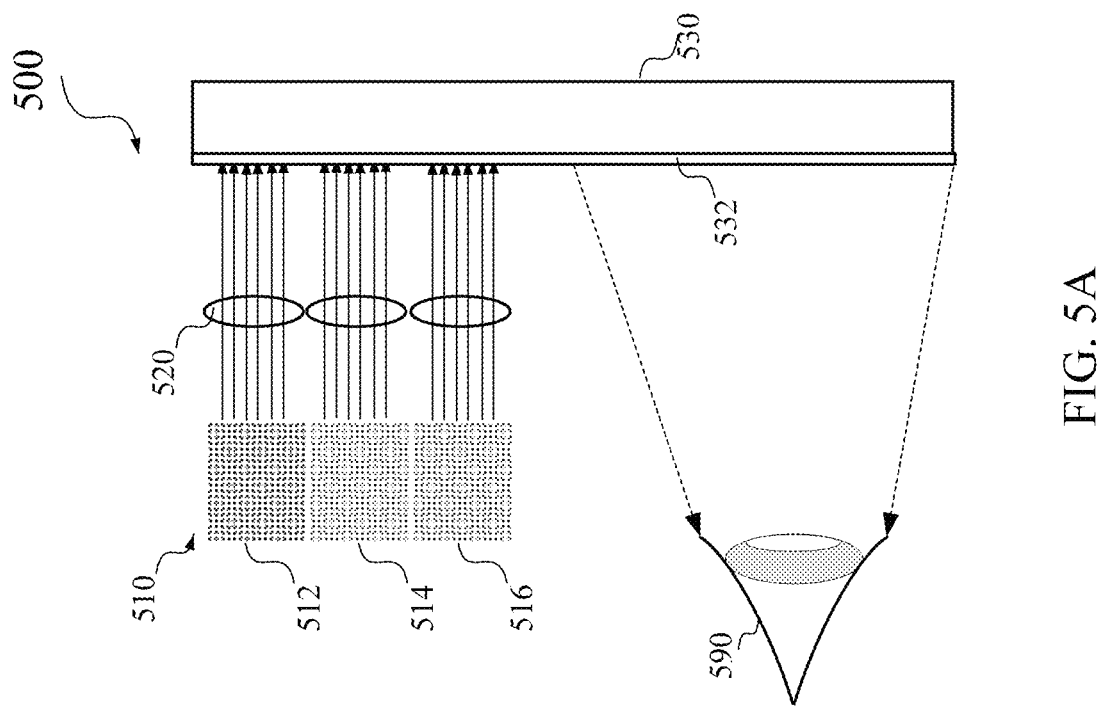
FIG. 5B
FIG. 5A

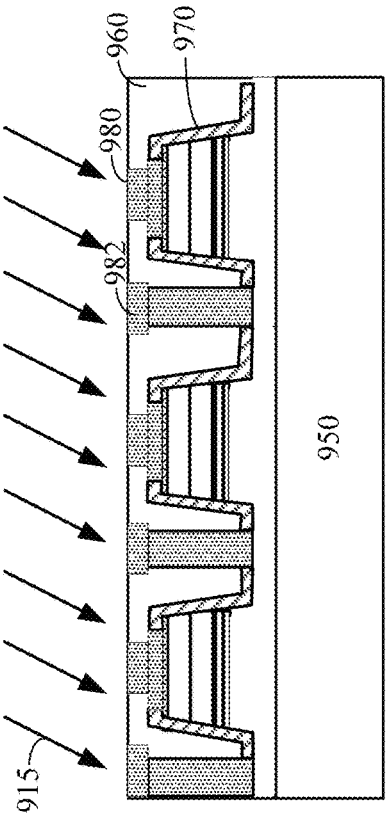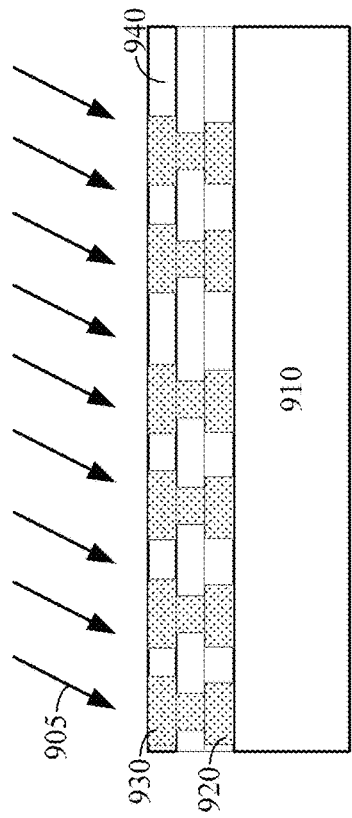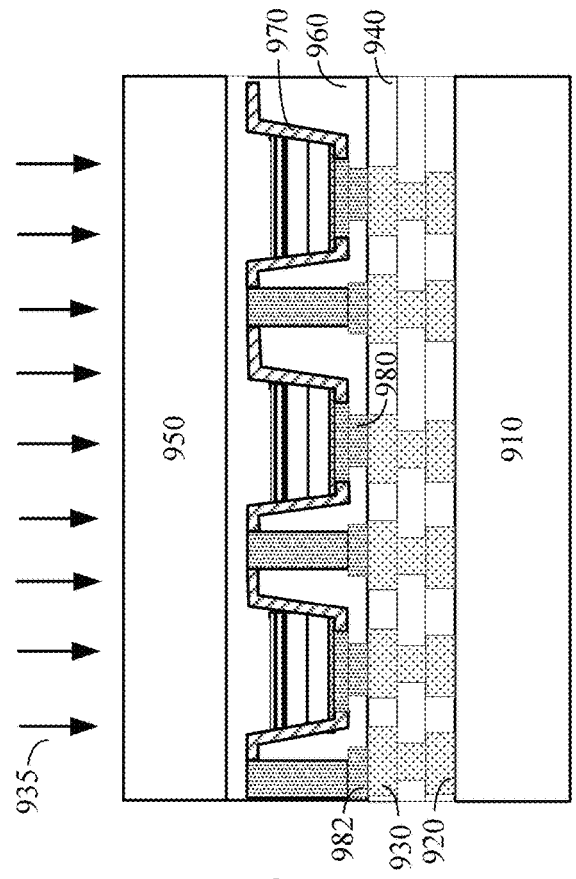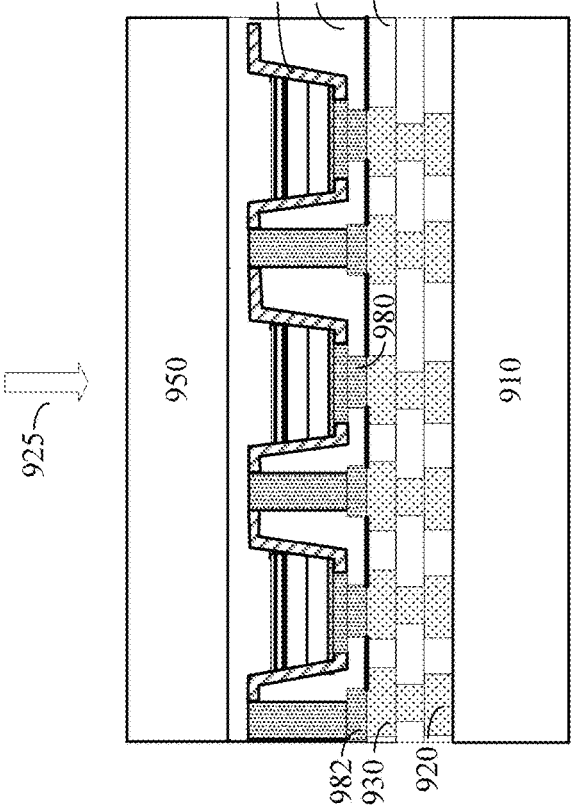

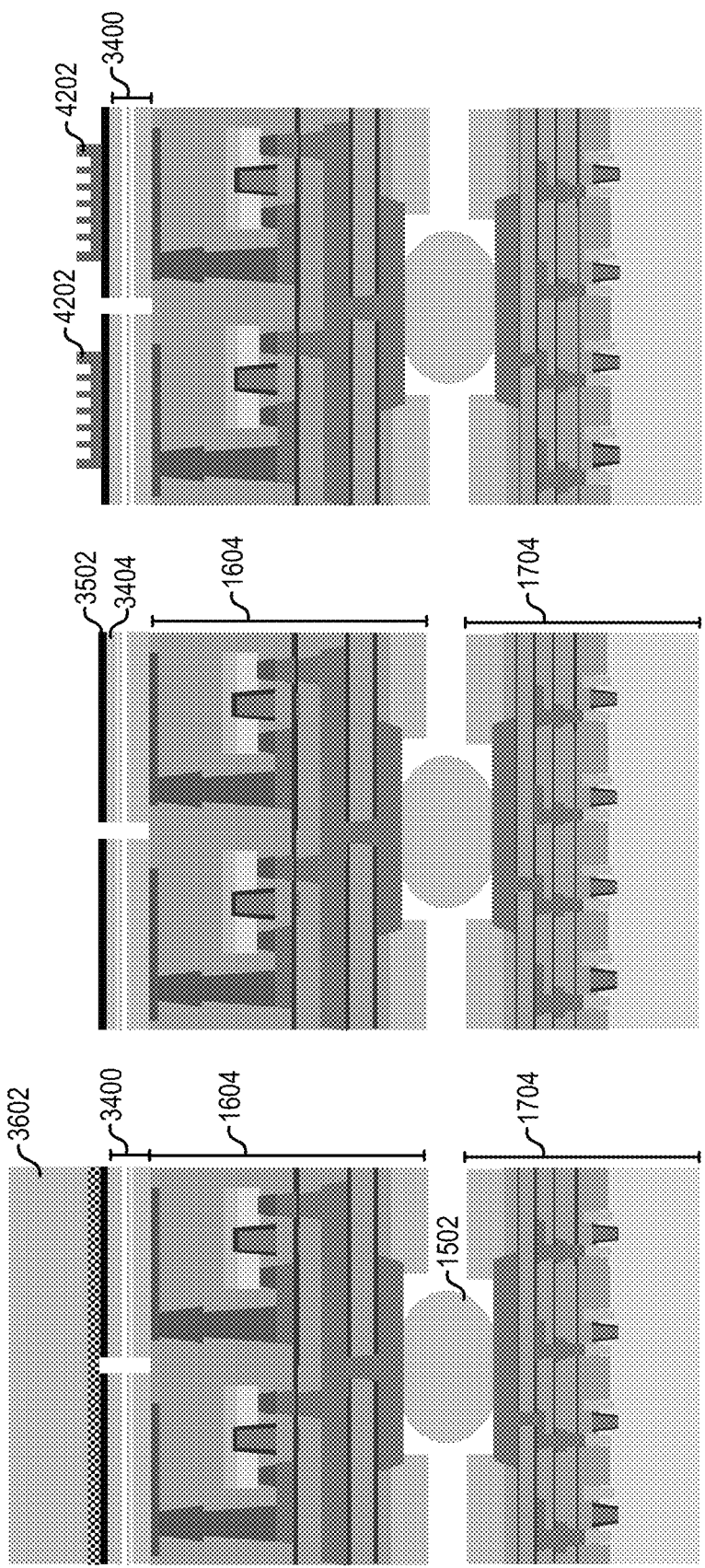

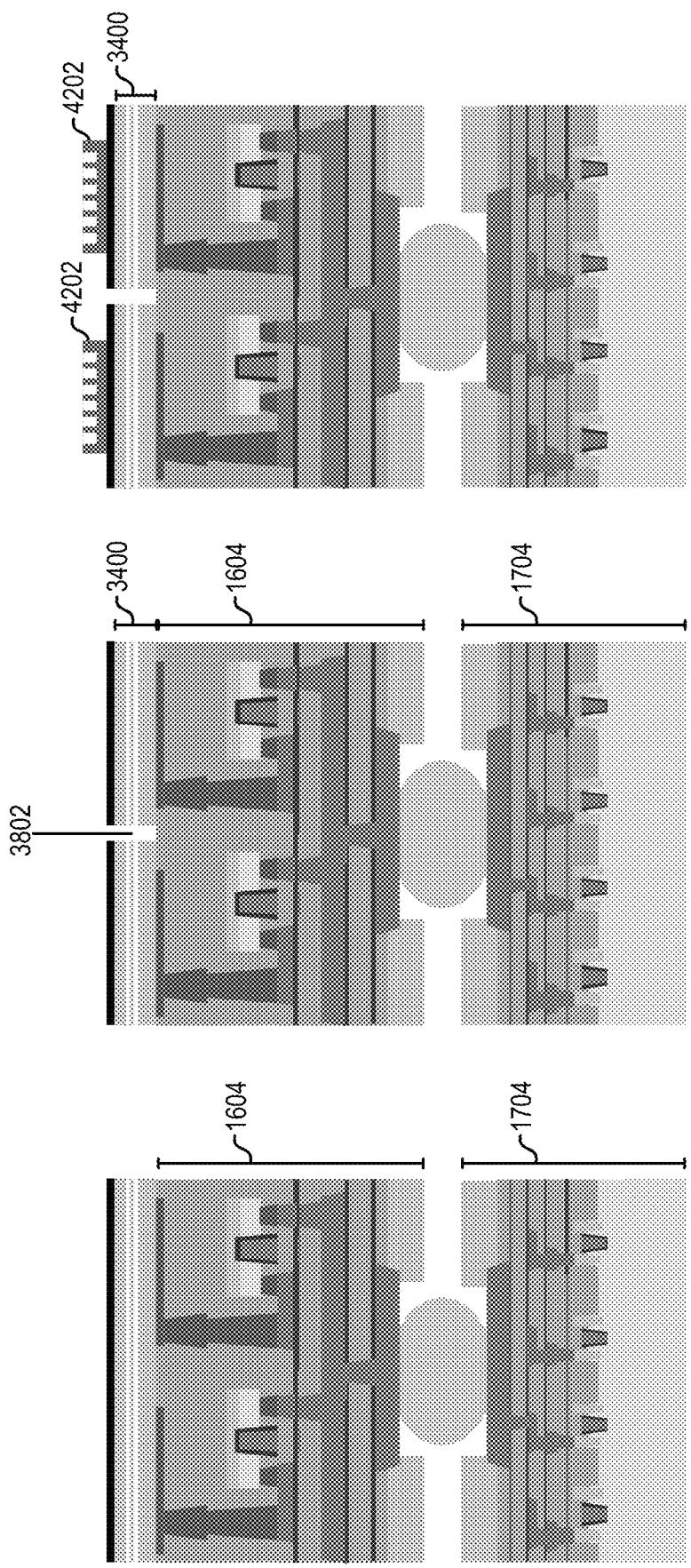

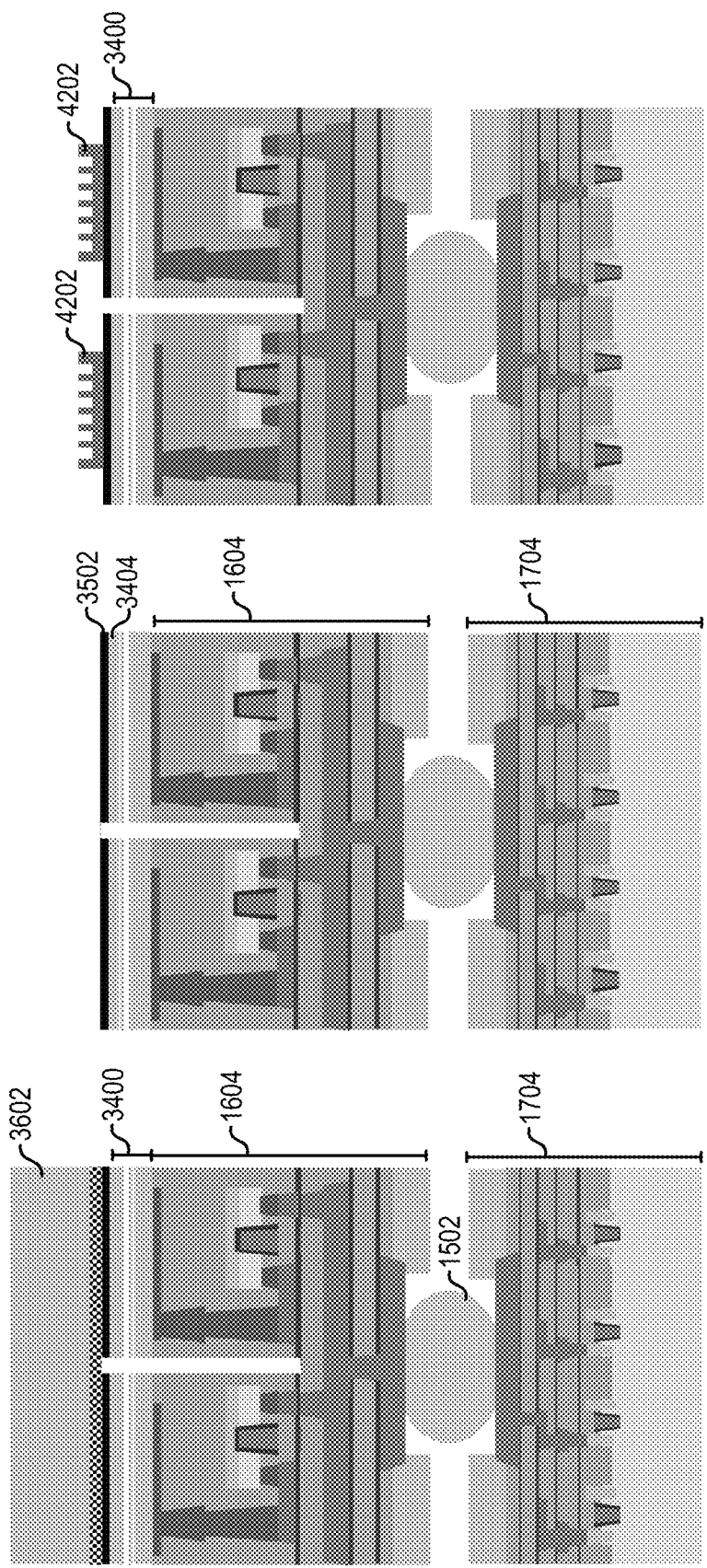

BONDING INTERFACE FOR HYBRID TFT-BASED MICRO DISPLAY PROJECTOR

CROSS-REFERENCES TO RELATED APPLICATIONS

This application is a continuation of U.S. patent application Ser. No. 16/660,648, filed Oct. 22, 2019, entitled "Bonding Interface For Hybrid TFT-Based Micro Display Projector," which claims priority to U.S. Provisional Applications Nos. 62/801,424, filed on Feb. 5, 2019, entitled "Hybrid Display Architecture"; 62/861,254, filed on Jun. 13, 2019, entitled "Hybrid Display Concept—Hybrid Si and TFT Micro-Display (IGZO)"; and 62/863,659, filed on Jun. 19, 2019, entitled "uLED Devices and Process For TFT-Based Projector (Hybrid IGZO TFT)." This application is related to U.S. patent application Ser. No. 16/660,643, filed Oct. 22, 2019, now U.S. Pat. No. 11,239,399, entitled "Architecture for Hybrid TFT-based Micro Display Projector," and U.S. patent application Ser. No. 16/780,486, filed Feb. 3, 2020, entitled "Process Flow For Hybrid TFT-Based Micro Display Projector." The entire disclosures of these applications are herein incorporated by reference for all purposes.

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-nitride semiconductors, such as alloys of AlN, GaN, InN, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs) for a display. More specifically, this disclosure relates to integration of display devices with control circuits. Displays are ubiquitous and are a core component of wearable devices, smart phones, tablets, laptops, desktops, TVs, and display systems. Common display technologies today include Light Emitting Diode (LED) displays.

A display can be created by assembling an array of LED display devices on a backplane. One or more LED display devices of the array of LED display devices can be grouped to form pixels. The display may generate control signals to control each pixel. The backplane can provide structural support for the LED display devices, and to provide electrical connections to transmit the control signals to the LED display devices. The integration of the LED display devices with the backplane can affect the pixel-level interconnects as well as the fabrication of the LED devices over the backplane, all of which can affect the performance of the LED display devices.

According to some embodiments, an apparatus comprises an array of light emitting diodes (LEDs); a thin-film circuit layer deposited on the array of LEDs; and a backplane coupled with the thin-film circuit layer using a plurality of metal bonds. The array of LEDs is made of a layered epitaxial structure including a first doped semiconductor layer, a second doped semiconductor layer, and a light-emitting layer between the first doped semiconductor layer and the second doped semiconductor layer. The array of LEDs is a support structure for the thin-film circuit layer. The thin-film circuit layer comprises circuitry for controlling operation of LEDs in the array of LEDs. The backplane has drive circuitry for supplying electrical current to the thin-film circuit layer through the plurality of metal bonds. A number of the plurality of metal bonds is less than a number of LEDs in the array of LEDs. In some embodiments, the array of LEDs has a light-emitting side and a side opposite the light-emitting side, and the thin-film circuit layer is deposited on the side opposite the light-emitting side of the array of LEDs, and the thin-film circuit layer comprises transistors and capacitors interconnected to form pixel circuits for controlling operation of LEDs in the array of LEDs; the pixel circuits implement analog, pulse-code modulation, or pulse-width modulation for controlling intensity of LEDs in the array of LEDs; a storage capacitor of a pixel circuit is configured to be coupled to a dateline by one or more selection signals; pixel circuits are interconnected to reduce a number of metal bonds between the backplane and the think-film circuit layer; a single pixel circuit is connected to multiple row selection signals; the backplane is configured to transmit a global signal through a metal bond, of the plurality of metal bonds, to the thin-film circuit layer, wherein the global signal comprises one or more of a row dataline, a column dataline, an analog bias, a voltage supply, a pulse clocks, or test enablement features; no transistor in the thin-film circuit layer is used to charge/discharge a global net; the thin-film circuit layer comprises a selector multiplexor; the selector multiplexor comprises a common signal line in the thin-film circuit layer electrically coupled with a plurality of transistors in thin-film circuit layer, and the plurality of transistors are configured to alternate activation so that current from the common signal line is periodically passed through each of the plurality of transistors; the thin-film circuit layer comprises memory circuits and modulator circuits; a unique address is assigned to each LED in the array of LEDs, and a control signal comprises the unique address and an operation signal to control operation of a selected LED in the array of LEDs; the operation signal is configured to control a magnitude of current that flows through the selected LED, and the operation signal comprises a digital signal representing a percentage of a time within a time period for which current flows to the selected LED; and/or spacing between centers of LEDs are spaced no further apart than three microns.

In some embodiments, a method comprises obtaining a semiconductor structure, wherein the semiconductor structure is a layered epitaxial structure including a first doped semiconductor layer, a second doped semiconductor layer, and a light-emitting layer between the first doped semiconductor layer and the second doped semiconductor layer; depositing a thin-film circuit layer on the semiconductor structure; forming circuitry in the thin-film circuit layer for controlling light emission from the light-emitting layer; obtaining a backplane, the backplane comprising drive circuitry for supplying electrical current to the thin-film circuit layer through a plurality of metal bonds; forming a plurality of interconnects on the thin-film circuit layer or on the backplane; bonding the backplane to the thin-film circuit layer using the plurality of interconnects, wherein the plurality of interconnects become the plurality of metal bonds after bonding; and/or forming an array of light emitting diodes (LEDs) from the semiconductor structure, wherein a number of the plurality of metal bonds is less than a number of LEDs in the array of LEDs, the array of LEDs have a light-emitting side and a side opposite the light-emitting side, and wherein the thin-film circuit layer is deposited on the side opposite the light-emitting side. In some embodiments, obtaining the backplane comprises forming a plurality of CMOS transistors and interconnects in a silicon device layer of a silicon wafer; forming the array of LEDs comprises singulating the semiconductor structure, and wherein singulating the semiconductor structure occurs before bonding the backplane to the thin-film circuit layer; the thin-film circuit layer is formed on the semiconductor structure on a wafer level; and/or the backplane includes electrical circuits formed in the backplane before bonding.

According to some embodiments, an apparatus comprises an array of light emitting diodes (LEDs); a thin-film circuit layer deposited on the array of LEDs; and a backplane coupled with the thin-film circuit layer using a plurality of metal bonds. The array of LEDs is made of a layered epitaxial structure including a first doped semiconductor layer, a second doped semiconductor layer, and a light-emitting layer between the first doped semiconductor layer and the second doped semiconductor layer. The array of LEDs is a support structure for the thin-film circuit layer. The thin-film circuit layer comprises circuitry for controlling operation of LEDs in the array of LEDs. The backplane has drive circuitry for supplying electrical current to the thin-film circuit layer through the plurality of metal bonds. A number of the plurality of metal bonds is less than a number of LEDs in the array of LEDs. The plurality of metal bonds are made of material that has a melting point or bonding temperature less than 300 degrees Celsius, to reduce walk off during bonding the thin-film circuit layer to the backplane.

In some embodiments, the plurality of metal bonds comprise nanoporous copper; spacing between metal bonds of the plurality of metal bonds is equal to or greater than 5 microns and equal to or less than 18 microns; the array of LEDs comprises a count of LEDs, the plurality of metal bonds corresponds to a count of metal bonds, and the count of metal bonds is at least two orders of magnitude less than the count of LEDs; the array of LEDs occupies a footprint, and the plurality of metal bonds are dispersed over the footprint; each LED in the array of LEDs is formed of a crystalline semiconductor structure, and the thin-film circuit layer is not lattice matched to the crystalline semiconductor structure of the array of LEDs; the thin-film circuit layer comprises a semiconductor material having an amorphous or polycrystalline structure; the thin-film circuit layer includes material comprising at least one of: c-axis aligned crystal Indium-Gallium-Zinc oxide (CAAC-IGZO), amorphous indium gallium zinc oxide (a-IGZO), low-temperature polycrystalline silicon (LTPS), or amorphous silicon (a-Si); the array of LEDs includes material comprising at least one of: Gallium Nitride (GaN), Indium Gallium Arsenide (InGaAs), Indium Gallium Phosphide (AlInGaP), or Gallium Arsenide (GaAs); the drive circuitry in the backplane is in single crystal silicon; and/or the drive circuitry of the backplane includes CMOS (complementary metal-oxide-semiconductor) transistors.

In some embodiments, a method comprises obtaining a semiconductor structure, wherein the semiconductor structure is a layered epitaxial structure including a first doped semiconductor layer, a second doped semiconductor layer, and a light-emitting layer between the first doped semiconductor layer and the second doped semiconductor layer; depositing a thin-film circuit layer on the semiconductor structure; forming circuitry in the thin-film circuit layer for controlling light emission from the light-emitting layer; obtaining a backplane, the backplane comprising drive circuitry for supplying electrical current to the thin-film circuit layer through a plurality of metal bonds; forming a plurality of bumps on the thin-film circuit layer or on the backplane, wherein the plurality of bumps are made of a material that has a melting point or bonding temperature less than 300 degrees Celsius; bonding the backplane to the thin-film circuit layer using the plurality of bumps, wherein bonding uses a temperature of no more than 300 degrees Celsius and the plurality of bumps become the plurality of metal bonds after bonding; and/or forming an array of light emitting diodes (LEDs) from the semiconductor structure, wherein a number of the plurality of metal bonds is less than a number of LEDs in the array of LEDs. In some embodiments, the bonding the backplane to the thin-film circuit layer uses a temperature of no more than 200 degrees Celsius; multiple LEDs in the array of LEDs are configured to receive electrical current from the backplane through one metal bond of the plurality of metal bonds after bonding the backplane to the thin-film circuit layer; the array of LEDs is divided into a plurality of tiles, each tile of the plurality of tiles comprises a plurality of rows of LEDs, and rows of the plurality of rows are configured to be activated at different times; spacing between metal bonds of the plurality of metal bonds is equal to or greater than 5 microns and equal to or less than 18 microns; and/or forming circuitry in the thin-film circuit layer comprises forming a plurality of transistors in the thin-film circuit layer and one control line electrically coupled with the plurality of transistors.

According to certain embodiments, a method comprises obtaining an epitaxial structure, wherein the epitaxial structure is a layered structure including a first doped semiconductor layer, a second doped semiconductor layer, and a light-emitting layer between the first doped semiconductor layer and the second doped semiconductor layer; isolating portions of the first doped semiconductor layer, isolating portions of the second doped semiconductor layer, or isolating portions of both the first doped semiconductor layer and the second doped semiconductor layer for forming a plurality of light emitting diodes (LEDs); depositing a thin-film circuit layer to the epitaxial structure, wherein the thin-film circuit layer comprises: a first thin-film layer and a second thin-film layer; and/or bonding the thin-film circuit layer to a backplane. In some embodiments, the first thin-film layer comprises a plurality of transistors; the second thin-film layer comprises interconnects for the plurality of transistors; the first doped semiconductor layer is an n-doped layer; the second doped semiconductor layer is a p-doped layer; isolating portions of the first doped semiconductor layer, isolating portions of the second doped semiconductor layer, or isolating portions of both the first doped semiconductor layer and the second doped semiconductor layer comprises etching the first doped semiconductor layer, the second doped semiconductor layer, or both the first doped semiconductor layer and the second doped semiconductor layer; the second doped semiconductor layer is p-doped, and the method further comprises bonding a temporary carrier to the second doped semiconductor layer and removing a substrate from the epitaxial structure, wherein the substrate was closer to the first doped semiconductor layer than the second doped semiconductor layer before removal of the substrate; etching the first doped semiconductor layer, the second doped semiconductor layer, or both the first doped semiconductor layer and the second doped semiconductor layer occurs before depositing the thin-film circuit layer to the epitaxial structure; etching the first doped semiconductor layer, the second doped semiconductor layer, or both the first doped semiconductor layer and the second doped semiconductor layer occurs after bonding the thin-film circuit layer to the backplane; etching the first doped semiconductor layer, the second doped semiconductor layer, or both the first doped semiconductor layer and the second doped semiconductor layer occurs after depositing the first thin-film layer and before applying the second thin-film layer; etching the first doped semiconductor layer, the second doped semiconductor layer, or both the first doped semiconductor layer and the second doped semiconductor layer comprises etching both the first doped semiconductor layer and the second doped semiconductor layer, and further includes etching the first thin-film layer; and/or the method can further comprise forming light extraction elements to the epitaxial structure to couple light out of the light-emitting layer; bonding a temporary carrier to the epitaxial structure before depositing the thin-film circuit layer to the epitaxial structure; removing the temporary carrier after bonding the second thin-film layer of the thin-film circuit layer to the backplane: bonding a temporary carrier to the epitaxial structure, wherein the second doped semiconductor layer is between the first doped semiconductor layer and the temporary carrier, and the first doped semiconductor structure is between the second doped semiconductor structure and a substrate of the epitaxial structure; removing the substrate from the epitaxial structure, wherein isolating portions of the first doped semiconductor layer, isolating portions of the second doped semiconductor layer, or isolating portions of both the first doped semiconductor layer and the second doped semiconductor layer comprises implanting ions in the first doped semiconductor layer to isolate portions of the first doped semiconductor layer, before depositing the thin-film circuit layer on the epitaxial structure; implanting ions in the second doped semiconductor layer before bonding the temporary carrier to the epitaxial structure; and/or bonding a temporary carrier to the epitaxial structure before removing a substrate from the epitaxial structure, wherein isolating portions of the first doped semiconductor layer, isolating portions of the second doped semiconductor layer, or isolating portions of both the first doped semiconductor layer and the second doped semiconductor layer comprises implanting ions in the second doped semiconductor layer before bonding the temporary carrier to the epitaxial structure.

In certain embodiments, a method comprises obtaining an epitaxial structure, wherein the epitaxial structure is a layered structure including a first doped semiconductor layer, a second doped semiconductor layer, and a light-emitting layer between the first doped semiconductor layer and the second doped semiconductor layer; applying a thin-film circuit layer to the epitaxial structure; isolating portions of the first doped semiconductor layer, isolating portions of the second doped semiconductor layer, or isolating portions of both the first doped semiconductor layer and the second doped semiconductor layer for forming a plurality of light emitting diodes (LEDs); bonding the thin-film circuit layer to a transparent substrate after applying the thin-film circuit layer to the epitaxial structure; and/or bonding a backplane to the transparent substrate, wherein: the backplane is electrically coupled with the thin-film circuit layer, and/or the thin-film circuit layer and the backplane are on a same side of the transparent substrate. In some embodiments, isolating portions of the first doped semiconductor layer, isolating portions of the second doped semiconductor layer, or isolating portions of both the first doped semiconductor layer and the second doped semiconductor layer for forming a plurality of LEDs comprises etching; isolating portions of the first doped semiconductor layer, isolating portions of the second doped semiconductor layer, or isolating portions of both the first doped semiconductor layer and the second doped semiconductor layer for forming a plurality of LEDs uses ion implantation; and/or isolating portions of the first doped semiconductor layer, isolating portions of the second doped semiconductor layer, or isolating portions of both the first doped semiconductor layer and the second doped semiconductor layer for forming a plurality of LEDs is performed before applying the thin-film circuit layer to the epitaxial structure.

In certain embodiments, an apparatus comprises a transparent substrate; a plurality of light emitting diodes (LEDs); a thin-film circuit layer comprising a plurality of transistors electrically coupled with the plurality of LEDs, wherein: the plurality of transistors are configured to control operation of the plurality of LEDs, and the thin-film circuit layer is bonded to the transparent substrate; and/or a backplane bonded to the transparent substrate, wherein: the backplane is electrically coupled with the thin-film circuit layer, and/or the backplane is on a same side of the transparent substrate as the thin-film circuit layer. In some embodiments, the apparatus comprises a frame of an augmented-reality system, the frame holding the plurality of LEDs, wherein the plurality of LEDs are part of a display for the augmented-reality system; and/or a trace in the thin-film circuit layer electrically coupling one bond, between the thin-film circuit layer and the transparent substrate, with multiple transistors of the plurality of transistors for controlling operation of multiple LEDs of the plurality of LEDs.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments.

FIG. 5B illustrates an example of a near-eye display device including a waveguide display according to certain embodiments.

FIGS. 9A-9D illustrate an example of a method of hybrid bonding for arrays of LEDs according to certain embodiments.

FIG. 40 is a simplified cross section of an embodiment of the thin-film circuit layer bonded to a backplane.

FIG. 41 is a simplified cross section of an embodiment of the temporary carrier removed after bonding.

FIG. 42 is a simplified cross section of an embodiment of adding light-extracting elements to the epitaxial structure.

FIG. 45 is a simplified cross section of an embodiment of the temporary carrier removed after bonding.

FIG. 46 is a simplified cross section of an embodiment of etching the epitaxial structure after removing the temporary carrier.

FIG. 47 is a simplified cross section of an embodiment of adding light-extracting elements to the epitaxial structure.

FIG. 51 is a simplified cross section of an embodiment of bonding the thin-film circuit layer to a backplane.

FIG. 52 is a simplified cross section of an embodiment of the temporary carrier removed after bonding.

FIG. 53 is a simplified cross section of an embodiment of adding light-extracting elements to the epitaxial structure.

Figure 1:
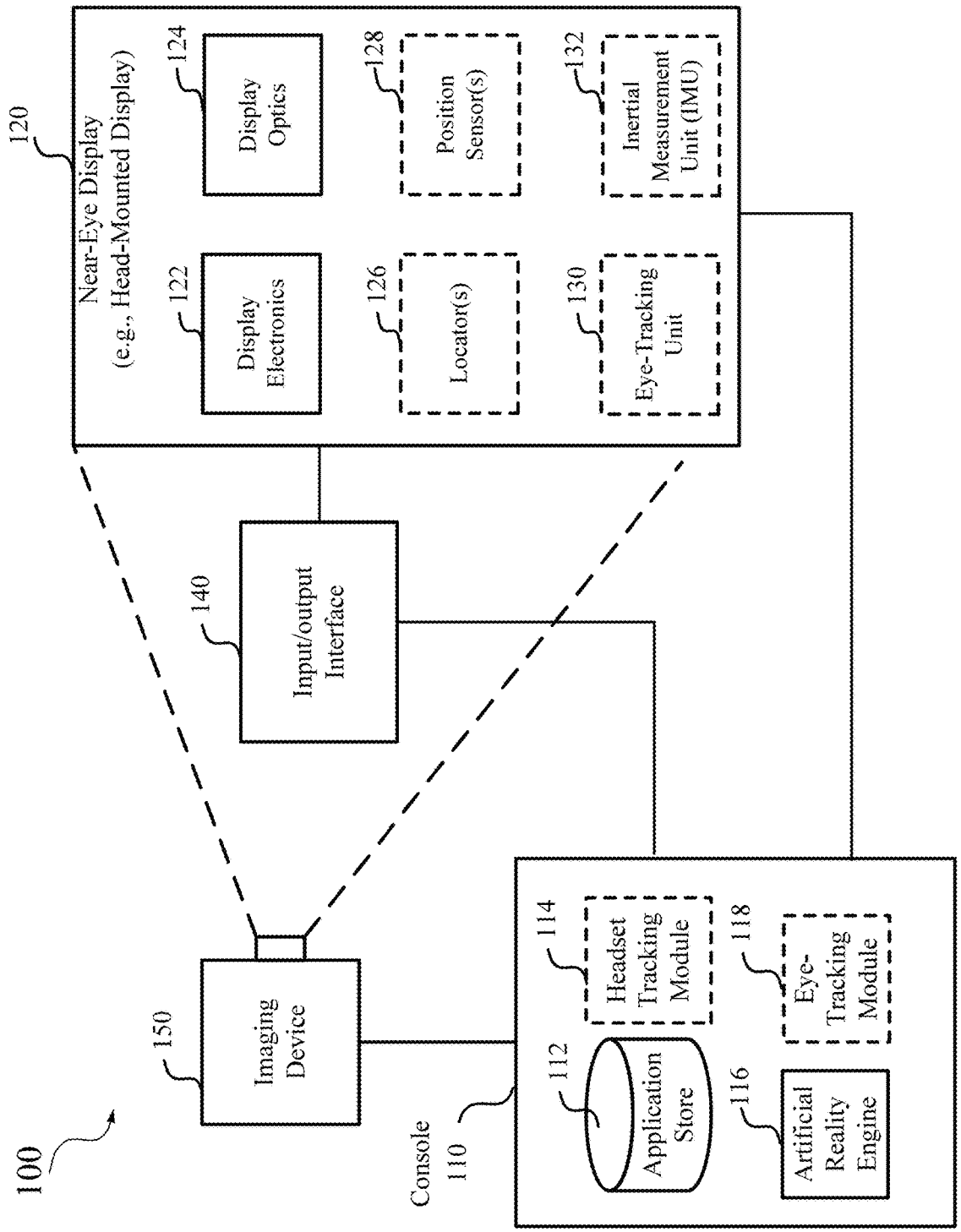
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, disclosed herein are techniques for integrating circuits with an LED display. Various inventive embodiments are described herein, including devices, systems, methods, materials, and the like.

In some examples, an LED is made using an epitaxial structure bonded to a backplane. The backplane may include one bump (e.g., connection) for each LED device to transmit a control signal from the backplane to the LED. Such arrangements, however, can lead to a large number of bumps being placed on the backplane. For example, a display comprising a million pixels can include a million bumps. The large number of bumps as well, as the associated signal lines, can degrade the tight integration between the LED devices and the control circuits, as well as the fabrication of the LED devices, all of which can affect the performance of the display.

The present disclosure generally relates to the use of a thin-film transistor (TFT) layer formed on an LED substrate comprising an epitaxial structure, to reduce the number of metal bumps needed between (1) the LED substrate, which has an array of LED formed therein, and (2) a silicon substrate, which has driver circuitry for providing electrical current to drive the plurality of LEDs. By moving functionality, such as selector circuit, modulation circuit, memory circuit, etc., into the TFT layer, the number of metal bumps between the LED substrate and the silicon substrate can be significant reduced. In some embodiments, metal bumps are reduced so that LEDs can be more densely packaged (e.g., to provide higher definition for a display). Conventional displays can comprise a front plane for a display device and a backplane for selector and drive devices.

Center to center spacing between bump locations (sometimes referred to as pitch), can also affect material selection of the bumps. In some embodiments, materials of the backplane and the LED substrate each have a different coefficient of thermal expansion (CTE). CTE mismatch can refer to two materials being bonding together that each have a different CTE. Bumps can be solder bumps configured to melt during bonding. Accordingly, bumps have a melting point less than the bonding temperature for bonding the backplane to the LED substrate. CTE mismatch, while applying heat during bonding, can cause "walk-off," where bonding sites on the LED substrate become misaligned with bonding sites on the backplane because the backplane expands at a different rate than the LED substrate, since the backplane has a different CTE than the LED substrate. The higher the bonding temperature, the greater the walk-off and the greater the misalignment of bonding sites on the backplane compared to bonding sites on the LED substrate. In some embodiments, using a TFT layer can reduce a number of bumps between the LED substrate and the backplane, but walk-off can still be a problem. In some embodiments, materials for bumps are selected so that bonding temperature can be equal to or less than 300, 250, 200, or 150 degrees Celsius to reduce walk-off during bonding the LED substrate with the backplane.

By selecting materials for bumps that have lower melting points for use during lower bonding temperatures, spacing between metal bumps can be reduced and/or walk-off can be reduced to enable LEDs to be more densely arranged in an array. Alternatively, by adding circuit functionality into the TFT layer, LED density may exceed bump density and spacing between metal bumps can be increased to accommodate walk-off.

The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs) each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding, such as metal pads. The techniques disclosed can apply to so called "bump-less" bonding processes.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system.

For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user.

For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
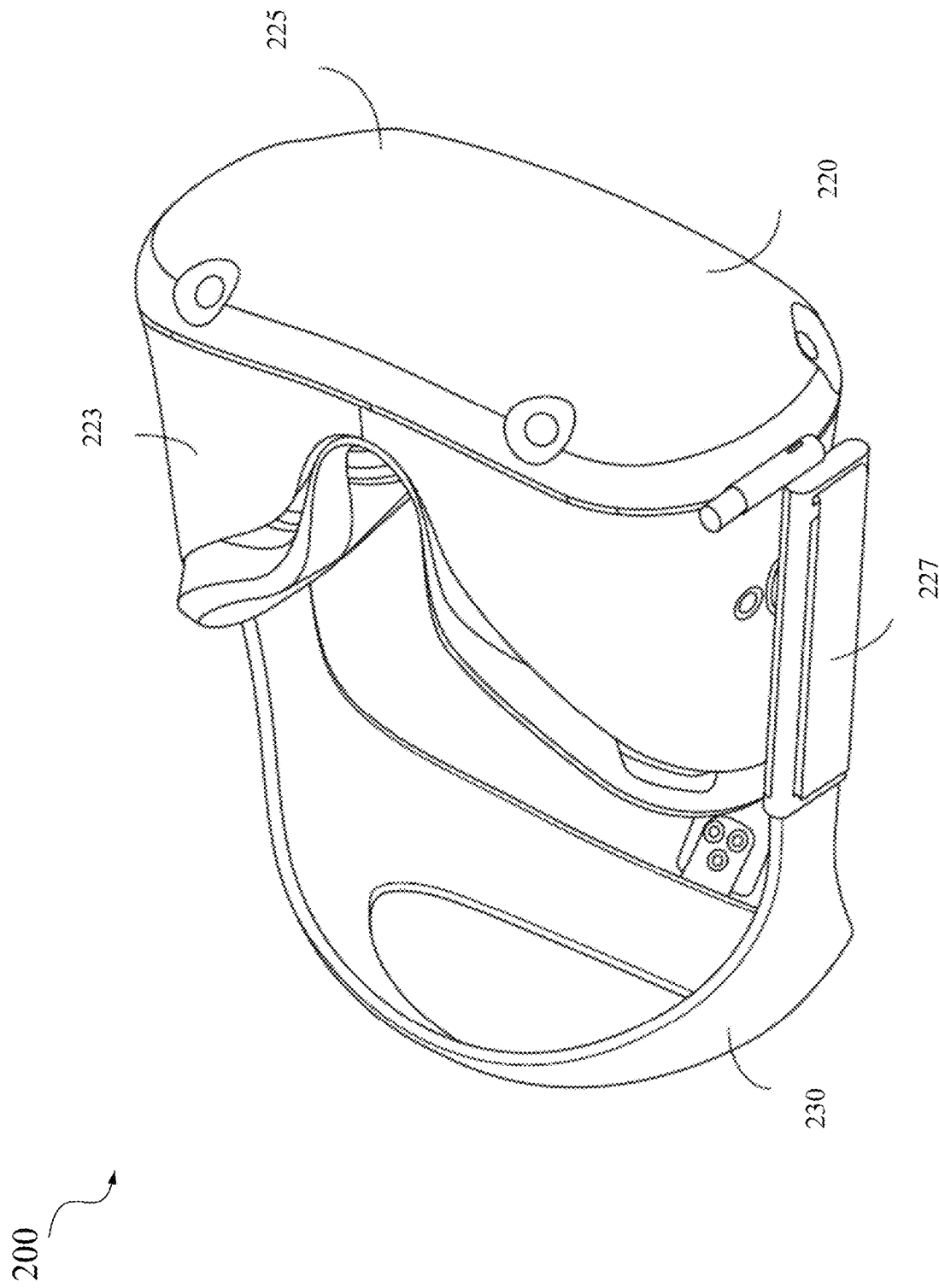
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
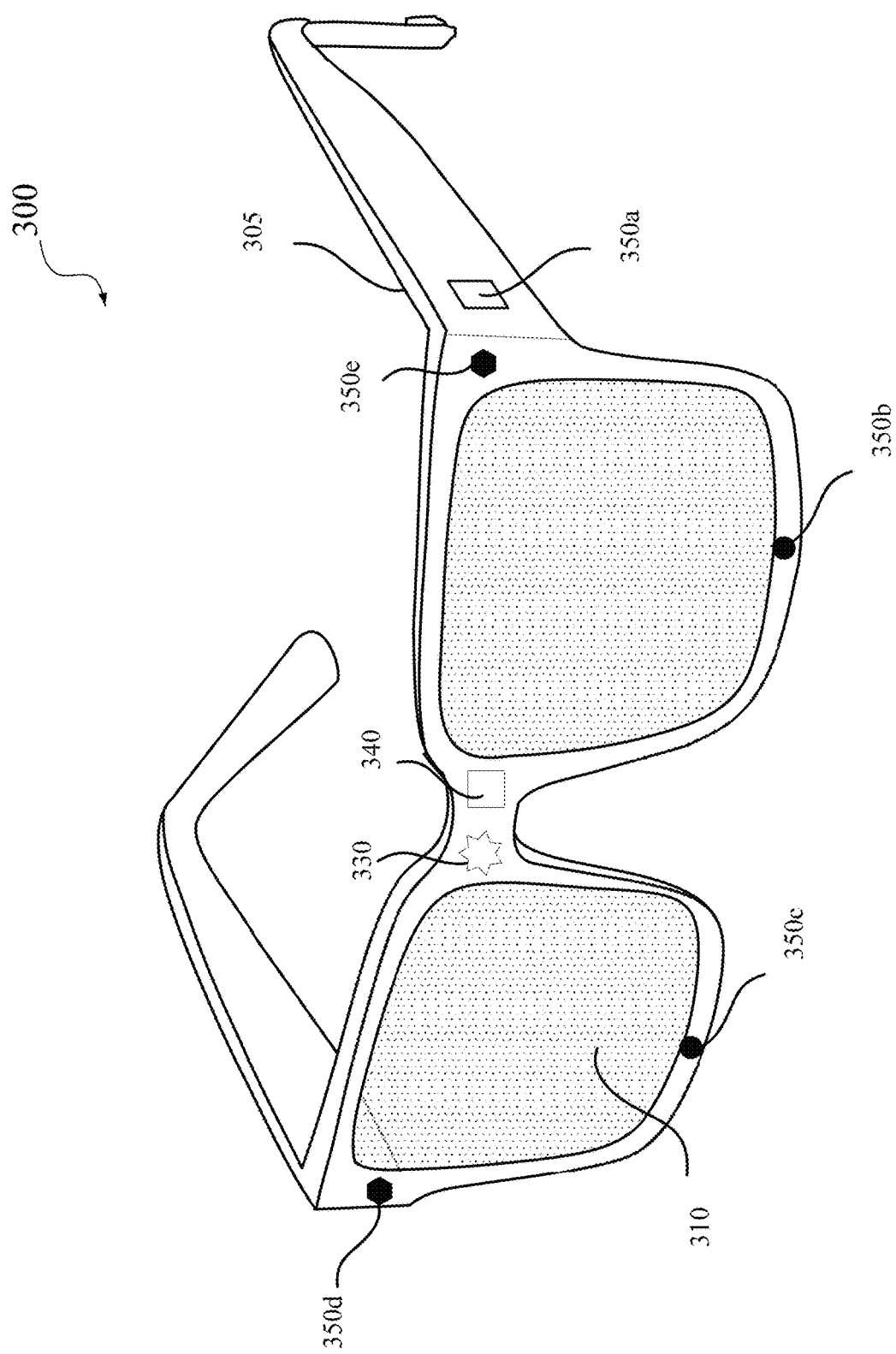
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350$a$, 350$b$, 350$c$, 350$d$, and 350$e$ on or within frame 305. In some embodiments, sensors 350$a$-350$e$ may include one or more depth sensors, motion sensors, position sensors, inertial sensors, or ambient light sensors. In some embodiments, sensors 350$a$-350$e$ may include one or more image sensors configured to generate image data representing different fields of views in different directions. In some embodiments, sensors 350$a$-350$e$ may be used as input devices to control or influence the displayed content of near-eye display 300, and/or to provide an interactive VR/AR/MR experience to a user of near-eye display 300. In some embodiments, sensors 350$a$-350$e$ may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350$a$-350$e$ in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
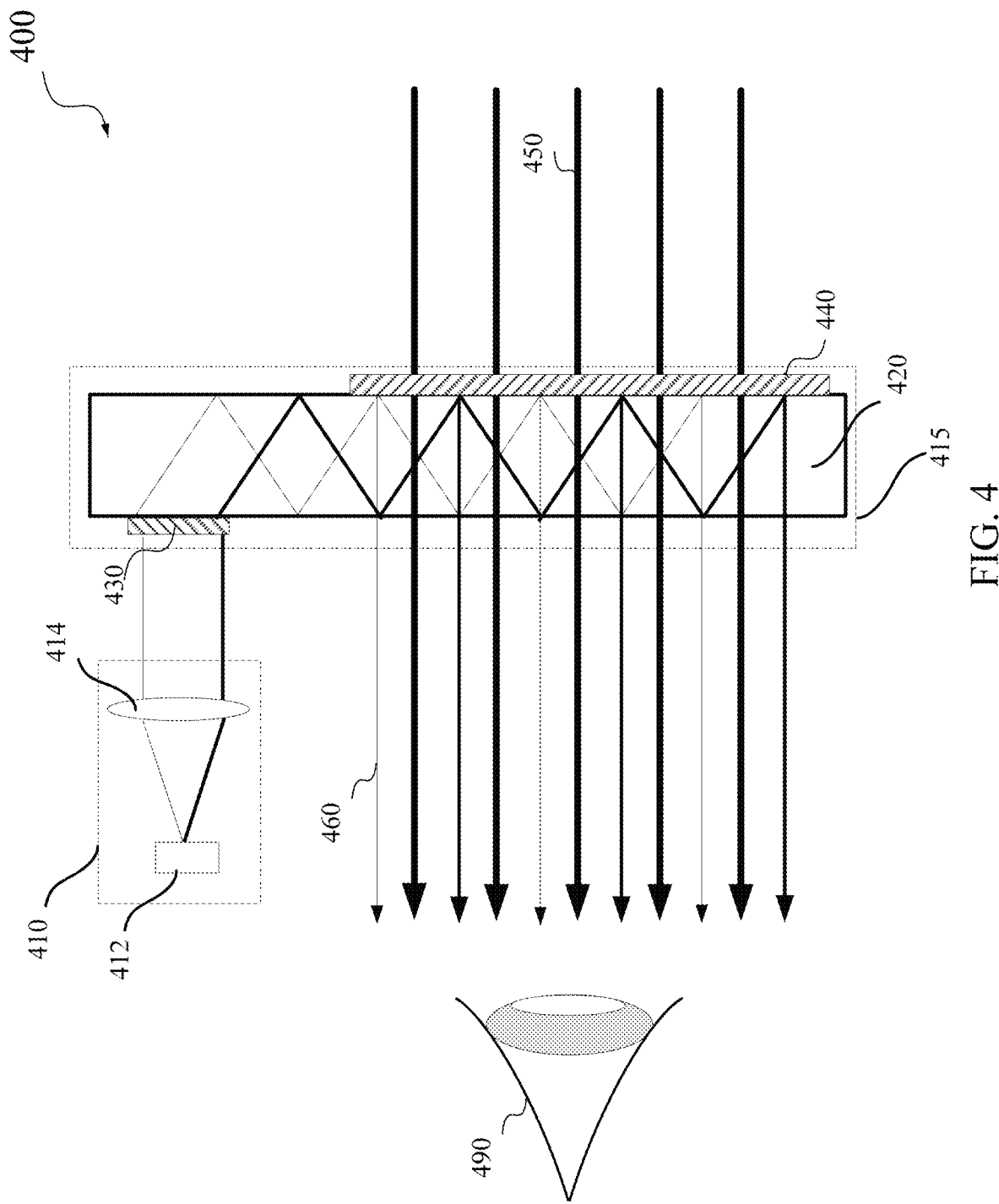
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above) each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440 configured to extract at least a portion of the light guided by and propagating within substrate 420 from substrate 420, and direct extracted light 460 to an eye 490 of the user of augmented reality system 400. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facets prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different areas of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
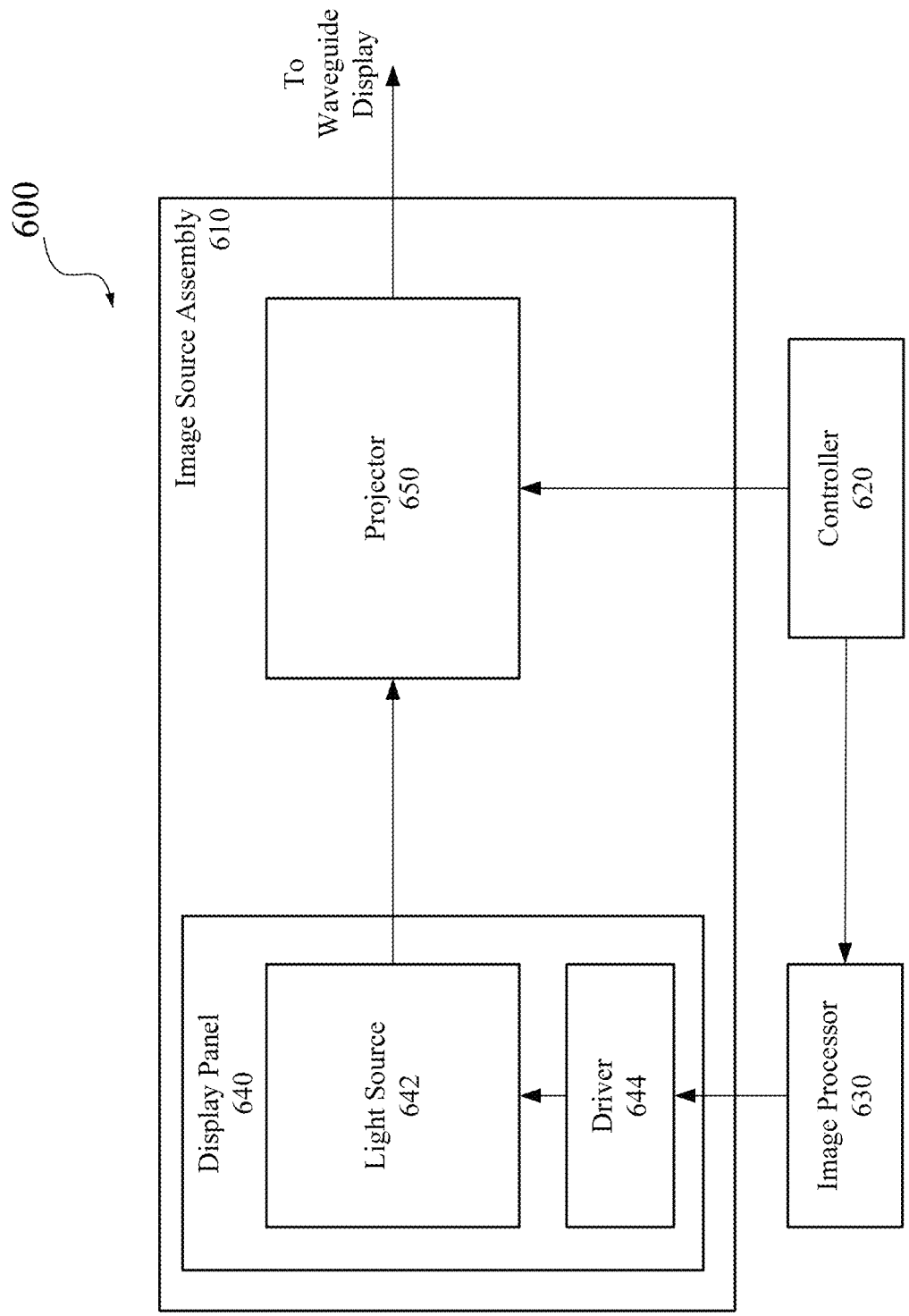
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display.

The location where the image light is redirected toward may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

Figure 7A:
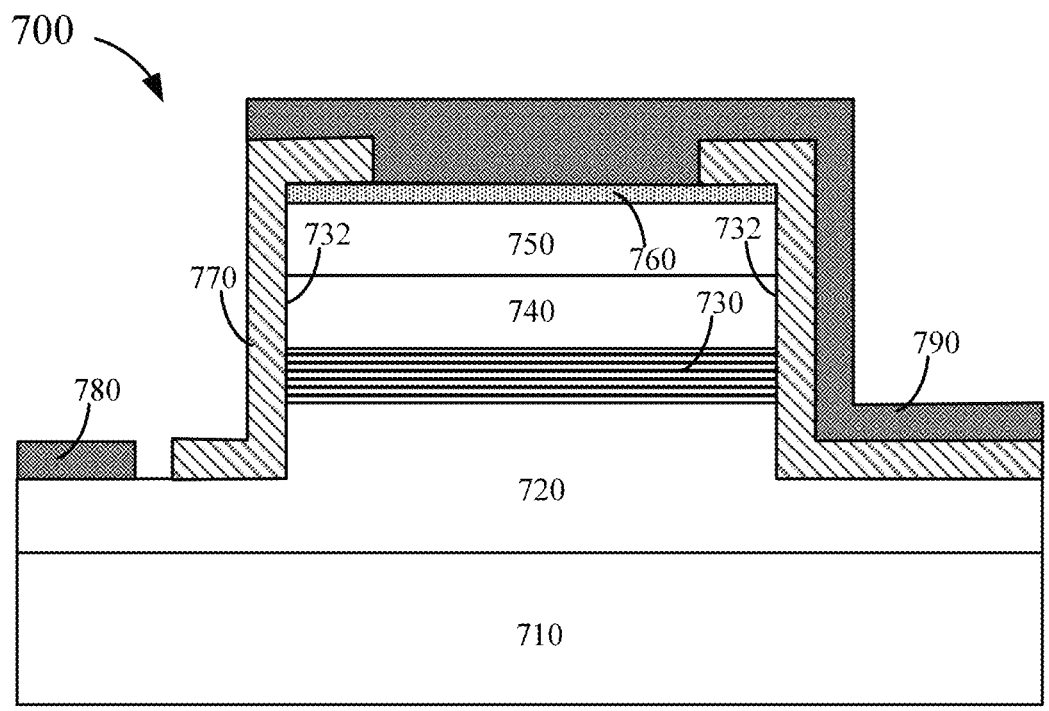
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a P$^+$ or P$^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on mesa sidewalls 732 of the mesa structure. Passivation layer 770 may include an oxide layer, such as a SiO$_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
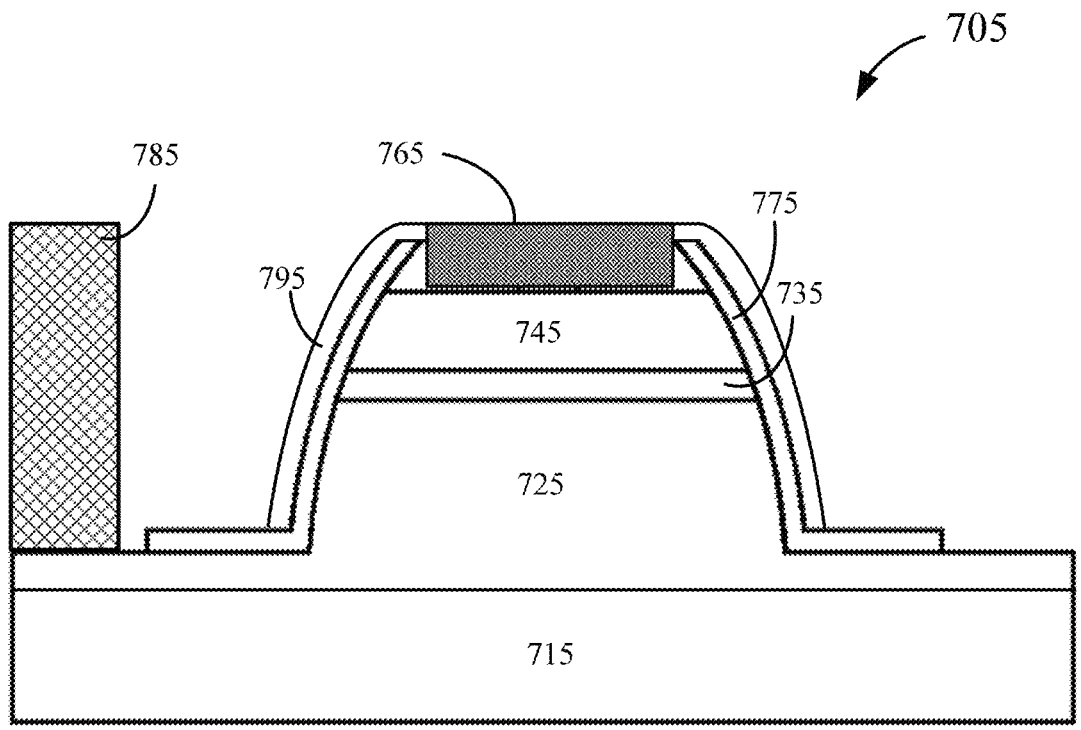
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal to the growth planes associated with crystalline growth of layers 725-745.

As shown in FIG. 7B, LED 705 may have a mesa structure that includes a flat top. A dielectric layer 775 (e.g., SiO$_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 8A, 8B:
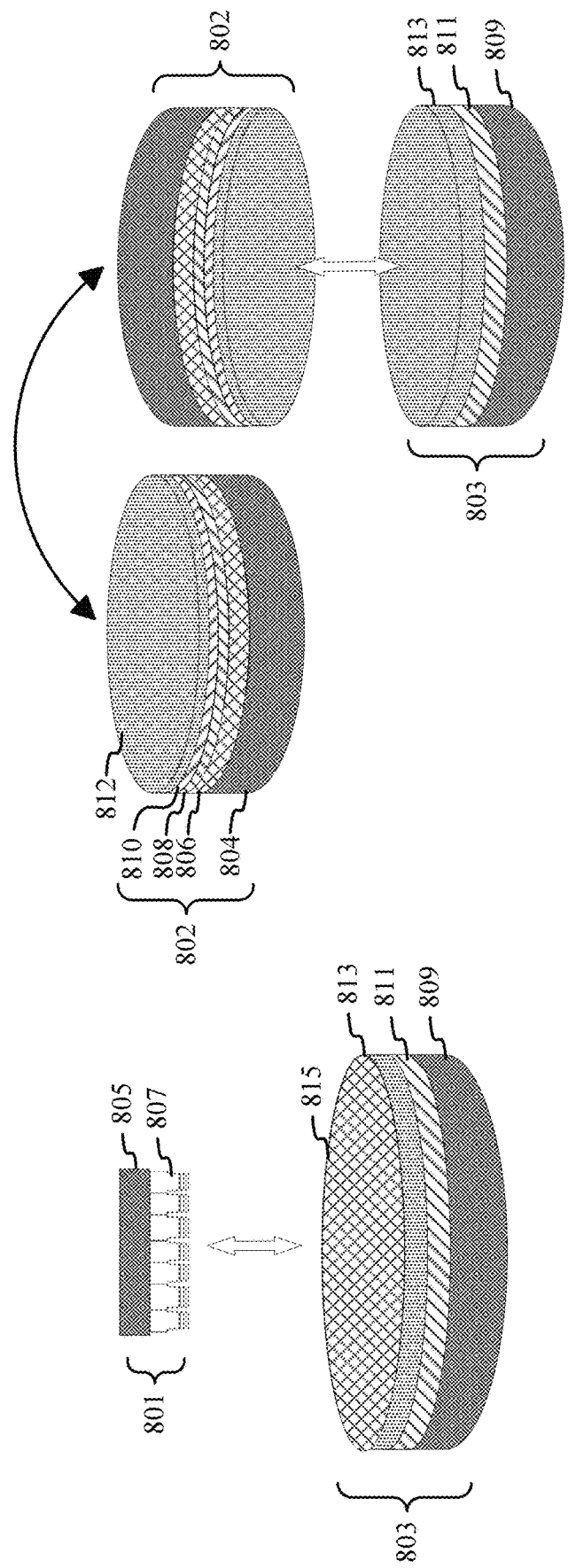
FIG. 8A illustrates an example of a method of die-to-wafer bonding for arrays of LEDs according to certain embodiments.
FIG. 8B illustrates an example of a method of wafer-to-wafer bonding for arrays of LEDs according to certain embodiments.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. Base layer 809 may include, for example, a silicon wafer. Driver circuits 811 may be used to control the operations of LEDs 807. For example, the driver circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding driver circuits 811 on wafer 803. In one example, LED array 801 may be brought toward wafer 803 until LEDs 807 come into contact with respective metal pads or bumps corresponding to driver circuits 811. Some or all of LEDs 807 may be aligned with driver circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AlN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlInGaP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes driver circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include driver circuits for the arrays of LEDs and various electrical interconnects. A bonding layer may include dielectric regions 940 and contact pads 930 connected to circuits 920 through electrical interconnects. Contact pads 930 may include, for example, Cu, Ag, Au, Al, W, Mo, Ni, Ti, Pt, Pd, or the like. Dielectric materials in dielectric regions 940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

FIG. 9B illustrates a wafer 950 including an array of micro-LEDs 970 fabricated thereon as described above with respect to, for example, FIGS. 7A-8B. Wafer 950 may be a carrier wafer and may include, for example, GaAs, InP, GaN, AlN, sapphire, SiC, Si, or the like.

Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, $SiO_2$, SiN, $Al_2O_3$, $HfO_2$, $ZrO_2$, $Ta_2O_5$, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 200-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs.

Examples of the secondary optical components may include a lens, a grating, an antireflection (AR) coating, a prism, a photonic crystal, or the like.

Figure 10:
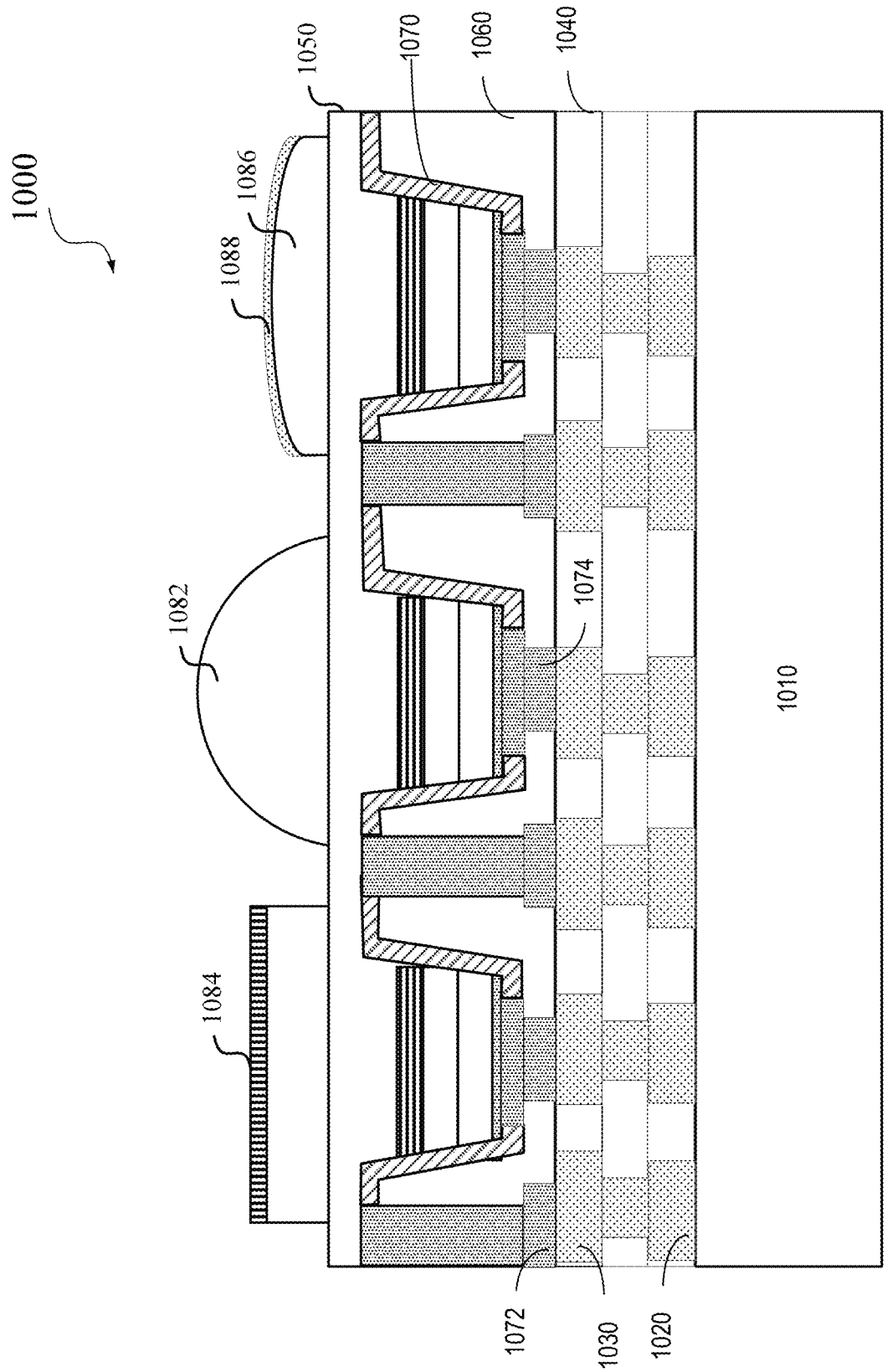
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIGS. 9A-9D. LED array 1000 may include a substrate 1010, which may be, for example, a silicon wafer. Integrated circuits 1020, such as LED driver circuits, may be fabricated on substrate 1010. Integrated circuits 1020 may be connected to p-contacts 1074 and n-contacts 1072 of micro-LEDs 1070 through contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO$_2$, SiN, Al$_2$O$_3$, HfO$_2$, ZrO$_2$, Ta$_2$O$_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

Figure 11:
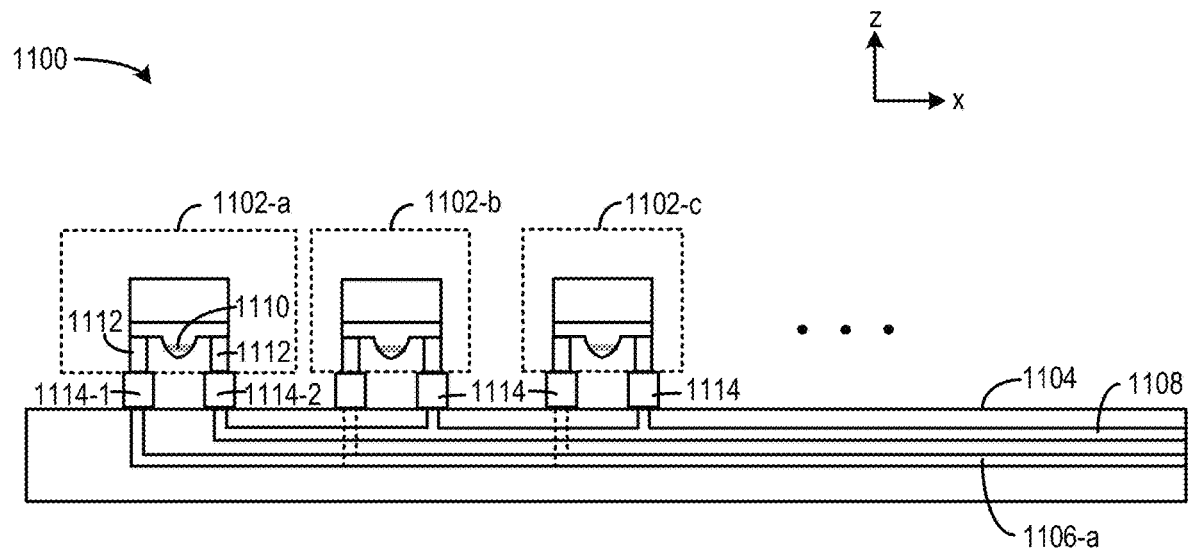
FIG. 11 is a side view of an example display.
Figure 12:
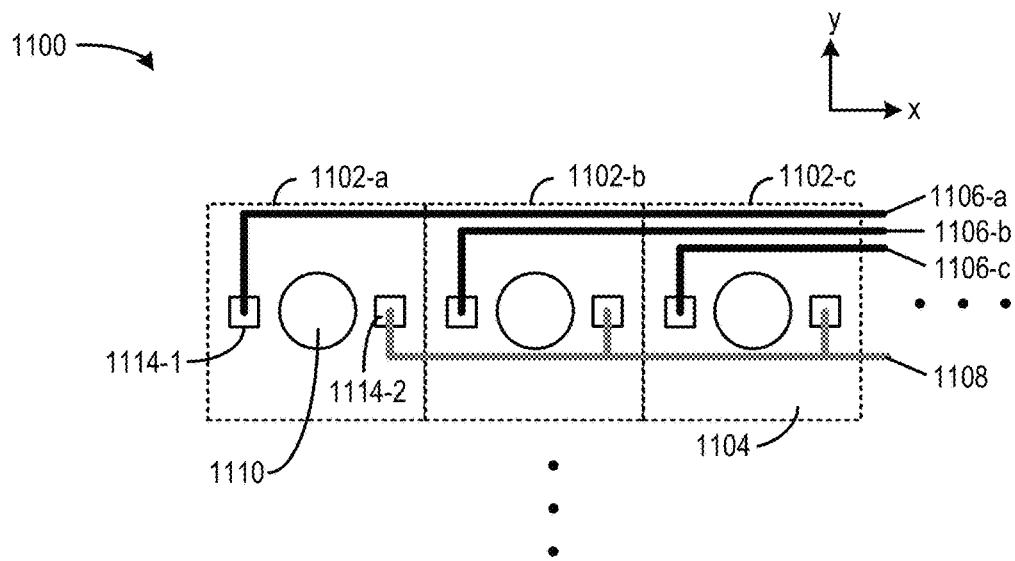
FIG. 12 is a top view of the example display of FIG. 11.

Referring next to FIGS. 11 and 12, a side view of a display apparatus 1100 is shown in FIG. 11, and a top view of the display apparatus 1100 is shown in FIG. 12. The display apparatus 1100 can be part of a light source (e.g., image source 412 and light source 540 or 642) of a near-eye display. The display apparatus 1100 comprises a plurality of LEDs. The plurality of LEDs can be micro-LEDs. Although the examples in FIGS. 11 and 12 are based on micro-LED devices, it is understood that the examples in FIGS. 11 and 12 are applicable to other types of light emitters (e.g., semiconductor lasers and LEDs) as well.

As shown in FIG. 11, display apparatus 1100 can include an array of µLED dies 1102 including, for example, µLED die 1102-a, µLED die 1102-b, and µLED die 1102-c assembled on a backplane 1104. Backplane 1104 may include a structure for attaching a plurality of µLED dies 1102, to provide electrical connections, and/or to provide structural support for the plurality of µLED dies 1102. As used herein, "backplane" may refer to a structure that provides a surface (which can be planar, curved, etc.) for attaching a plurality of LED devices (which may include µLED devices) and/or for providing electrical signals to the plurality of LED devices. The backplane 1104 can be configured as a display backplane to form a display device. For example, the backplane 1104 can hold assemblies of LED devices forming display elements, and the backplane 1104 may also include traces to provide electrical signals to the LED devices to control information displayed by the display elements. Backplane 1104 may comprise traces, which may connect to other components. Backplane 1104 may also comprise electrical contact points, e.g., metal pads, which may provide access to the traces. For example, as shown in FIGS. 11 and 12, backplane 1104 includes electrical traces 1106-a, 1106-b, and 1106-c to electrically connect with, respectively, µLED die 1102-a, µLED die 1102-b, and µLED die 1102-c. Electrical traces 1106-a, 1106-b, and 1106-c allow each of µLED die 1102-a, µLED die 1102-b, and µLED die 1102-c to be individually controlled by applying different signals to different µLED dies 1102. Backplane 1104 also includes an electrical trace 1108 to act as a return current path for each of µLED die 1102-a, µLED die 1102-b, and µLED die 1102-c. Backplane 1104 may include different kinds of materials, such as a Thin Film Transistor (TFT) layer, a glass substrate, a polymer, a polychlorinated biphenyl (PCB), etc. Although FIG. 11 illustrates that backplane 1104 has a rectangular shape, it is understood that backplane 1104 can have various shapes and sizes. In some embodiments, a single µLED die 1102 may have a single µLED device. In some embodiments, a single µLED die 1102 may have a plurality of µLED devices. For example, a µLED die 1102 may have 2,073,600 µLED devices (e.g. 1920×1080).

Each of µLED die 1102-a, µLED die 1102-b, and µLED die 1102-c can have a structure similar to LED 700 of FIG. 7A or other LED described or mentioned. Each µLED die in FIGS. 11 and 12 can an active region 1110 (e.g., formed from active layer 730) and contacts 1112. While FIGS. 11 and 12 illustrate that the contacts 1112 are of rectangular shape, it is understood that the contacts can take on other shapes including, for example, rounded shapes, dome shapes, etc. One contact 1112 of the µLED die 1102 can be connected to a p-type contact pad, and another contact 1112 of the µLED die 1102 can be connected to an n-type contact pad.

Bumps 1114 can be used to secure the µLED die 1102 to the backplane 1104. Bumps 1114 can provide electrical connections between the µLED dies 1102 (e.g., the contacts 1112) and the backplane 1104. In some embodiments, bumps 1114 are solder bumps attached or deposited upon underbump metallization structures (e.g., pads on the backplane 1104 and/or on a µLED die 1102 can also be used in underbump metallization). Underbump metallization can be used to provide good adhesion of an interconnect bump and/or act as a diffusion barrier. The underbump metallization can comprise one or more metal layers.

In the examples of FIGS. 11 and 12, backplane 1104 has separate bumps 1114 (e.g., for each trace 1106) for each µLED die 1102 to transmit control signals to each µLED die 1102 separately. Such arrangement, while allowing each μLED die 1102 to be individually controlled, can lead to a large number bumps 1114 being placed on the backplane 1104 when the display apparatus 1100 includes a large number of pixels (e.g., having a large number of pixels and/or densely grouped pixels for higher resolution). For example, a display includes one million μLEDs, one million pairs of bumps 1114 (e.g., a first bump 1114-1 and a second bump 1114-2, which both contact the first μLED die 1102-*a* are considered a pair) are provided on backplane 1104 to provide electrical connections to each of the one million μLEDs. In another example, one million μLEDs uses one million plus one bumps (e.g., one million bumps for p contacts plus one bump for a common (remote) n contact, wherein the n contact is at a periphery of the μLEDs). Additional traces 1106 and 1108 are also used on backplane 1104 to provide electrical connections to bumps 1114.

The large number of bumps and associated wirings can degrade tight integration between the LED devices and control circuits. For example, additional backplane spaces may be needed to place the bumps, which can increase distances between the LED devices and control circuits. As signals travel through longer distances, operation speeds of the LED devices and/or the control circuits can be reduced as a result.

Figure 13:
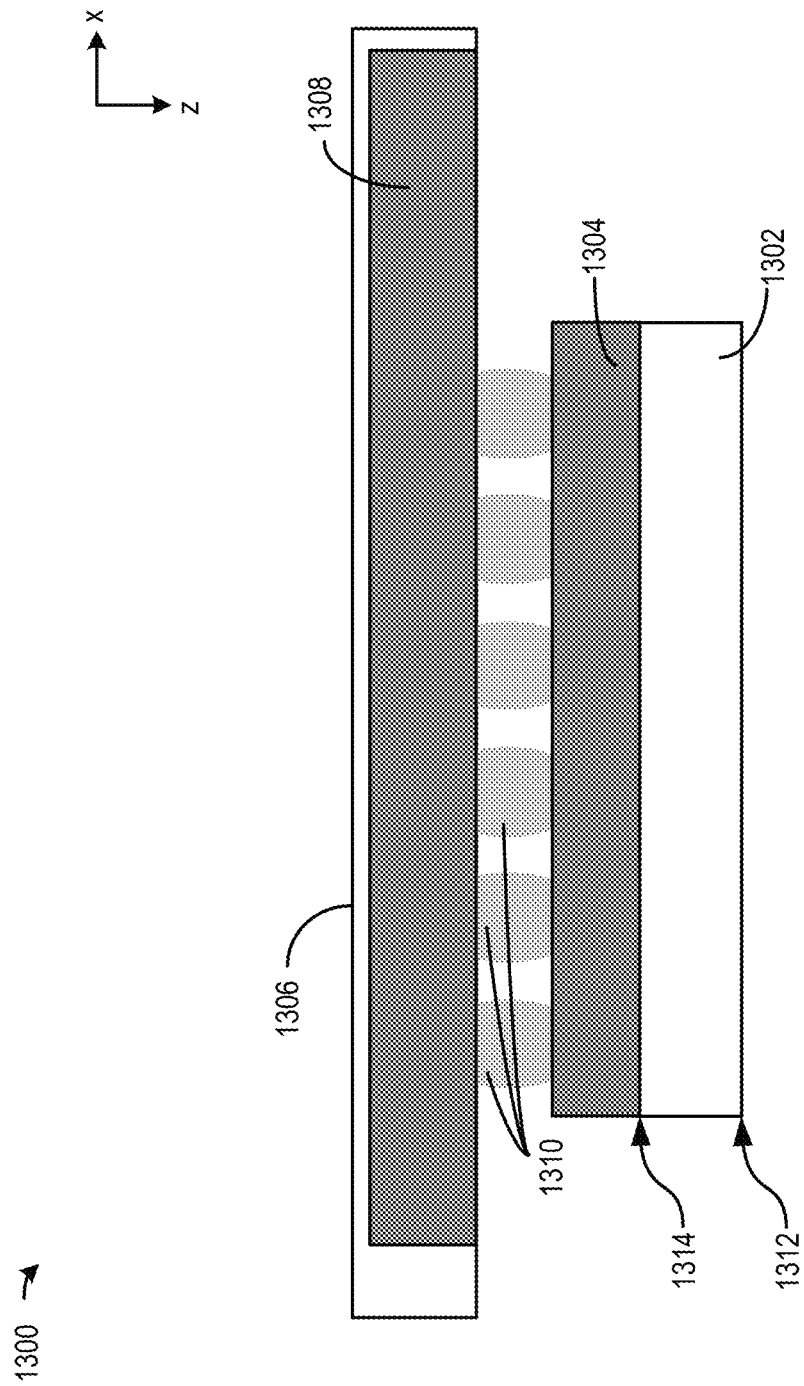
FIG. 13 illustrates an example of a thin-film circuit layer deposited on an LED array with a backplane bonded to the thin-film circuit layer.

FIG. 13 illustrates an embodiment of a display device 1300. The display device 1300 has a device layer 1302 with a thin-film circuit layer 1304 deposited on the device layer 1302. The display device 1300 comprises a backplane 1306. The backplane 1306 may include CMOS periphery circuits 1308. A plurality of bumps 1310 electrically connect the thin-film circuit layer 1304 with the backplane 1306 (e.g., the bumps 1310 connect the thin-film circuit layer 1304 with the CMOS periphery circuits 1308).

The device layer 1302 comprises an array of light sources (e.g., an array of LEDs, such as an array of μLED dies 1102 or an array of LEDs 700). The array of LEDs comprises a layered epitaxial structure include a first doped semiconductor layer (e.g., a p-doped layer), a second doped semiconductor layer (e.g., an n-doped layer), and a light-emitting layer (e.g., an active region). The device layer 1302 of the array of LEDs has a light-emission side 1312 (e.g., light is emitted in the z direction) and a side opposite 1314 the light-emission side 1312.

The thin-film circuit layer 1304 is deposited on the side opposite 1314 the light emission side of the array of LEDs of the device layer 1302. The thin-film circuit layer 1304 can comprise a transistor layer (e.g., a thin-film transistor (TFT) layer); an interconnect layer; and/or a bonding layer (e.g., a layer comprising a plurality of under bump metallization pads to allow interconnect bumps to be attached to). The device layer 1302 is a support structure for the thin-film circuit layer 1304. The thin-film circuit layer 1304 comprises circuitry for controlling operation of LEDs in the array of LEDs. The device layer 1302 and the thin-film circuit layer 1304 can form a vertical stack (e.g., along the z direction; monolithically integrated).

The backplane 1306 is coupled with the thin-film circuit layer 1304 using the bumps 1310. The bumps 1310 are a plurality of metal bonds. The backplane 1306 comprises drive circuitry for supplying electrical current to the thin-film circuit layer 1304 through the plurality of metal bonds. For example, the backplane 1306 includes a silicon substrate, and the CMOS periphery circuits 1308 (e.g., the drive circuitry) comprise transistors fabricated on the silicon substrate (e.g., in the silicon substrate or in a layer supported by the silicon substrate). In some embodiments, the backplane 1306 can comprise a transparent substrate.

The bumps 1310 form a plurality of metal bonds. A number of the plurality of metal bonds can be less than a number of LEDs in the array of LEDs because the thin-film circuit layer 1304 can be used to enable sending data to operate multiple LEDs from the backplane 1306 through one bump 1310. In FIG. 13, the bump 1310 can represent a single interconnect, or multiple interconnects, for carrying a group of signals targeted at a particular LED, pixel, a group of LEDs, or a group of pixels.

In display device 1300, each LED can form a pixel, or multiple LEDs can form a pixel (e.g., one or more red, green, or blue LEDs can form a pixel). The thin-film circuit layer 1304 can include groups of TFTs, with each group corresponding to an LED device of a pixel and forming a pixel TFT. The pixel TFT can control the operation of a corresponding LED or groups of LEDs. For example, the pixel TFT can control a magnitude of current that flows through the corresponding LED, to control an intensity of light emitted by the LED. The pixel TFT can control the pixel based on control signals received from CMOS periphery circuits 1308 of backplane 1306, which may include arrays of high speed driver circuits. The control signals can be received at the thin-film circuit layer 1304 via Bumps 1310.

In display device 1300, the thin-film circuit layer 1304 may include signal lines (e.g., traces 1106 in FIG. 12), which can be electrically connected to each pixel TFT, or groups of pixel TFTs. The common signal lines can carry a selection signal to indicate which of the pixel TFT/groups of pixel TFT is to be selected. The common signal lines can also carry an operation signal to control, for example, magnitude of current flowing through an LED controlled by the selected pixel TFT/groups of pixel TFT. The common signal lines of the thin-film circuit layer 1304 can be electrically connected to the backplane 1306 by bumps 1310. CMOS periphery circuits 1308 can generate the selection signals and operation signals to select, for example, rows of LEDs to emit light sequentially to form a scanning display.

Figure 14:
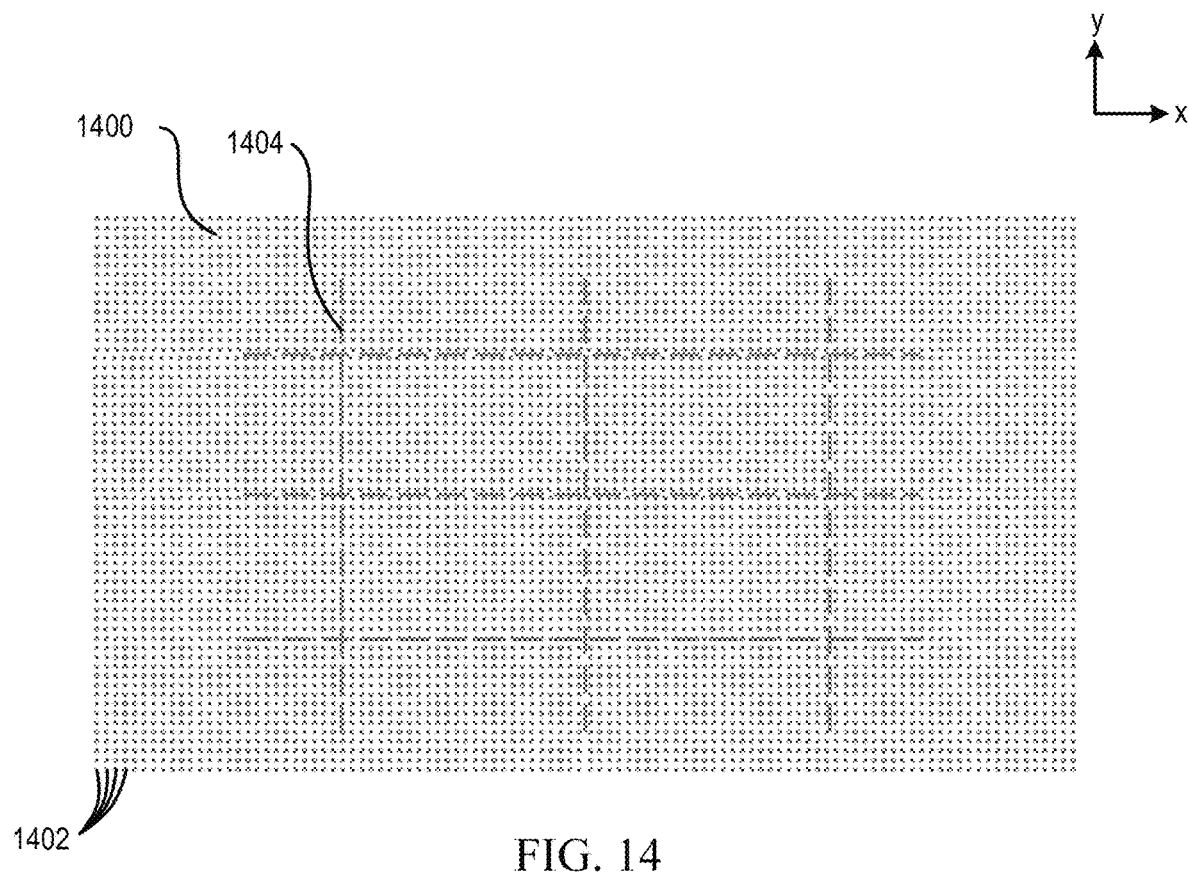
FIG. 14 illustrates an example of an array of micro LEDs.

FIG. 14 illustrates an example of an array 1400 of micro LEDs. Each dot in FIG. 14 represents a position of a light source 1402, such as an LED or pixel. The array 1400 is superimposed over dashed lines forming a grid 1404. FIG. 14 illustrates a distribution of LEDs. The array 1400 is partially shown. For example, light sources 1402 can extend in x and/or y so that there are more than 6 k, 10 k, 100 k, 500 k, or 1,000 k light sources 1402 in the array 1400.

If there was one signal line per light source 1402, then bumps 1114 in FIG. 11 could be at least as densely spaced as the light sources 1402 in the array 1400, or bumps 1114 could be placed outside an area of the array 1400. It can be challenging to form and/or bond using small, densely spaced bumps (e.g., when spacing between bumps is less than 10, 5, or 2 μm).

Figure 15:
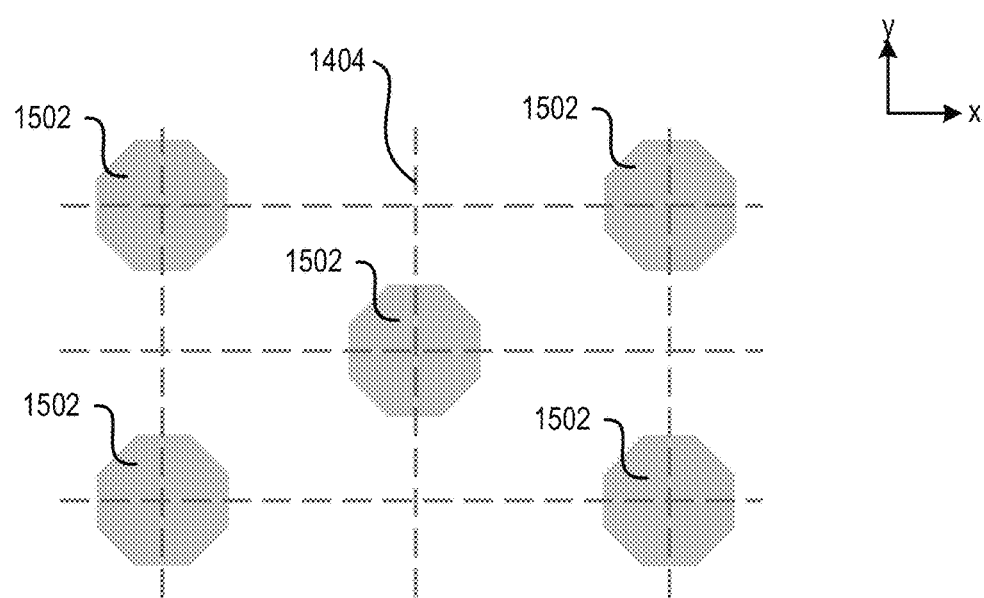
FIG. 15 illustrates an example of micro bump positioning in relation the array of micro LEDs.

FIG. 15 illustrates an example of positions of bumps in relation to the array 1400 of light sources 1402 in FIG. 14. FIG. 15 shows a plurality of bumps 1502 superimposed over the grid 1404. Spacing between the bumps 1502 is much larger than the spacing between light sources 1402 in FIG. 14. Accordingly, one bump 1502 can be used to transmit control signals (e.g., selection signals, operation signals, etc.) to light sources 1402 in one group. Light sources 1402 can be grouped, with each group sharing a bump 1502 for transmitting signals to the group of light sources 1402. In some embodiments, there can be 50, 64, 100, 128, 250, or 500 light sources 1402 per group. In other embodiments, there can be different numbers of light sources 1402 per group. The thin-film circuit layer 1304 can be used to activate individual light sources 1402 in response to the control signals.

A number of the plurality of bumps 1502 in FIG. 15 is smaller than a number of the plurality of light sources 1402 in the array 1400. As an example, the array 1400 may include two million LEDs to support high-definition (HD) projection, and each LED may have a small spacing between LEDs equal to or greater than 0.1, 0.5, or 1 µm and/or equal to or less than 20 µm. To support individual pixel-level interconnects, two million bumps (or groups of bumps) would be provided on the backplane, and each bump would have the same spacing (or less) as spacing between the LEDs (e.g., 0.1 µm to 20 µm). Advanced and expensive fabrication techniques may be used to put such a large number of bumps densely arranged on a backplane with high precision to conform to the spacing of the LEDs. In contrast, with the described techniques, a much smaller number of bumps can be placed on the backplane (e.g., around 4000 bumps for two million LEDs), wherein each bump can be separated by a much larger distance than the LED spacing (e.g., bump spacing can be around 12, 14, 15, 25, 35, 45, 55, or 65 µm). Having larger spacing of the bumps 1502 can relax fabrication tolerances. As a result, less advanced and/or more cost-effective fabrication techniques can be used to manufacture the display device 1300.

Figure 16:
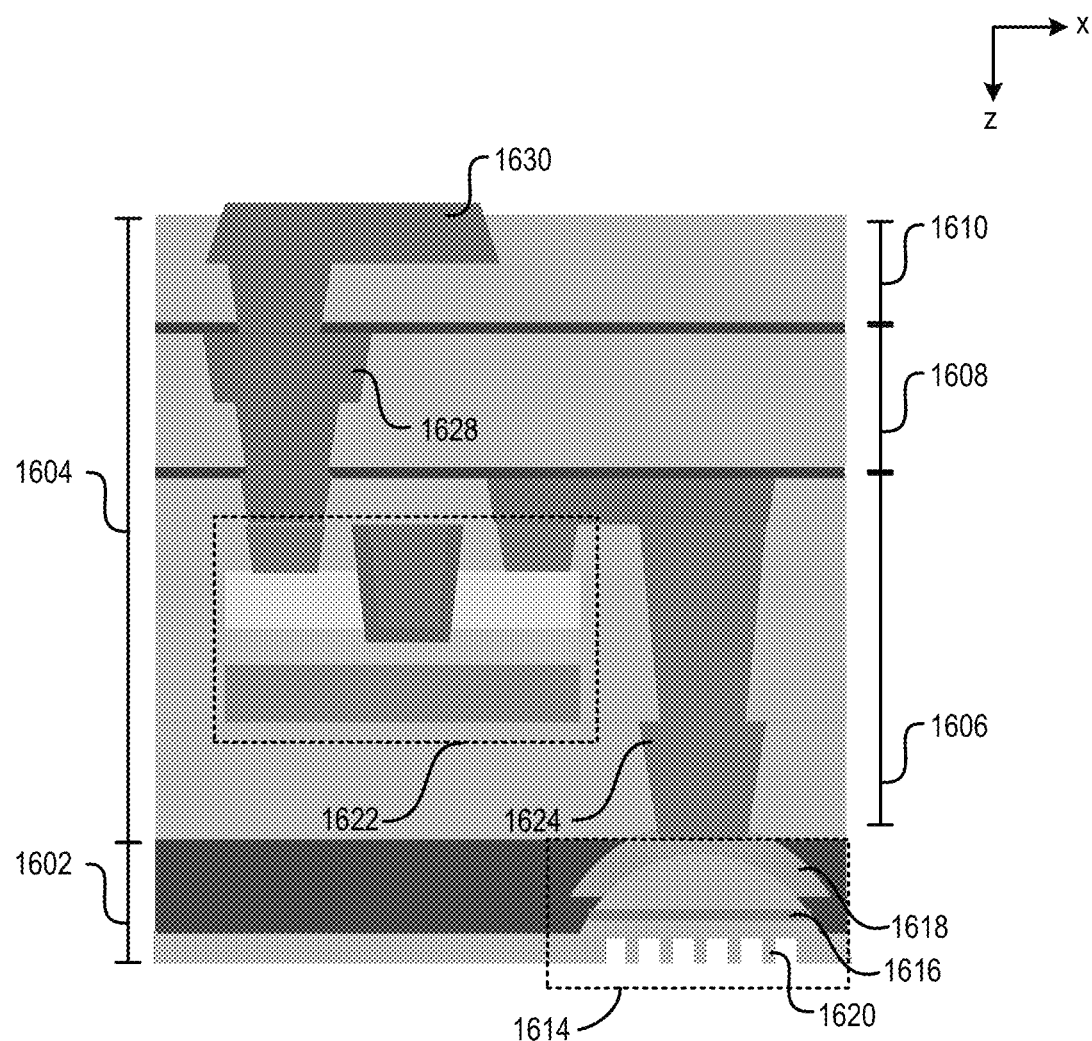
FIG. 16 illustrates a cross-sectional view of a thin-film circuit layer on an LED.

FIG. 16 illustrates a cross-sectional view of device layer 1602 with a thin-film circuit layer 1604 disposed on the device layer 1602. The thin-film circuit layer 1604 comprises a transistor layer 1606, an interconnect layer 1608, and a portion of the bonding layer 1610.

The device layer 1602 comprises a plurality of LEDs 1614. The LED 1614 can be a micro-LED in an array (e.g., in array 1400). LEDs 1614 can be formed on a substrate compatible with LED materials and operation (e.g., III-V or III-Nitride materials, including Gallium Nitride (GaN), GaN on Si (Silicon), GaN on Sapphire, Indium Gallium Arsenide (InGaAs), Aluminum Indium Gallium Phosphide (AlInGaP), and Gallium Arsenide (GaAs)). The LED 1614 can include an active region 1616, a reflector 1618, and/or a light extraction feature 1620.

The transistor layer 1606 can comprise one or more electrical devices. For example, the transistor layer 1606 can comprise a thin film transistor (TFT) 1622, metal vias 1624, interconnects, capacitors, resistors, and the like (e.g., monolithically formed on the device layer 1602). The TFT 1622 can include materials including, for example, c-axis aligned crystal Indium-Gallium-Zinc oxide (CAAC-IGZO), amorphous indium gallium zinc oxide (a-IGZO), low-temperature polycrystalline silicon (LTPS), amorphous silicon (a-Si), etc. Example structures of the TFT may include top-gate or bottom gate; top contact or bottom contact; etc. In some embodiments, the transistor 1622 is a Trench Gate Self-Aligned (TGSA) thin-film transistor.

TFTs 1622 can be formed on a back-end of the device layer 1602 (e.g., on a back-end of the array of LEDs 1614). Such arrangements allows LED devices to be fabricated on a standalone wafer, which enables LED device/process optimizations. For example, etching and passivation can be performed to isolate cathode/anode to enable pixel scaling. In some embodiments the transistor layer 1606 comprises transistors and capacitors interconnected to form a pixel circuit for controlling operation of the LED 1614.

The interconnect layer 1608 comprises a common signal line, sometimes referred to as control line or a dataline 1628. A common signal line can be part of a global net. The bonding layer comprises a plurality of pads 1630 for bonding to bumps. The dataline 1628 connects a plurality of pixel circuits (e.g., for a plurality of LEDs 1614) from the transistor layer 1606 to one pad 1630 in the bonding layer 1610.

Figure 17:
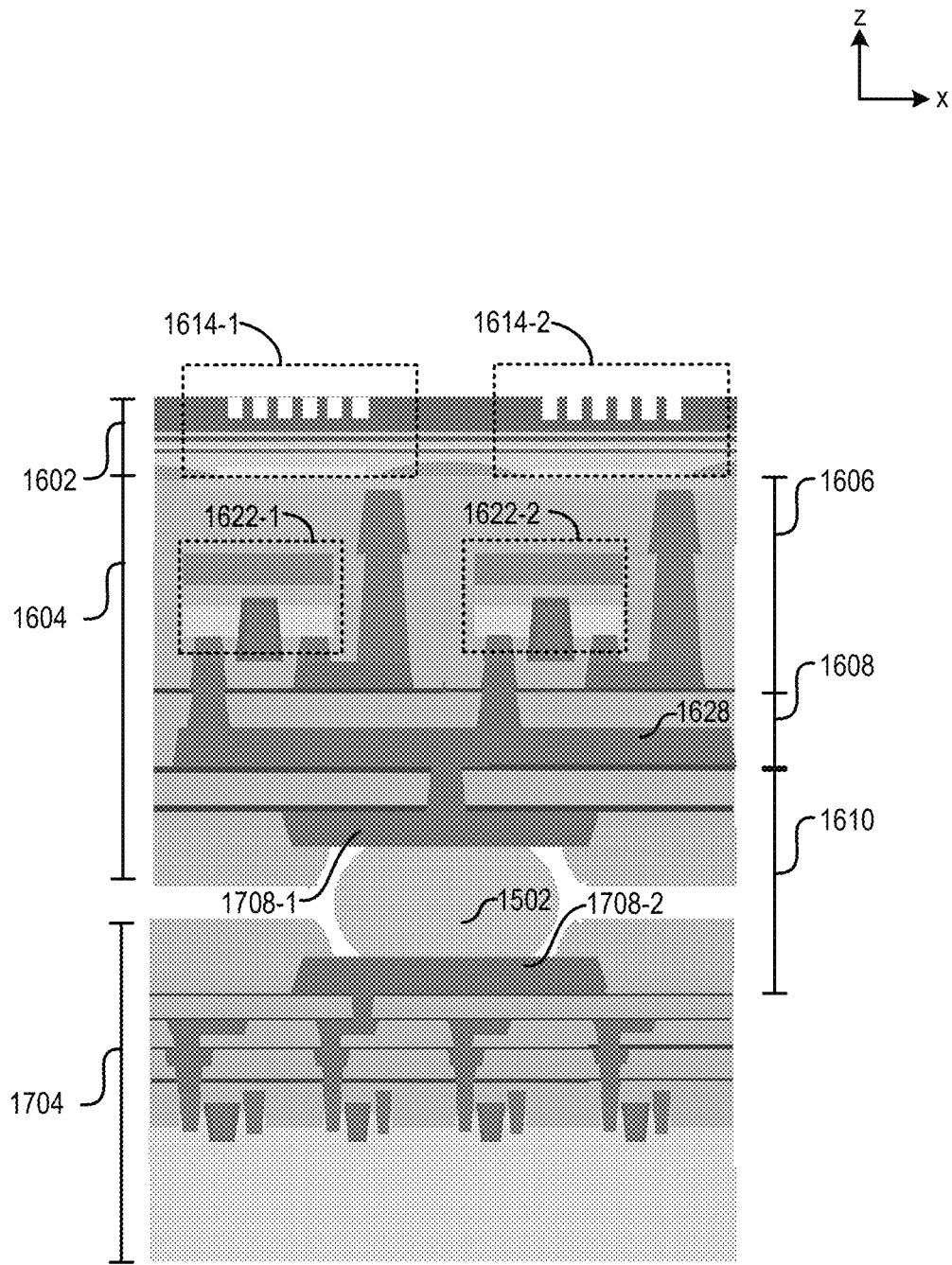
FIG. 17 illustrates a cross-sectional view of an example of a backplane bonded to an LED array.

FIG. 17 illustrates a cross-sectional view of an example of a backplane 1704 bonded to an array of LEDs 1614. The backplane 1704 can include a silicon wafer including transistors and interconnects to implement, for example, CMOS periphery circuits 1308. Bumps 1502 electrically connect the backplane 1704 and the thin-film circuit layer. Bumps 1502 may include copper, copper alloys, aluminum, tungsten, etc. Moreover, bumps 1502 can be in the form die-to-die or die-wafer interconnects.

FIG. 17 shows one dataline 1628 connected with both a first transistor 1622-1, of a first pixel circuit to control operation of a first LED 1614-1, and a second transistor 1622-2, of a second pixel circuit to control operation of a second LED 1614-2. The pixel circuits are interconnected by the dataline 1628 (e.g., the pixel circuits share the dataline) to reduce a number of global signals and (e.g., reduce a number of bumps 1502 used for transmitting the global signals). The dataline 1628 is connected to a first pad 1708-1. The bump 1502 bonds the first pad 1708-1 to a second pad 1708-2, wherein the second pad 1708-2 is part of the backplane 1704.

Figure 18:
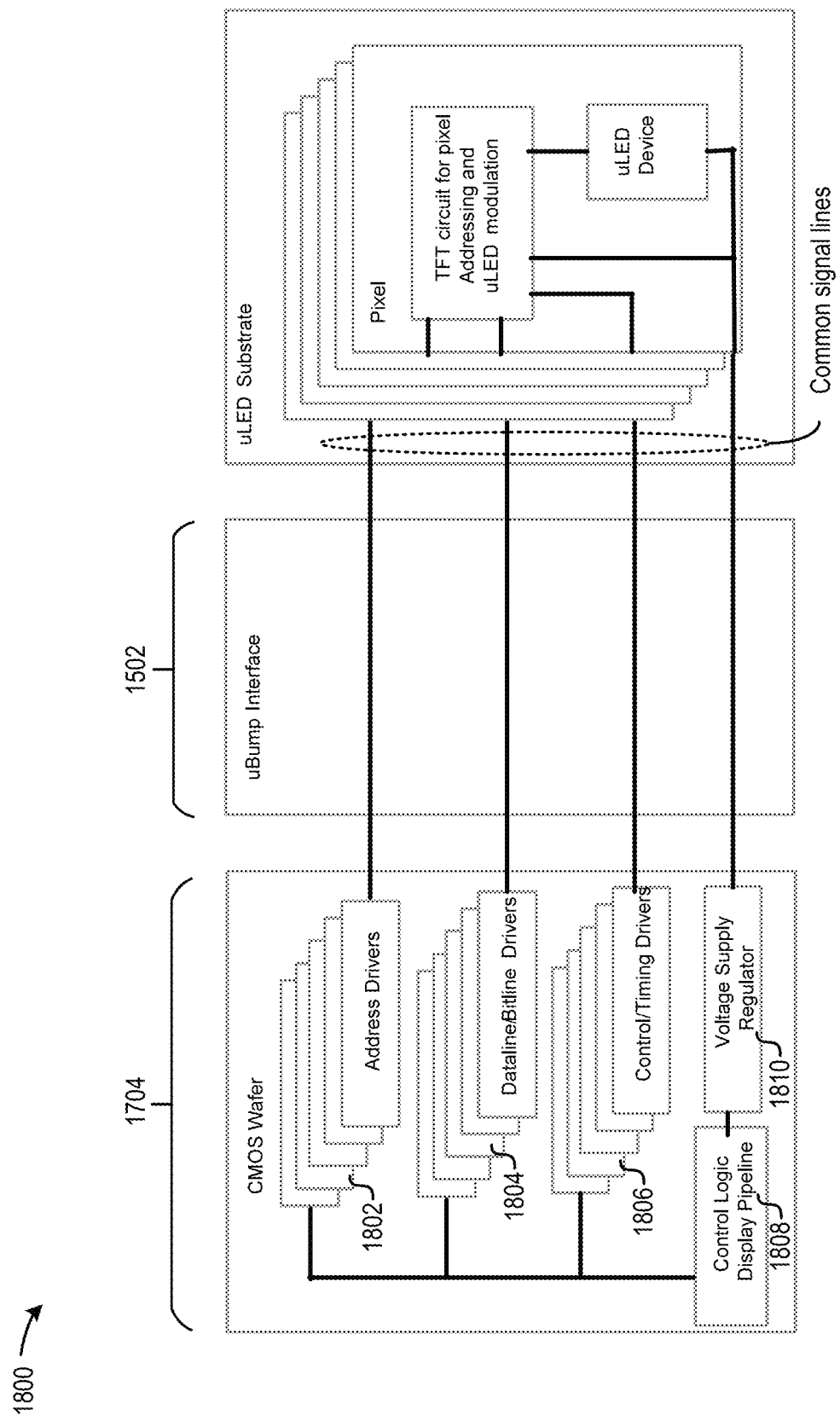
FIG. 18 illustrates an example architecture of a display device.
Figure 27:
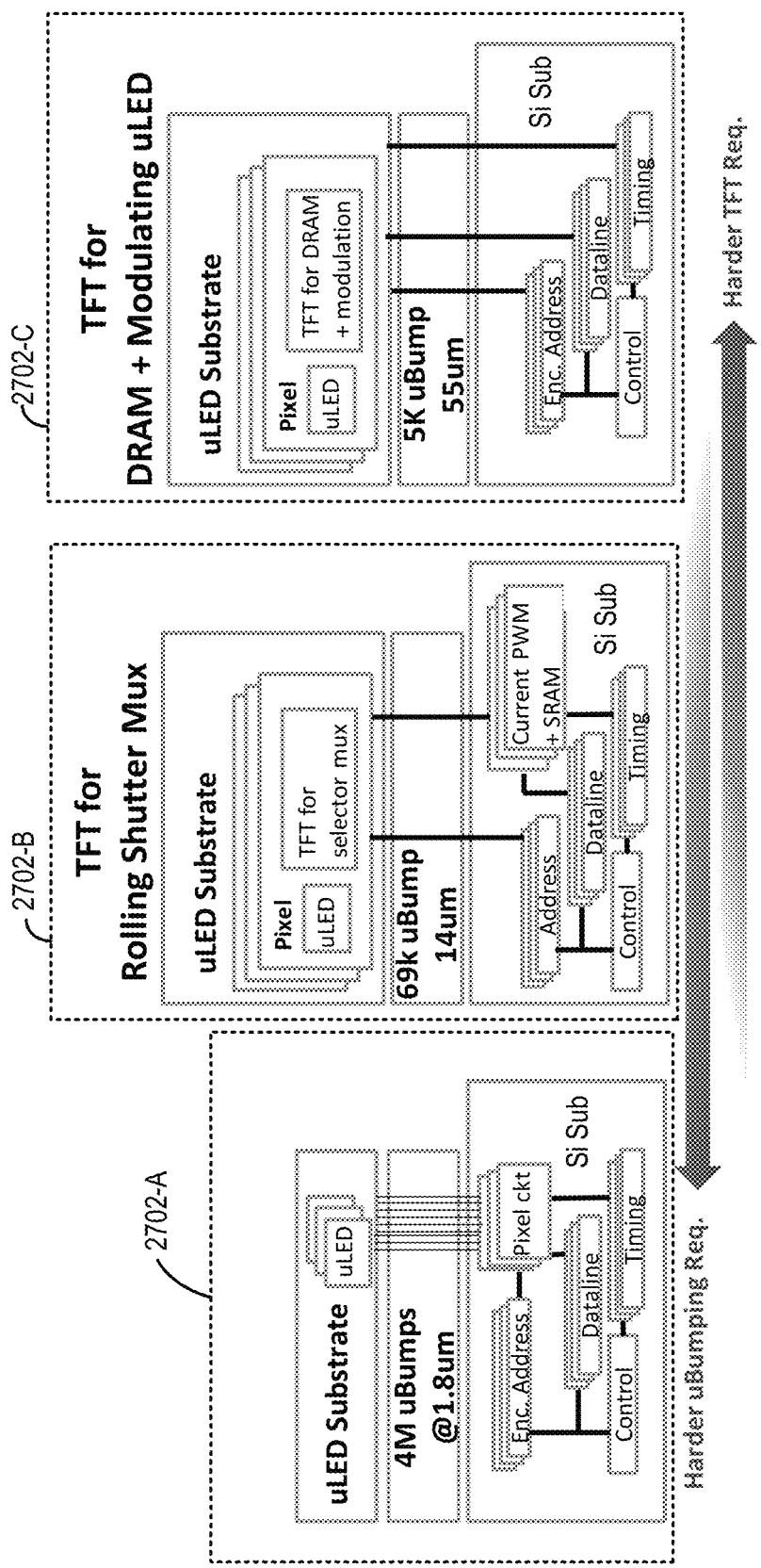
FIG. 27 illustrates an example sliding scale of complexity and micro-bump reduction for adding functionality to the thin-film circuit layer.

FIG. 18 illustrates an example architecture of a display device 1800, according to examples of the disclosed techniques. The displace device 1800 is just one example architecture among a variety of architectures along a spectrum of increased functionality in the thin-film circuit layer (e.g., as shown in FIG. 27). As shown in FIG. 18, backplane 1704 may include a CMOS wafer comprising a plurality of address drivers 1802, dataline/bitline drivers 1804, and control/timing drivers 1806. The address drivers 1802 can generate selection signals to select one or more pixel TFTs (and the corresponding LED). The selection signals can specify, for example, an address (e.g., a row address, a column address, etc.) of a target LED. The dataline/bitline drivers 1804 can generate the operation signals to set a magnitude (or average magnitude) of current flowing through the LED. The control/timing drivers 1806 can generate timing signals to control timing of application of the operation signal. Drivers can be controlled by a control logic 1808. Backplane 1704 may further include a voltage supply regulator 1810 to supply a voltage (and ground) to the LEDs. The selection signals, operation signals, the timing signals, and voltage supply can be transmitted to the thin-film circuit layer via bumps 1502. The thin-film circuit layer includes common signal lines (e.g., datalines 1628), which are shared by groups of pixel TFTs. A target pixel TFT can be selected/enabled by the selection signals and control the current flowing through the corresponding LED based on the operation signals and the timing signals.

As an example, the backplane 1704 is configured to transmit a global signal through a metal bond (e.g., bump 1502), of the plurality of metal bonds, to the thin-film circuit layer, wherein the global signal comprises one or more of row selection data, column selection data, analog bias, voltage supply, pulse clocks, or DFT (test enablement circuits). Drive circuitry of the backplane 1704 can include one or more of address drivers 1802, dataline/bitline drivers 1804, or control/timing drivers 1806. The thin-film circuit layer can comprise a selector multiplexor for applying signals to pixel circuits.

Figure 21:
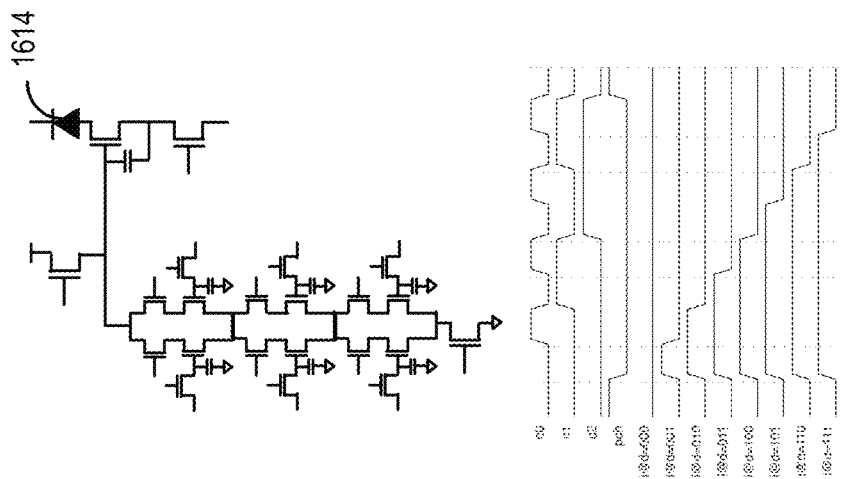
FIGS. 19-21 illustrate example modulation circuits of a display device.
Figure 20:
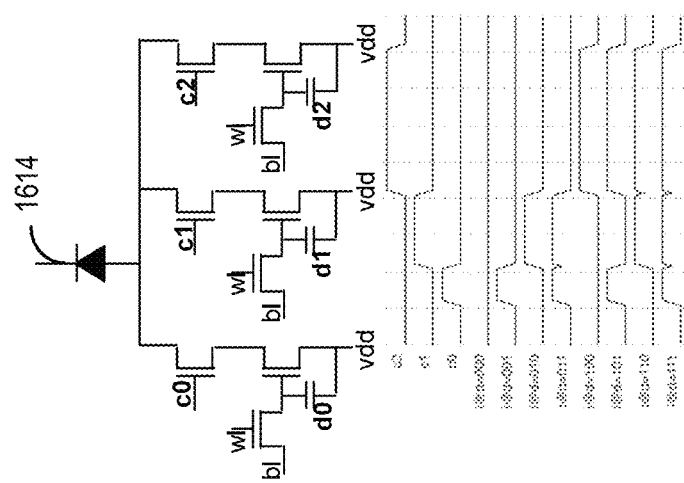
Figure 19:
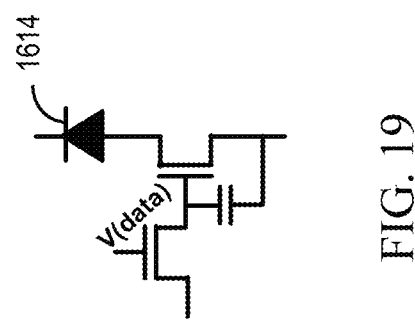

FIGS. 19-21 illustrate example modulation circuits of a display device. Modulation circuits can be formed in the thin-film circuit layer 1604 and/or in the backplane 1704.

FIG. 19 is an example of an analog modulation circuit. An operation signal in an analog circuit has a magnitude that corresponds to a magnitude of current to be applied to an LED 1614. The analog modulation circuit may have the smallest footprint, but magnitude modulation can cause an LED 1614 to red shift or blue shift.

FIG. 20 is an example of a circuit for pulse-code modulation (PCM) of an intensity of the LED 1614. The circuit in FIG. 20 is relatively simple, though glitches may cause some perceptual artifacts. FIG. 21 is an example of a circuit for pulse-width modulation (PWM) of an intensity of the LED 1614. The PWM circuit has the largest footprint, but it can have less perceptual artifacts.

Changing code signals can change how long an LED is on, which changes how bright the LED appears to a user. In both PCM and PWM, an operation signal comprises a digital signal that represents a percentage of time within a time period for which current flows to a selected LED 1614. Charts under circuit diagrams show "on" durations of signals based different combinations of code signals. For example, in the PCM circuit of FIG. 20, the "wl" and "bl" signals can be operation signals controlled by address drivers to charge up the capacitors d0, d1, and d2. The counter signals c0, c1, and c2 can be controlled by control/timing drivers to control when the capacitors d0, d1, and d2 discharge through the LED 1614, which can modulate the conduction duration of current through the LED 1614. The PWM circuit of FIG. 21 can also modulate the conduction duration of current through the LED 1614 based on similar principles, but with different timing of counter signals c0, c1, and c2. In FIGS. 19-21, signal nets may be considered as local signals if they are connected to only terminals within a single pixel. Signal nets may be considered as global nets if they connect a number of bitcells together. For example, in FIG. 20, "bl" (bit line), "wl" (word line), "c0" and "vdd" (power supply) may be considered as parts of global nets. Global signals are transmitted on global nets. It is a characteristic of global signals that they may have a high capacitive loading. Some global signals may have a high steady-state current loading as well. Due to limited drive strength of TFT components, it is recommended that the TFT component is not used to charge or discharge a global net. Conversely, it is acceptable for a TFT component to load a global net. Similarly, it is acceptable for a TFT component to charge or discharge a local net because of the reduced local net capacitance and thus drive requirements.

Figure 22:
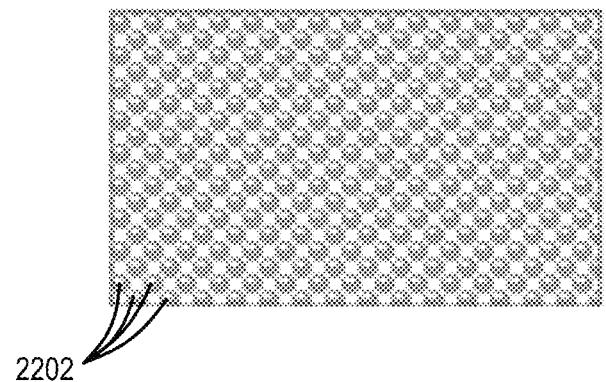
FIG. 22 illustrates an example of an addressing scheme using one connection per pixel.
Figure 23:
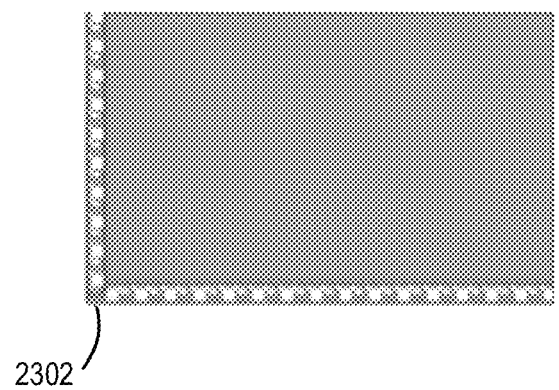
FIG. 23 illustrates an example of an addressing scheme using rows and columns.
Figure 24:
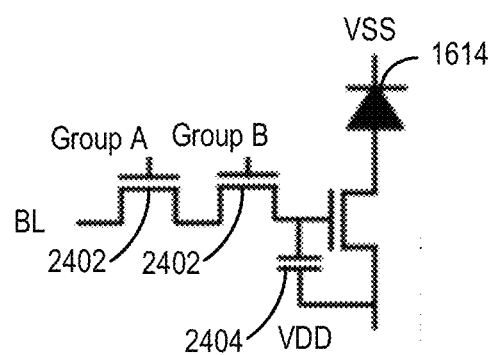
FIG. 24 illustrates an example circuit for addressing an LED using two row signals.

FIGS. 22-24 illustrate examples of addressing schemes. FIG. 22 illustrates an addressing scheme where each pixel 2202 has a separate address connection. FIG. 23 illustrates an example of addressing a pixel 2302 by using row addresses and column addresses, which can reduce a number of connections to the pixels as compared addressing according to FIG. 22. In FIG. 23, each row address and column address can be shared among pixels along, respectively, a same row and column.

As shown in FIG. 24, to reduce capacitive loading on a pixel TFT input, two transistors 2402 connected in series can be provided to control the input of the pixel TFT. The two transistors 2402 may be controlled by, for example, two row selection signals configured to select or deselect a row of pixels, two column selection signals configured to select or deselect a column of pixels, etc. Capacitor 2404 is a storage capacitor. BL can be a bitline, which can also be referred to as a dataline. The two transistors 2402 can also be controlled by the same signal to reduce the number of common signals. Accordingly, a pixel circuit can be coupled to multiple selection signals that are jointly asserted to couple a storage capacitor to a dataline. A single pixel circuit can be connected to multiple row selection signals. A control signal can comprise a unique address for an LED 1614, and an operation signal can control operation of a selected LED in an LED array. The circuit in FIG. 24 can be formed in the transistor layer 1606 and is sometimes referred to as a selector.

Figure 25:
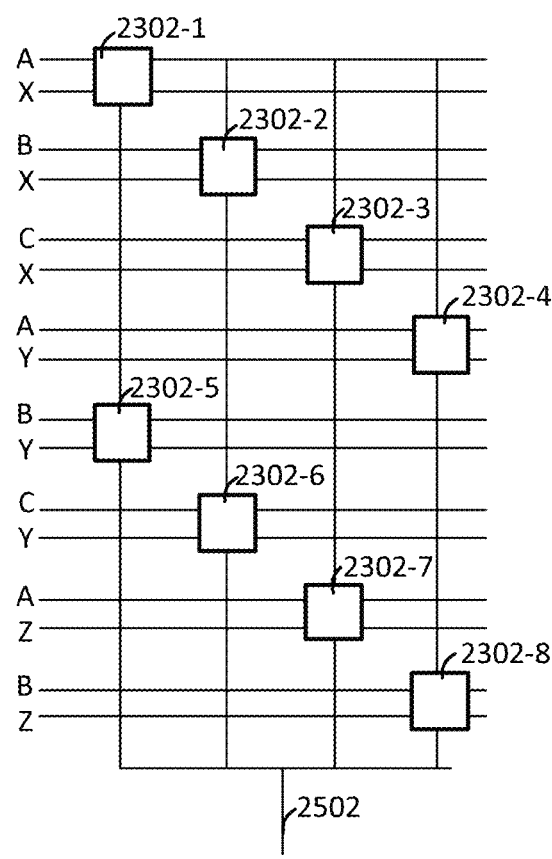
FIG. 25 illustrates an example layout using multiple row signals to address LEDs.

FIG. 25 illustrates an example layout using multiple row signals to address pixels 2302. Multiple columns can be folded into one column 2502 to reduce a number of column connections (e.g., to reduce a number of bumps 1502 used). For example, two rows and four columns can be electrically and/or logically connected to have one column and eight rows. The addressing scheme and the selection signals can be configured to distinguish between pixels 2302 that are within the same column but are addressed as different columns. Each pixel TFT can be configured to perform in-pixel decoding of the selection signals based on the addressing scheme such that the correct pixel can be selected. For the example in FIG. 25, pixels 2302-1, 2302-2, 2302-2, 2302-4, 2302-5, 2302-6, 2302-7, 2302-8 may be individually addressed through a combination of one column dataline signal and row dataline signals (e.g., A, B, C, X, Y, and Z). The addressing is achieved by having two selector signals per pixel. For example, both signal "A" and signal "X" must be asserted to select pixel 2302-1. For example, both signal "B" and signal "X" must be asserted to select pixel 2302-2. More generally, to address N pixels on a dataline, the square-root of N selector signals are used. The approach has the advantage of further decreasing the number of "bump" interconnects used and thus enables a coarse, more manufacturable, pitch target. In some embodiments, center to center spacing between pixels 2302 is equal to or less than 5, 3, or 2 microns and equal to or greater than 0.1, 0.5, or 1 microns.

Figure 26:
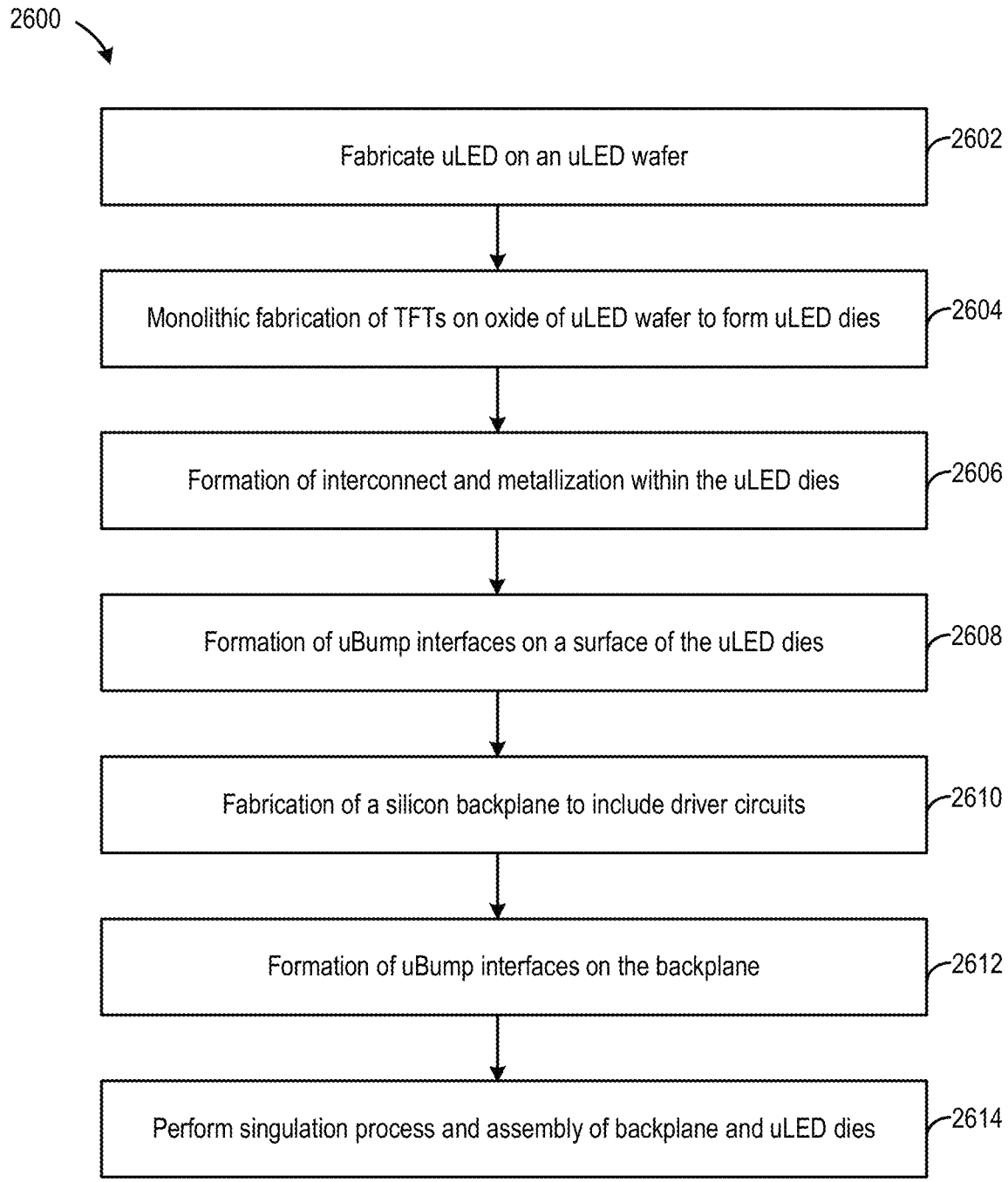
FIG. 26 is a flowchart of an embodiment of a process of fabricating a display device.

FIG. 26 is a flowchart of an embodiment of a process 2600 of fabricating a display device. Process 2600 begins in step 2602 with fabricating micro-LEDs on a micro-LED wafer. The micro-LED devices can be formed on a wafer, which can include a substrate compatible with micro-LED materials and operation. Examples include III-V or III-Nitride including GAN, GAN on Si, GAN on Sapphire, InGaAs, AlInGaP, GaAs, etc.

In step 2604, TFTs can be monolithically formed on an oxide of the micro-LED wafer to form a micro-LED die or dies, such that TFT and the micro-LED are formed on the same wafer. The TFTs can include Trench Gate Self-Aligned (TGSA) c-axis aligned crystal Indium-Gallium-Zinc oxide (CAAC-IGZO) TFTs. The TFTs can also include, for example, amorphous indium gallium zinc oxide (a-IGZO), low-temperature polycrystalline silicon (LTPS), amorphous silicon (a-Si), etc., and can be fabricated in a Low temperature back-end compatible process.

In step 2606, interconnect formation and metallization can be performed within the micro-LED dies to provide, for example, common signal lines to be shared by the pixel TFTs. The interconnects can be formed using metals, for example, copper, copper alloys, aluminum, tungsten, etc. In step 2608, micro-bump interfaces can be formed on a surface of the micro-LED dies to connect with the interconnects.

In step 2610 (which can occur concurrently with steps 2602-2608), a silicon backplane can be fabricated. The silicon backplane can include driver circuits (such as those shown in FIG. 18). In step 2612, micro-bump interfaces can be formed (e.g., on the backplane; in some embodiments, bumps can be formed on the micro-bump interfaces in step 2608). In step 2614, singulation process can be performed on the micro-LED dies and/or the silicon backplane. The micro-LED dies and the silicon backplanes can be assembled by forming micro-bump connections at the corresponding micro-bump interfaces to form the display device.

FIG. 27 illustrates an example sliding scale of complexity and micro-bump reduction for adding functionality to the thin-film circuit layer. More circuitry that is placed in the thin-film circuit layer reduces a number of bumps used, which can reduce tolerances for alignment. However, the more circuitry placed in the thin-film circuit layer, the more complex the thin-film circuit layer is to fabricate. Additionally, circuitry in the thin-film circuit layer can be slower than circuitry formed in the backplane. FIG. 27 illustrates three example devices: device 2702-A, device 2702-B, and device 2702-C. The three example devices are not meant to be limiting because other combinations of functionalities split between the backplane and the thin-film circuit layer could be used.

In device 2702-A, pixel circuits are in the backplane. In this example, a thin-film circuit layer is not used and micro-bumps are spaced very closely for high definition (e.g., spacing of micro-bumps is equal to or greater than 1 micron and equal to or less than 3 microns, such as 1.1, 1.3, 1.4, 1.6, 1.8, 2.1, or 2.3 microns).

In device 2702-B, pixel circuits with a selector multiplexor are formed in the thin-film circuity layer. Micro-bumps are spaced closely, but the thin-film circuit layer is much easier to manufacture than device 2702-C (e.g., spacing of micro-bumps is equal to or greater than 8 microns and equal to or less than 30 microns, such as 10, 12, 14, 16, 18, or 20 microns).

In device 2702-C, the thin-film circuity layer comprises the circuitry in device 2702-B plus memory (e.g., DRAM) and modulation circuits (e.g., from FIGS. 19-21). Micro-bumps in device 2702-C have the largest spacing (e.g., spacing of micro-bumps is equal to or greater than 30 microns and equal to or less than 75 microns, such as 35, 34, 55, or 64 microns).

Accordingly, in some embodiments, thin-film circuit layer comprises a selector multiplexor; the backplane comprises memory circuits and/or modulator circuits; and/or the thin-film circuit layer comprises memory circuits and modulator circuits.

Figure 28:
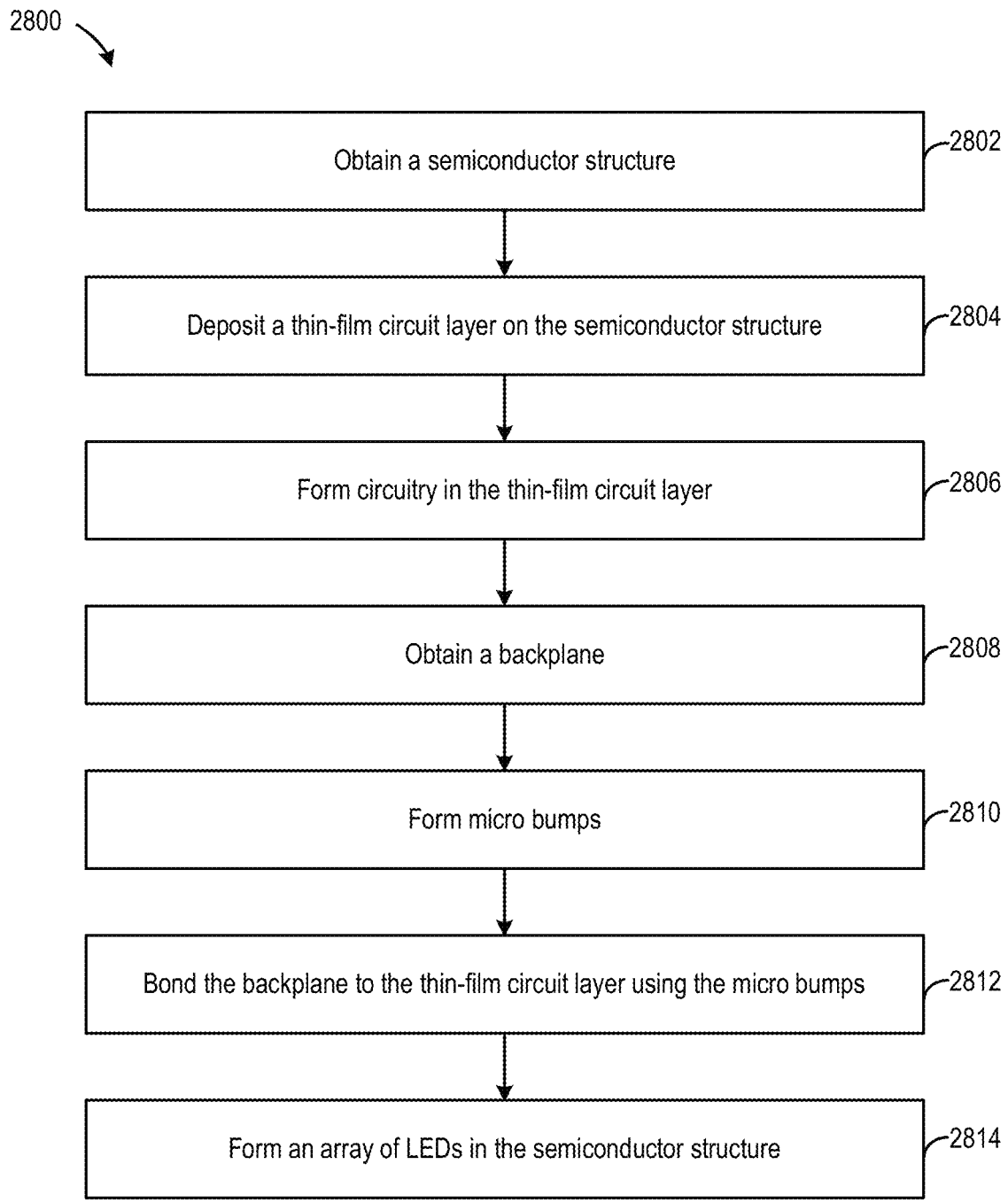
FIG. 28 is a flowchart of an embodiment of a process of fabricating a micro-LED display.

FIG. 28 is a flowchart of an embodiment of a process 2800 of fabricating a micro-LED display. Process 2800 begins in step 2802 with obtaining a semiconductor structure. The semiconductor structure can be a layered epitaxial structure including a first doped semiconductor layer, a second doped semiconductor layer, and a light-emitting layer between the first doped semiconductor layer and the second doped semiconductor layer. FIG. 7A provides an example of a semiconductor structure, and the device layer 1602 in FIG. 16 is another example of a semiconductor structure.

In step 2804, a thin-film circuit layer is deposited on the semiconductor structure. For example, layers for forming a thin-film transistor are deposited on the semiconductor structure.

In step 2806, circuitry is formed in the thin-film circuit layer to control light emission from the light-emitting layer. For example, transistors, capacitors, traces, and/or common signal lines are formed in the thin-film circuit layer. Bond pads (e.g., lower bond pads) can be formed in the thin-film circuit layer.

In step 2808 a backplane is obtained (e.g., backplane 1704). In some embodiments the backplane in obtained by manufacturing the backplane. The backplane comprises drive circuitry for supplying electrical current to the thin-film circuit layer through a plurality of metal bonds. The backplane can comprise a plurality of pads for bonding (e.g., upper bond pads). A plurality of micro bumps are formed on the thin-film circuit layer or on the backplane (e.g. on bond pad), step 2810. The backplane is bonded to the thin-film circuit layer using the plurality of micro bumps (e.g., bumps 1502), step 2812. For example, the backplane is heated and pressed toward the thin-film circuit layer so that micro bumps (e.g., solder) melt and form an ohmic connection between the backplane and the thin-film circuit layer. The micro bumps become the plurality of metal bonds after bonding (e.g., after cooling).

An array of light emitting diodes (LEDs) is formed from the semiconductor structure, step 2814. The array of LEDs can be formed before or after bonding. A number of the plurality of metal bonds is less than a number of LEDs in the array of LEDs to enable larger spacing (e.g., center to center) between the metal bonds.

In some embodiments, the array of LEDs has a light-emitting side (e.g., light-emission side 1312) and a side opposite the light-emitting side (e.g., side opposite 1314 the light-emission side), wherein the thin-film circuit layer is deposited on the side opposite the light-emitting side; obtaining the backplane comprises forming a plurality of CMOS transistors and interconnects in a silicon device layer of a silicon wafer; forming the array of LEDs comprises singulating the semiconductor structure; singulating the semiconductor structure occurs before bonding the backplane to the thin-film circuit layer; the thin-film circuit layer is formed on the semiconductor structure on a wafer level; the backplane includes electrical circuits formed in the backplane before bonding; the micro bumps are made of ohmic material; the thin-film circuit layer can be applied to many different types of substrate materials other than the semiconductor structure (e.g., sapphire or glass); the backplane comprises crystalline silicon; a number of micro bumps used is equal to or greater than 1000 and/or equal to or less than 10,000; and/or spacing between micro bumps is greater than spacing between LEDs.

A multiplexor can be used to reduce a number of bumps between the thin-film circuit layer and the backplane. One example of a multiplexor that can be used to reduce the number of bumps between the thin-film circuit layer and the backplane is a tiled-rolling shutter. The tiled-rolling shutter divides an array of light sources into tiles, sometimes referred to as groups. Each tile has a plurality of rows and a plurality of columns. Command signals are sequentially applied to rows over a time period so that current is applied to each row in the tile during the time period, with only one row at a time receiving current. Though a tiled-rolling shutter is provided as an example of a multiplexer, other multiplexors can be used. Variations to the tiled-rolling shutter can also be used. The multiplexor can be formed in the thin-film circuit layer to reduce a number of connections between the backplane and the thin-film circuit layer.

Figure 29:
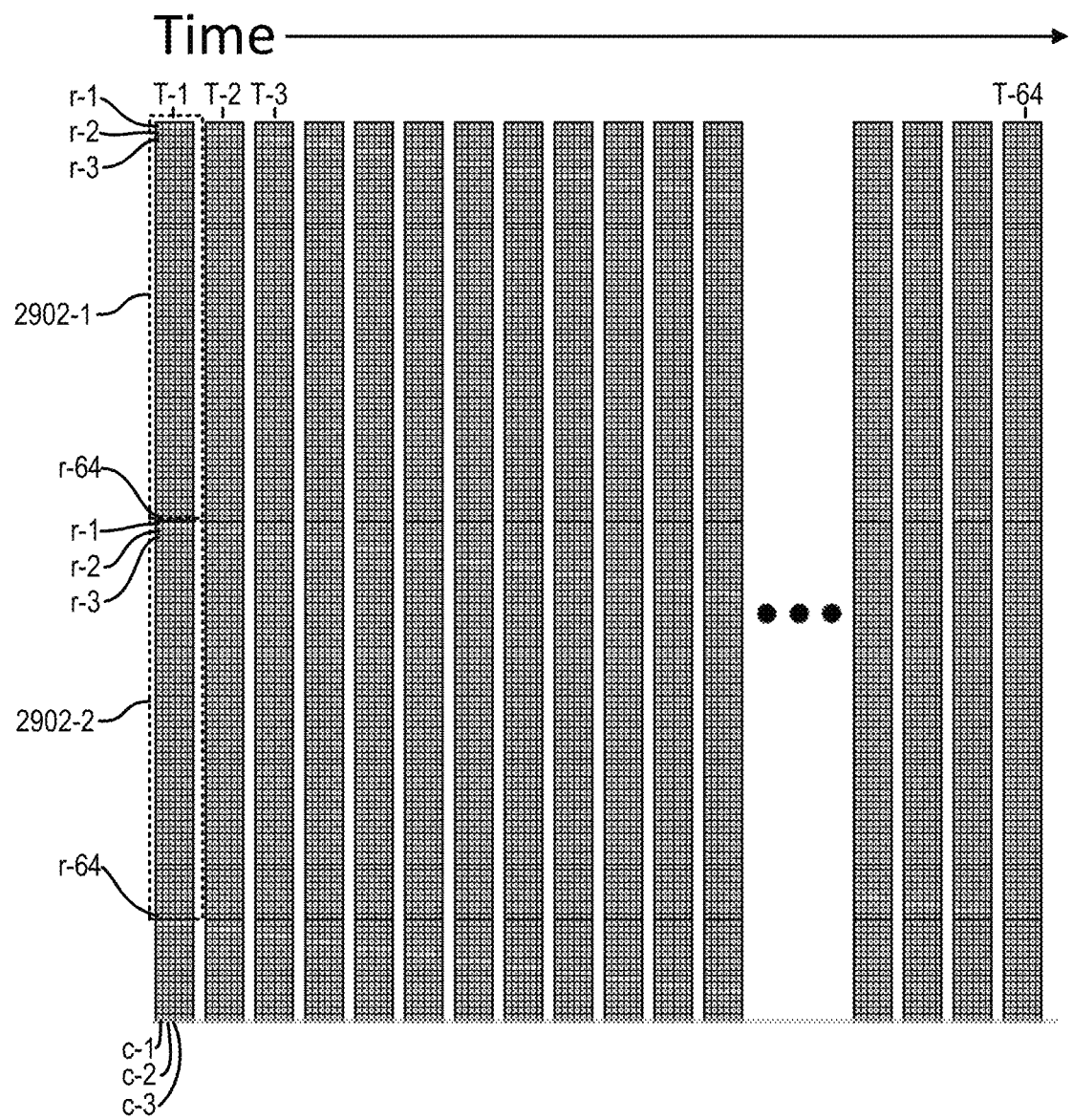
FIG. 29 illustrates an example of an array divided into tiles.

FIG. 29 illustrates an example of an array of LEDs divided into tiles 2902 as part of a tiled-rolling shutter. Activation of rows over time for a first tile 2902-1 and a second tile 2902-2 are shown. Though two tiles 2902 are shown, it is to be understood that there can be more than two tiles 2902 in the array of LEDs. For example, if there are 1 million LEDs in an array, and the array is divided into tiles 2902, with each tile having 500 LEDs, then the array would be split into 2000 tiles.

Each tile 2902 comprises a plurality of rows r and a plurality of columns c. There are m number of rows and n number columns in each tile 2902. In the example shown in FIG. 29, m=64 and n=6. It is to be understood that m and n can have different values than shown in FIG. 29. In some embodiments, m is equal to or greater than two, three, four, or five times n. A first row r-1, a second row r-2, a third row r-3, a $64^{th}$ row r-64, a first column c-1, a second column c-2, and a third column c-3 for the first tile 2902-1 and the second tile 2902-2 are labeled in FIG. 29.

A time period is divided into a plurality of time slots T. A number q of time slots T in the time period can be equal to the number m of rows. Each row r is activated once during the time period. In the example shown, there are 64 time slots T. A first time slot T-1, a second time slot T-2, a third time slot T-3, all the way to a $64^{th}$ time slot T-64. Sequential rows are activated in sequential time slots T, so that LEDs in each row can be active once during the time period. For example, during the first time slot T-1, LEDs in the first row r-1 can be activated; during the second time slot T-2, LEDs in the second row r-2 can be activated; during the third time slot T-3, LEDs in the third row r-3 can be activated; all the way to during the $64^{th}$ time slot T-64, LEDs in the $64^{th}$ row r-64 can be activated. When a row is activated, each LED in the row can receive electrical current, individually, for a given duration and/or a given intensity. For example, graphs in FIGS. 20 and 21 show how an LED can be modulated to stay on for a given duration of (e.g., a percentage of) a time slot T. The longer an LED is on during the time slot T, the brighter the LED appears to a viewer. The time period can be short so that the viewer likely does not perceive the LEDs being turning off and on (e.g., the time period can be equal to or less and 15 ms, 1 ms, 500 µs, 100 µs, or 10 µs; and/or the time period can be equal to or greater than 1 µs). Each row r of a tile 2902 can be activated at different times. In some embodiments, the display system may display a frame rate of 120 frames per second and a display tile may contain 64 rows. In some embodiments, the display may have a duty cycle of 50% to account for display and graphics system operation overheads. In some embodiments, the row display time may be approximately 64 microseconds (0.5*1/120*1/64). In some embodiments, during the 64 microsecond row display time, the pixel intensity may be driven by variable analog current. In some embodiments, during the 64 microseconds row display time for the pixel intensity may be digitally modulated. In some embodiment, the pixel may be switched in 2 microsecond increments to enable the creation of 7 bits of gray scale (2 us=64 us/$2^7$). Though the example describes activating rows in sequential order, in some embodiments, rows can be activated out of sequential order. In some embodiments rows r of different columns c could activate at different times. For example, an LED in cell r-1, c-1 could activate during time slot T-1; an LED in cell r-2, c-1 could activate during time slot T-2 and an LED in cell r-1, c-2 could activate during time slot T-2; and an LED in cell r-3, c-1 could activate during time slot T-3, an LED in cell r-2, c-2 could activate during time slot T-3, and an LED in cell r-1, c-3 could activate during time slot T-3; and so on.

Figure 30:
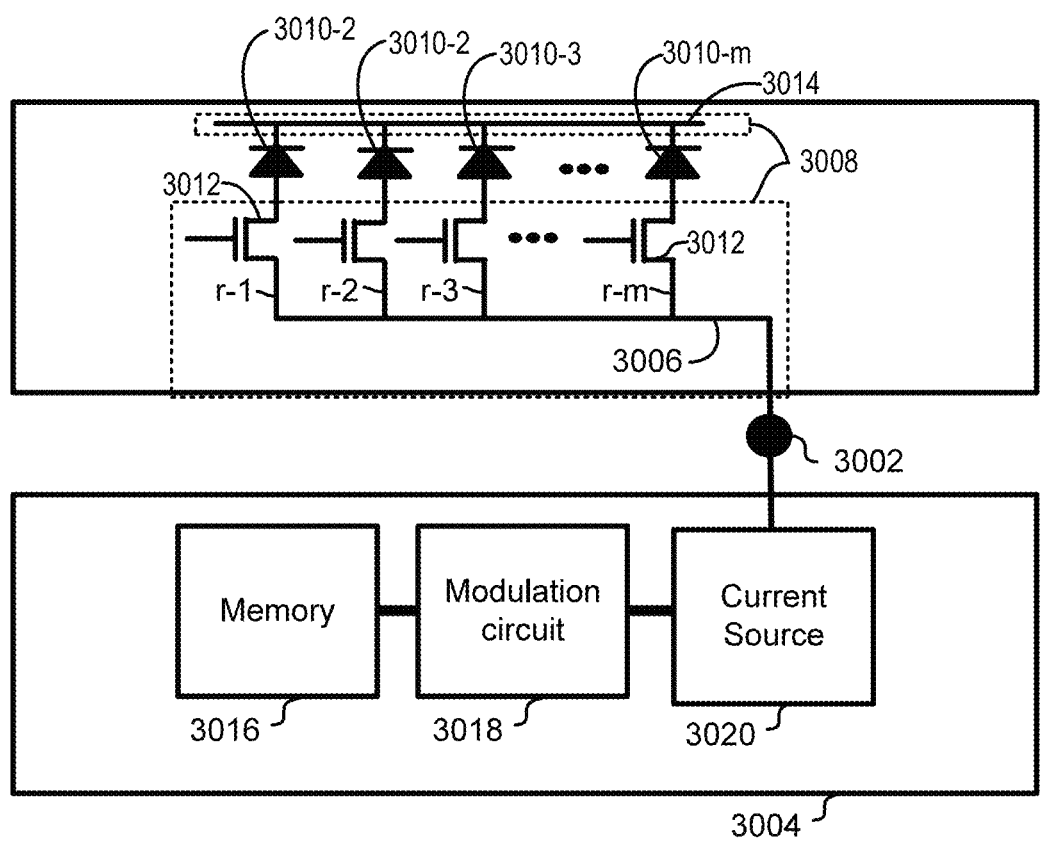
FIG. 30 illustrates an example of a circuit used to apply current to rows in a tile.

FIG. 30 illustrates an example of a simplified circuit that can be used to apply current to LEDs in a column of a tile. FIG. 30 shows a bond 3002 electrically coupling a backplane 3004 with a control line 3006 in a thin-film circuit layer 3008. The control line 3006 provides electrical current to an LED 3010 through a transistor 3012. The control line 3006 can be similar to the dataline 1628 in FIG. 16. The transistors 3012 can be similar to the thin film transistors 1622 in FIG. 16. The bond 3002 can be a metal bond formed from bump 1502 in FIG. 17.

The control line 3006 provides electrical current to LEDs 3010 in a column of a tile. A first LED 3010-1 is in a first row r-1, a second LED 3010-2 is in a second row r-2, a third LED 3010-3 is in a third row r-3, and so on until an m-th LED 3010-m is in an m-th row r-m. The transistors 3012 sequentially activate (e.g., roll) to allow a signal from the control line 3006 to transmit to an LED 3010. A cathode 3014 provides a return path for current flowing through LEDs 3010. The cathode 3014 can be a common cathode (e.g., connected to the plurality of LEDs 3010 in one column of a tile and/or connected to LEDs in multiple columns and/or tiles).

The backplane 3004, in this example, can comprise memory 3016, a modulation circuit 3018, and a current source 3020. The example in FIG. 30 is similar to device 2702-B in FIG. 27 as far as functionality split between the thin-film circuit layer and the backplane. If the memory 3016 and the modulation circuit 3018 were in the thin-film circuit layer 3008, then such a configuration would be similar to device 2702-C in FIG. 27.

By having one control line 3006 coupled with multiple LEDs 3010, a number of bonds 3002 between the backplane 3004 and the LEDs 3010 can be reduced compared to having one control line 3006 per LED 3010.

If the number n of columns in a tile, were to equal 8, then there would by 8 bonds 3002 and 8 times m LEDs 3010 per tile. There would also be 8 modulation circuits 3018 and 8 memories 3016 per tile. In some embodiments, an array of LEDs can be divided into 512, 1000, 2048, 2542, or other numbers of tiles.

Figure 31:
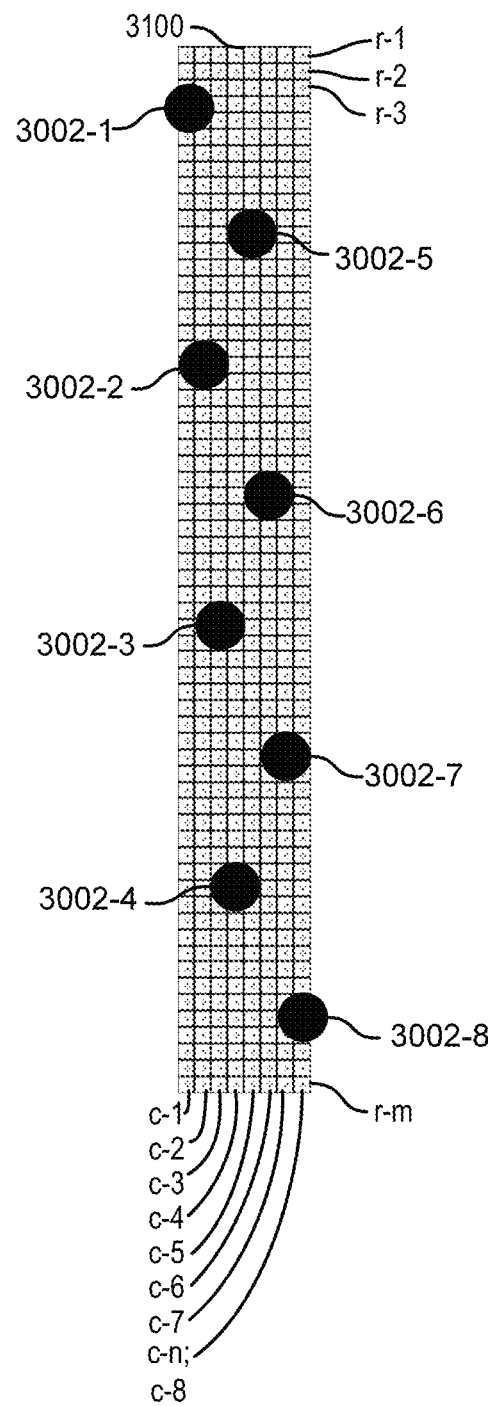
FIG. 31 illustrates an example of bump locations for a tile.

FIG. 31 illustrates an example of a tile 3100 with bonding sites for bonds 3002. Tile 3100 can be similar to tile 2902. Tile 3100 has m number of rows and n number of columns. Tile 3100 has eight columns (n=8). One LED is in each cell of the rows and columns. The tile 3100 shows a subset of an array of LEDs. The array of LEDs occupy a footprint, and the bonds 3002 are dispersed over the footprint. Though the bonds 3002 appear to be over the array of LEDs, the bonds 3002 are between the array of LEDs and a backplane; FIG. 31 shows a juxtaposition of bonding sites to the array of LEDs. The LEDs in tile 3100 of FIG. 31 have a pitch of 1.8 µm, but other pitches of LEDs can be used. Rows 1-64 have a combined width of 115.2 µm, and the columns have a combined width of 14.4 µm. Other dimensions can be used.

While bonding two wafers together using solder as a bonding material, the solder is heated. If the two wafers have substrates with different coefficients of thermal expansion (CTE), the two wafers can expand at different rates leading to "walk-off" of contacts (i.e., bonding sites or pads, such as pad 1630 in FIG. 16), so that contacts for the bonds 3002 do not align. Higher bonding temperatures lead to higher walk-off and greater misalignment. For example, a backplane can be made using a silicon substrate, and LEDs can be made of III-V material, such as GaAs. The thin-film circuit layer is applied to the GaAs (e.g., GaAs of the LEDs acts as a substrate for the thin-film circuit layer). Silicon and GaAs have different CTEs. Bonding sites in the backplane will shift compared to bonding sites in the thin-film circuit layer as the silicon and GaAs are heated to melt the solder to form the bond. The higher the temperature used in bonding, the greater the shift of bonding sites in the backplane compared to bonding sites in the thin-film circuit layer.

To reduce walk-off, larger bonding sites and/or lower temperatures for bonding can be used. Also, etching through one substrate (e.g., etching the substrate of the thin-film circuit layer using a dry and/or deep etch; etching through the GaAs) to form chiplets can allow bonding sites in the thin-film circuit layer to move. Instead of wafer to wafer bonding, die to wafer or die to die bonding can be used. For example LEDs on the GaAs wafer could be divided into smaller arrays on chiplets, with each chiplet having both n and p contacts. Using smaller arrays could also allow for reworking defective portions of a display.

Small pitch of bonding sites can also lead to difficulty with applying an underfill. Applying an underfill can have several benefits, including providing extra rigidity, helping with heat transfer, and/or reducing stress on bonds. If bonding sites are too close together, it can be challenging to get underfill material to flow between bonding sites (e.g., because the underfill is too viscous and/or sizes of particles are too large). By not having underfill material flow between bonding sites, the effectiveness of the underfill can be reduced. Certain materials have been found to be adequate for use with pitch of bonding sites down to 40 microns (e.g., U8410-302LF1 and XS8410-302SNSB from Namics). Certain materials have been found to be adequate for use with pitch of bonding sites down to 20 microns (e.g., U8410-302F from Namics). An alternate approach can be to use a pre-applied underfilm material, which can a viscous material that can be spin-coated or a film that can be laminated, on the backplane and/or the thin-film circuit layer prior to bonding the backplane to the thin-film circuit layer.

FIG. 31 shows that bonding sites for bonds 3002 can be larger by implementing the tiled-roller multiplexor than if one control line (e.g., control line 3006 in FIG. 30) was to be bonded per LED. The tile 3100 in FIG. 31 shows a tile with 64 rows and 8 columns. There are eight bonds 3002, one bond 3002 and one corresponding control line for each column. There is a first bond 3002-1 to connect to a control line of the first column c-1; a second bond 3002-2 to connect to a control line of the second column c-2; a third bond 3002-3 to connect to a control line of the third column c-3; a fourth bond 3002-4 to connect to a control line of the fourth column c-4; a fifth bond 3002-5 to connect to a control line of the fifth column c-5; a sixth bond 3002-6 to connect to a control line of the sixth column c-6; a seventh bond 3002-7 to connect to a control line of the seventh column c-7; and an eighth bond 3002-8 to connect to a control line of the eighth column c-8. Spacing between bonds 3002 is greater than if there was one bond 3002 per LED. The bond 3002 can also be larger than if there was one bond 3002 per LED. Accordingly, bumps can be spread out with larger separations than a pitch of LEDs in an array.

In some embodiments, small pitch (distance between bonds 3002) can be equal to or less than 60, 50, 40, 30, 20, 15, or 10 μm and/or equal to or greater than 1 μm. The smaller the pitch, the lower the temperature needed for bonding to reduce walk-off caused by CTE mismatch of substrates. In some embodiments, bonding temperature is not higher than 300 degrees Celsius to reduce walk-off. Sometimes bonding temperature can be equal to or less than 300, 250, 200, 150, 100, 80, or 75 degrees Celsius, depending on the pitch of the bonds 3002. For example, nanoporous gold compression bonding can be targeted for a bonding temperature of 75 degrees Celsius, which can result in low to no stress caused by CTE mismatch of materials.

As bonding temperature is reduced, material selection of bumps can become challenging. The melting point for bump material is equal to or less than the bonding temperature, if using solder as a bonding material, so that the bumps melt and form bonds. The melting point of the bump material is also greater than an operating temperature of the device (e.g., so that solder does not re-liquefy during operation of the device). Accordingly, solder bumps (e.g., bumps 1502 in FIG. 17) are configured to have a melting point equal to or less than the bonding temperature. In some embodiments, nanoporous gold or nanoporous copper is used at bonding temperatures equal to or less than 250, 200, 150, 100, or 75 degrees Celsius. Nanoporous gold has a bonding temperature in the order of 150 degrees or lower. The bonding temperature can be partially dependent on a bonding pressure and/or bonding time used. In some embodiments, copper is used instead of gold because copper is less expensive than gold; using copper reduces a risk of silver migration that can be present in using gold; and/or copper has less potential to contaminate silicon, which makes copper preferable over gold in back-end processing. Nanoporous copper is expected to have a bonding temperature similar to nanoporous gold (e.g., 150 degrees or lower). Some other melting points of materials used as solder bumps, with melting point in degrees Celsius, include: Indium (180°); copper (200°); indium-silver (200°); copper-tin (250°); gold-tin (280°); and gold (290°). Bumps (before they turn into bonds 3002) can be spherical, cylindrical, coned, or other shape; made of a eutectic material or a simple metal (e.g., Au or Cu); solid or nanoporous; and/or thermally activated using global heating (e.g., using a bond tool or an oven) and/or thermally activated using localized heating (e.g., using a laser to generate the bonding temperature).

Figure 32:
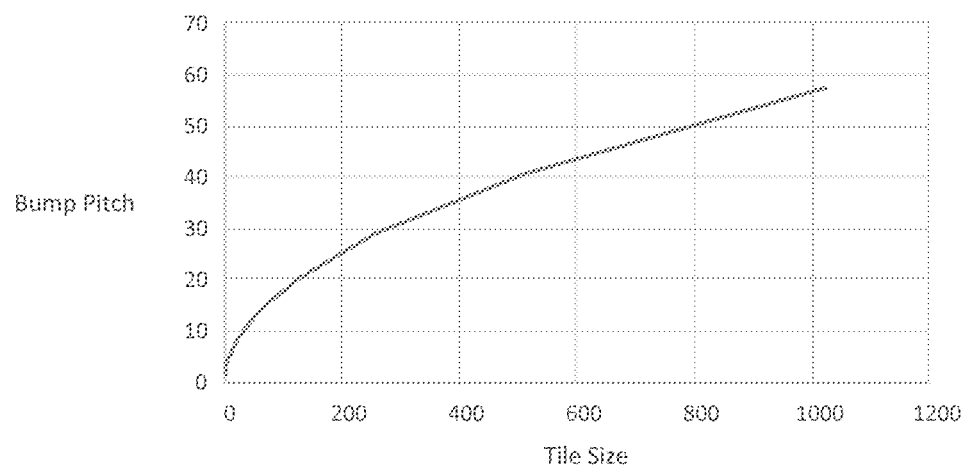
FIG. 32 is an example chart comparing tile size to bump pitch.

FIG. 32 is an example chart comparing tile size (in FIG. 32, tile size is reported as a number of rows in a tile because a number of columns far exceeds the number of rows) to bump pitch. As tile size increases, bump pitch can increase because there are less bumps used to transmit control signals from the backplane to the LEDs. For example, if tile size is 1, then bump pitch would be the size of the pitch of the LEDs (e.g., 1.8 μm in FIG. 31). If tile size is 16, then bump pitch can be 7.2 μm. If tile size is 64, then bump pitch can be 14.4 μm, and so on. An array of LEDs can comprise a count of LEDs, a plurality of metal bonds correspond to a count of metal bonds, and the count of metal bonds is at least one, two, or three orders of magnitude less than the count of LEDs in the array. There is a tradeoff between complexity of the thin-film circuit layer and pitch of bonds. For example, pitch of bonds of device 2702-C in FIG. 27 may be larger than pitch of bonds in device 2702-B in FIG. 27, yet forming the thin-film circuit layer in device 2702-C may be more complex and/or produce slower circuits than device 2702-B because materials used in the thin-film circuit layer might not be as effective as materials used in the backplane.

Figure 33:
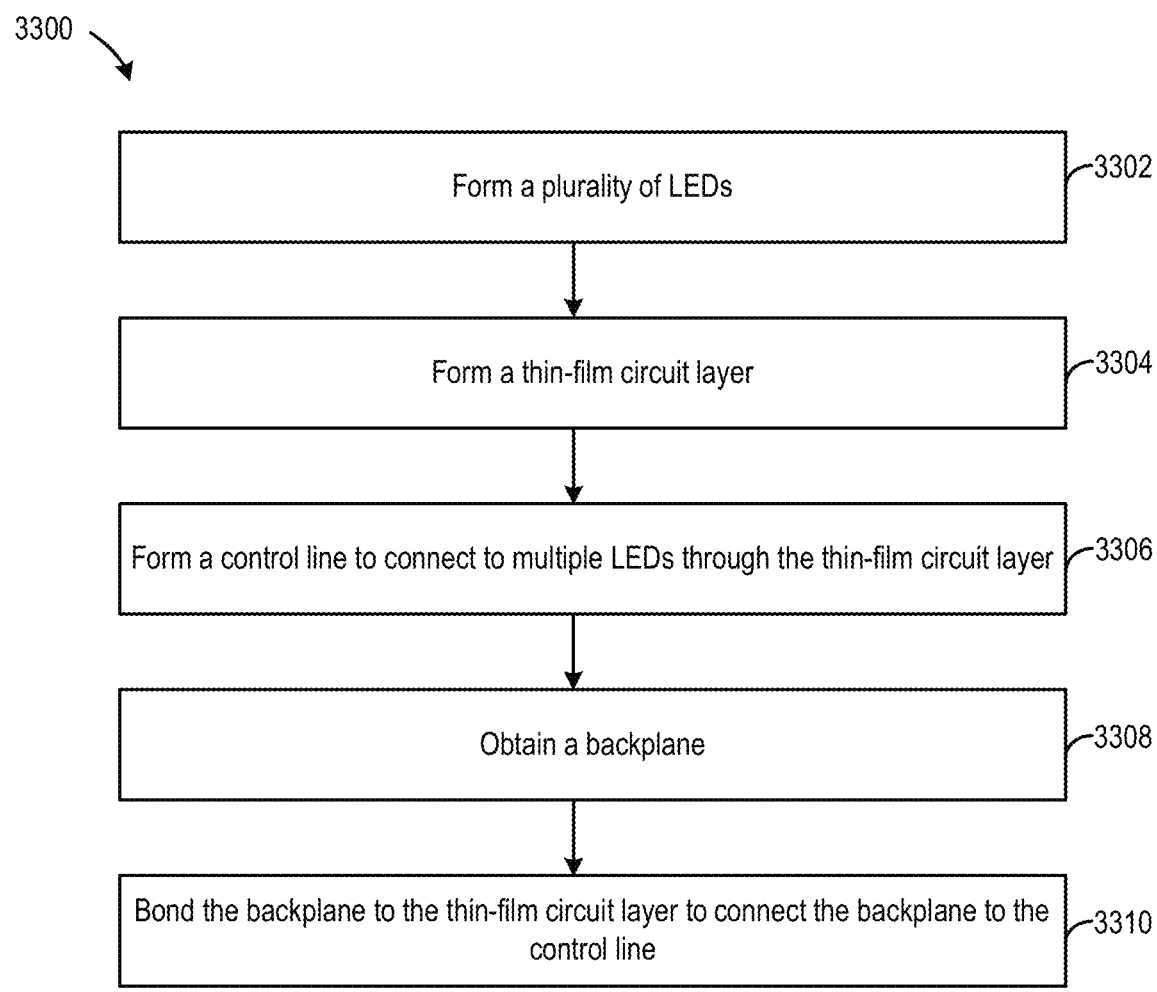
FIG. 33 is a flowchart of an embodiment of a process of fabricating an LED display.

FIG. 33 is a flowchart of an embodiment of a process 3300 of fabricating an LED display. Process 3300 begins in step 3302 with forming a plurality of LEDs. In some embodiments, a number of the plurality of LEDs can be equal to or greater than 4, 8, 16, 32, 64, and 128, and/or equal to or less than 64 or 128 (e.g., the plurality of LEDs can equal a number m of rows r in tile 2902 of FIG. 29). In some embodiments, a number of the plurality of LEDs can be equal to or greater than 307,200, 921,600, or 2,073,600. The plurality of LEDs can be formed of a crystalline semiconductor structure (e.g., epitaxial layers of III-V, such as GaAs or InP). LEDs 3010-1 through 3010-$m$ are an example of a plurality of LEDs.

In step 3304, a thin-film circuit layer comprising a plurality of transistors electrically coupled with the plurality of LEDs is formed. For example, thin-film circuit layer 3008 having transistors 3012 in FIG. 30 are formed. The transistors are electrically coupled with the plurality of LEDs. The plurality of transistors are configured to control operation of the plurality of LEDs. For example, transistors 3012 control when current is applied to LEDs 3010. In some embodiments, the thin-film circuit layer is not lattice matched to the crystalline semiconductor structure of the plurality of LEDs. For example, the thin-film circuit layer can comprise a semiconductor material having an amorphous or polycrystalline structure instead of a single crystal structure.

In step 3306, a control line is formed to electrically connect the plurality of transistors with a first pad (e.g., pad 1630 in FIG. 16). For example, the control line 3006 in FIG. 30 is configured to control 8, 16, 32, 64, 128, or 256 pixels; the number of pixels does not need to be a power of two, so other numbers like 33 or 100 pixels are possible. The control line can be formed in, and/or be part of, the thin-film circuit layer. In some embodiments, the control line can be made of copper, copper alloy, aluminum, and/or tungsten; in other embodiments, other materials can be used. In some embodiments, the control line is a common signal line (e.g., control line 3006 or a data line). A common signal line can be used to transmit a global signal. A common signal line can be connected to all or some pixels in a row. For example, one common signal line can be coupled with transistors controlling operation of all pixels in a row, wherein there are 440, 1600, 1920 or 2560 pixels in the row; or a common signal line can be coupled with transistors controlling operation of one half the pixels in a row (e.g., 720, 800, 960, or 1280 pixels).

A backplane (e.g., backplane 3004) is obtained, step 3308. The backplane can comprise drive circuitry (e.g., memory 3016 and/or modulation circuits 3018 from FIG. 30; and/or address drivers 1802, dataline/bitline drivers 1804, control/timing drivers 1806, control logic 1808, and/or voltage supply regulators 1810 from FIG. 18). The backplane comprises a second pad (e.g., bump 1502 is shown contacting a first pad and a second pad in FIG. 17). As used herein, the backplane may refer to circuits formed on a logic die separate from the μLED epitaxial wafer.

The first pad is bonded to the second pad in step 3310 (e.g., forming bond 3002 in FIG. 30). Bonding can include heating a solder (e.g., bump 1502 in FIG. 17) to melt the solder. Heating the solder can include heating the solder to no more than 300, 250, 200, 175, or 150 degrees Celsius. In some embodiments heating the solder is no less than 50, 75, or 100 degrees Celsius.

The bond electrically couples the first pad with the second pad so that a controller (e.g., address drivers 1802, dataline/bitline drivers 1804, control/timing drivers 1806, control logic 1808, and/or voltage supply regulators 1810 from FIG. 18) in the backplane is electrically coupled with the control line. In some embodiments, the method further includes forming a common cathode (e.g., cathode 3014 in FIG. 30) to connect to the plurality of LEDs.

Figure 67:
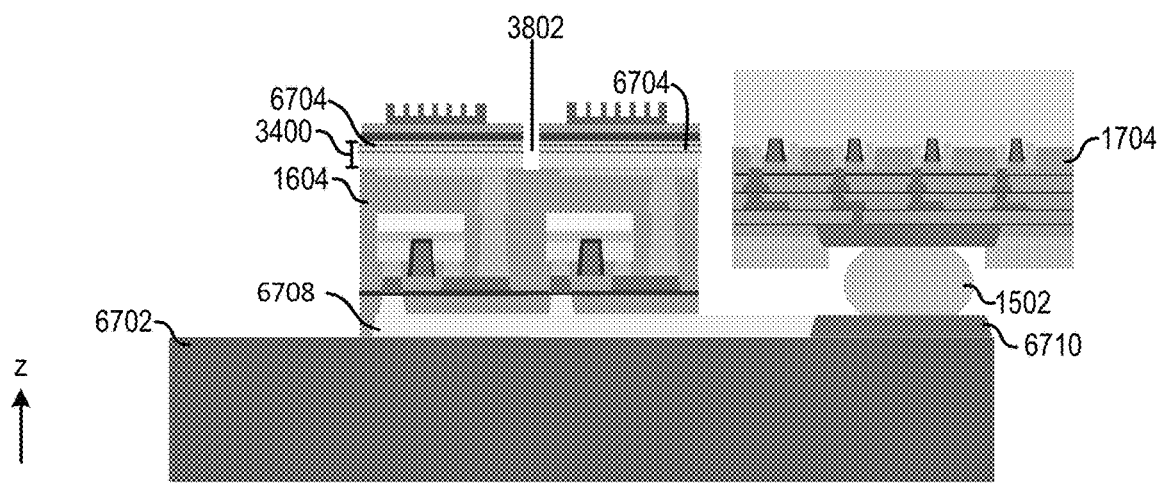
FIG. 67 is a simplified cross section of an embodiment of an epitaxial structure bonded to a transparent substrate.
Figure 68:
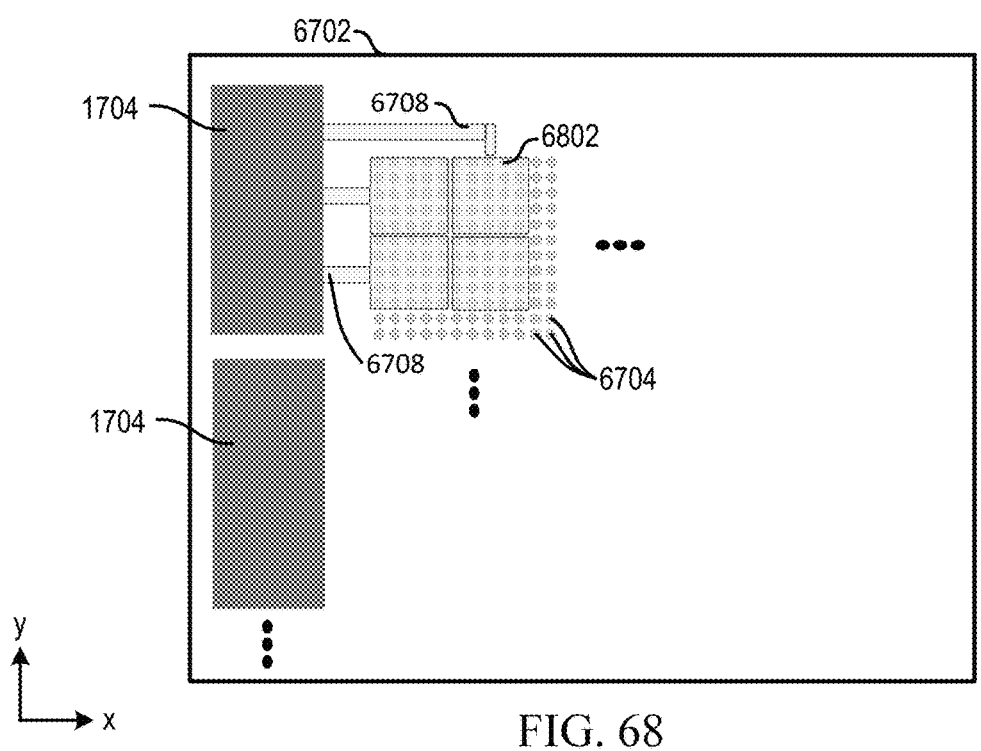
FIG. 68 is a simplified illustration of traces to an LED array bonded to a transparent substrate.

Various processes can be used to form an epitaxial structure with a thin-film circuit layer and a backplane. The epitaxial structure is used to form an array of LEDs. The backplane can be vertically integrated or horizontally integrated with the epitaxial structure and the thin-film circuit layer. FIGS. 34-54 and 55-64 provide examples of vertical integration. FIGS. 67 and 68 provide examples of horizontal integration. If the backplane uses a silicon substrate, vertical integration can be used for non-transparent displays because the silicon substrate can be nontransparent and behind the array of LEDs. Thus a user cannot see beyond the array of LEDs. Horizontal integration can be used for a transparent display. In horizontal integration, the backplane is to a side of an array of LEDs. The epitaxial structure and the thin-film circuit layer, which can be transparent to a user, can be bonded to a transparent substrate. Transparent traces (e.g., using indium-tin oxide) can be used to connect the backplane to the thin-film circuit layer. Thus horizontal integration can be used for a transparent display to allow a user to see beyond the array of LEDs.

The epitaxial layer can be singulated in various ways to isolate portions of the epitaxial structure for forming individual LEDs. For example, etching can be used to form mesas. FIGS. 34-54 provide examples of etched mesas. Ion implantation can also be used to form planar LEDs. FIGS. 55-65 provide examples of planer LEDs. Other isolation processes can also be used.

Figure 34:
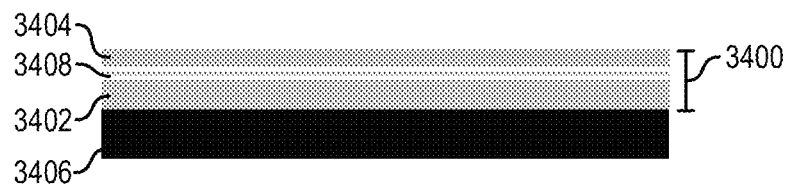
FIG. 34 is a simplified cross section of an embodiment of an epitaxial structure.

Referring next to FIGS. 34-53, simplified cross sections are shown of processing steps for embodiments of etching an epitaxial structure to singulate the epitaxial structure for forming LEDs in the epitaxial structure. FIG. 34 is a simplified cross section of an embodiment of an epitaxial structure 3400. The epitaxial structure 3400 comprises a first doped semiconductor layer 3402 and a second doped semiconductor layer 3404. The first doped semiconductor layer 3402 and the second doped semiconductor layer 3404 are on a substrate 3406. In some embodiments, the substrate 3406 is part of the epitaxial structure 3400. The first doped semiconductor layer 3402 and the second doped semiconductor layer 3404 can be grown (e.g., epitaxially grown) on the substrate (e.g., lattice matched to the substrate 3406). In some embodiments, the substrate is a III-V binary compound (e.g., GaAs, GaP) and the first doped semiconductor layer 3402 and the second doped semiconductor layer 3404 are binary, ternary, or quaternary compounds (e.g., InGaAs, InGaAsP).

The epitaxial structure 3400 can also contain a light-emitting layer 3408 between the first doped semiconductor layer 3402 and the second doped semiconductor layer 3404. The light-emitting layer 3408 can be an interface of the first doped semiconductor layer 3402 and the second doped semiconductor layer 3404, or the light-emitting layer 3408 can contain separate material than the first doped semiconductor layer 3402 and the second doped semiconductor layer 3404 (e.g., layers of material to form a multi-quantum well (MQW)).

In the embodiment shown in FIG. 34, the first doped semiconductor layer 3402 is n-doped (e.g., less electrons (excess holes) in a crystal lattice), and the second doped semiconductor layer 3404 is p-doped (e.g., excess electrons in a crystal lattice). Though in other embodiments, the first doped semiconductor layer 3402 can be p-doped, and/or the second doped semiconductor layer 3404 can be n-doped.

Figure 35:
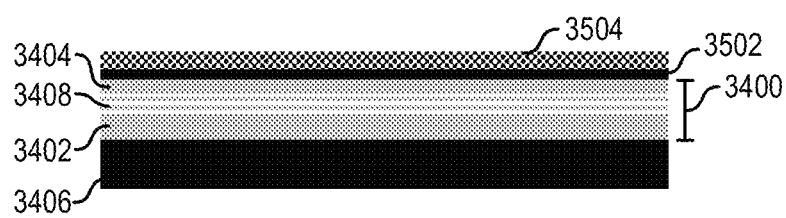
FIG. 35 is a simplified cross section of an embodiment of the epitaxial structure with a contact layer and a temporary bonding layer deposited on the epitaxial structure.

FIG. 35 is a simplified cross section of an embodiment of the epitaxial structure 3400 with a contact layer 3502 and a temporary bonding layer 3504 deposited on the epitaxial structure 3400. The contact layer 3502 is a p-contact. The contact layer 3502 can be a conductive material, such as a metal. The contact layer 3502 can be deposited by lithographic techniques. The contact layer 3502 can be used to form a p-contact for each LED in an array of LEDs. In some embodiments, the contact layer 3502 can be used to form the common cathode 3014 in FIG. 30. The contact layer 3502 is deposited on top of the second doped semiconductor layer (the p-doped layer). In some embodiments, the contact layer 3502 can be electrically coupled with a ground plane in the thin-film circuit layer by one or more vertical vias. In some embodiments, the epitaxial structure 3400 and/or the contact layer 3502 can be part of the device layer 1602 in FIG. 16.

The temporary bonding layer 3504 can be an adhesive (e.g., applied by spin coating) for securing a temporary carrier to the epitaxial structure 3400. The temporary bonding layer 3504 is applied on top of the contact layer 3502.

Figure 36:
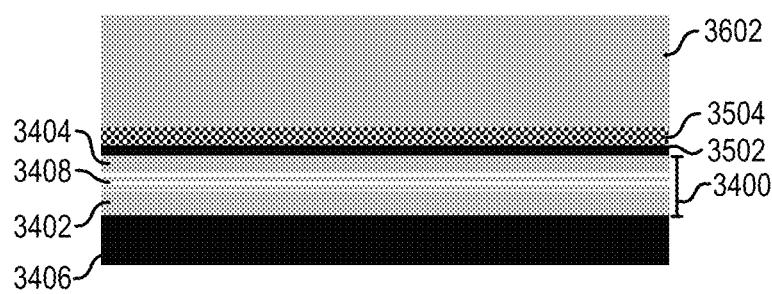
FIG. 36 is a simplified cross section of an embodiment of the epitaxial structure with a temporary carrier bonded to the epitaxial structure.

FIG. 36 is a simplified cross section of an embodiment of the epitaxial structure 3400 with a temporary carrier 3602 secured to the epitaxial structure 3400. The temporary carrier 3602 is secured to the epitaxial structure 3400 by the temporary bonding layer 3504. The temporary carrier 3602 is attached to a p-side of the epitaxial structure 3400 (e.g., the second doped semiconductor layer 3404, which is p-doped, is closer to the temporary carrier 3602 than the first doped semiconductor layer 3402, which is n-doped).

Figure 37:
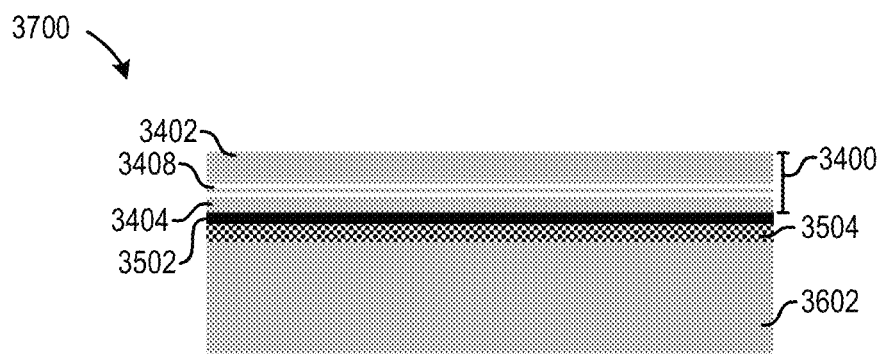
FIG. 37 is a simplified cross section of an embodiment of the epitaxial structure with a substrate removed from the epitaxial structure.

FIG. 37 is a simplified cross section of an embodiment of the epitaxial structure 3400 with the substrate (e.g., substrate 3406 in FIG. 36) removed from the epitaxial structure 3400. After the substrate is removed, the epitaxial structure is planarized (e.g., by a chemical mechanical planarization (CMP)). The first doped semiconductor layer 3402, which is n-doped, is exposed and planarized.

The structure in FIG. 37 is sometimes referred to as an intermediate structure 3700. The intermediate structure 3700 can be used in various etching configurations. For example, the intermediate structure can be used for a process that etches the epitaxial structure 3400 before applying a thin-film circuit layer to the epitaxial structure 3400 (e.g., described in FIGS. 38-42); a process that etches the epitaxial structure 3400 after bonding the epitaxial structure 3400 to a backplane (e.g., described in FIGS. 43-47); and a process that etches the epitaxial structure 3400 between depositing layers of a thin-film circuit layer to the epitaxial structure 3400 (e.g., described in FIGS. 48-53).

Figure 38:
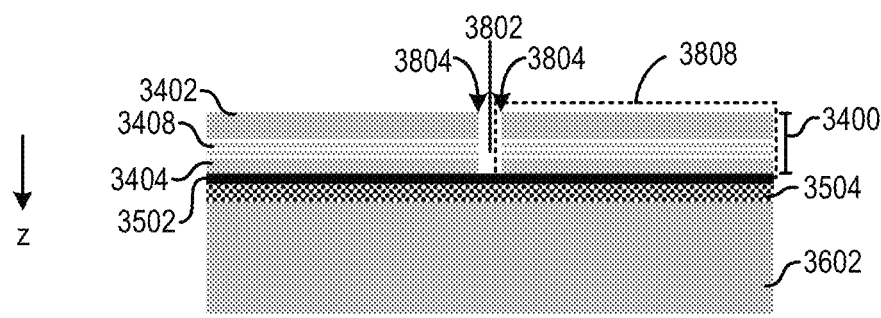
FIG. 38 is a simplified cross section of an embodiment of the epitaxial structure etched to singulate the epitaxial structure.

FIGS. 38-42 depict simplified cross sections of a process that etches the epitaxial structure 3400 before applying a thin-film circuit layer to the epitaxial structure 3400. FIG. 38 is a simplified cross section of an embodiment of the epitaxial structure 3400 etched to singulate the epitaxial structure. In FIG. 38, a trench 3802 is formed by etching the epitaxial structure 3400. The trench 3802 is defined by walls 3804. The trench 3802 can be formed by etching the first doped semiconductor layer 3402, the light-emitting layer 3408, the second doped semiconductor layer 3404, the contact layer 3502, and/or the temporary bonding layer 3504. In some embodiments, the contact layer 3502 or the temporary bonding layer 3504 can be used as an etch stop.

The epitaxial structure 3400 is etched from a side of the first doped semiconductor layer 3402 (e.g., n-side) to form a plurality of mesas 3808. The temporary carrier 3602 can serve as a "handle" to which the plurality of mesas 3808 (the epitaxial structure 3400) is affixed.

The trench 3802, in an x/y plane (e.g., looking in a z direction), can form a grid creating an array of mesas 3808. The grid can be formed by various shapes, such that mesas 3808 of the plurality of mesas 3808 can have a shape in the x/y plane of rectangular, circular, square, triangular, or other shape.

Figure 39:
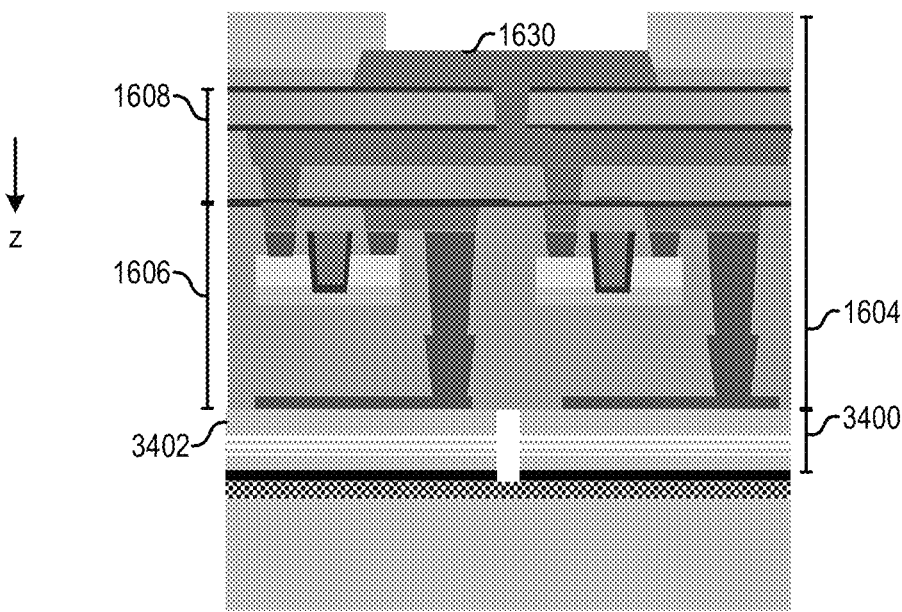
FIG. 39 is a simplified cross section of an embodiment of a thin-film circuit layer deposited on the epitaxial structure.

FIG. 39 is a simplified cross section of an embodiment of a thin-film circuit layer 1604 deposited on the epitaxial structure 3400. The thin-film circuit layer 1604 comprises a transistor layer 1606 and an interconnect layer 1608. The transistor layer 1606 is formed on an exposed surface of the first doped semiconductor layer 3402 (e.g., n-type). The transistor layer 1606 can include thin-film transistor semiconductor material (e.g., the transistor layer 1606 may comprise indium gallium zinc oxide (IGZO)). The transistor layer 1606 can be referred to as a first thin-film layer of the thin-film circuit layer 1604.

The interconnect layer 1608 is formed on top of the transistor layer 1606. The interconnect layer 1608 can be referred to as a second thin-film layer of the thin-film circuit layer 1604. Pads 1630 can also be formed for bonding to metal bumps.

In FIG. 40, a backplane 1704 is bonded to the thin-film circuit layer 1604 using bumps 1502. The backplane 1704 can comprise driver circuitry. The epitaxial structure 3400, the thin-film circuit layer 1604, and the backplane 1704 are arranged vertically (e.g., a stacked structure). FIG. 40 shows the temporary carrier 3602 extending above (in the z direction) the epitaxial structure 3400.

FIG. 41 is a simplified cross section of an embodiment of the temporary carrier (e.g. temporary carrier 3602 in FIG. 40) removed after bonding the backplane 1704 to the thin-film circuit layer 1604. In some embodiments, the temporary carrier and/or the temporary bonding layer are removed by a solvent (e.g., a solvent that dissolves the temporary bonding layer). Removing the temporary carrier exposes the second doped semiconductor layer 3404 and/or the contact layer 3502

FIG. 42 is a simplified cross section of an embodiment of adding optical elements 4202 to the epitaxial structure 3400. The optical elements 4202 can be used to more efficiently extract light from the epitaxial structure 3400. For example, the optical elements 4202 can be diffraction gratings. Though the optical elements 4202 are shown in FIG. 42 to resemble diffraction gratings, optical elements 4202 could be other optical features, such as lenses.

Figure 43:
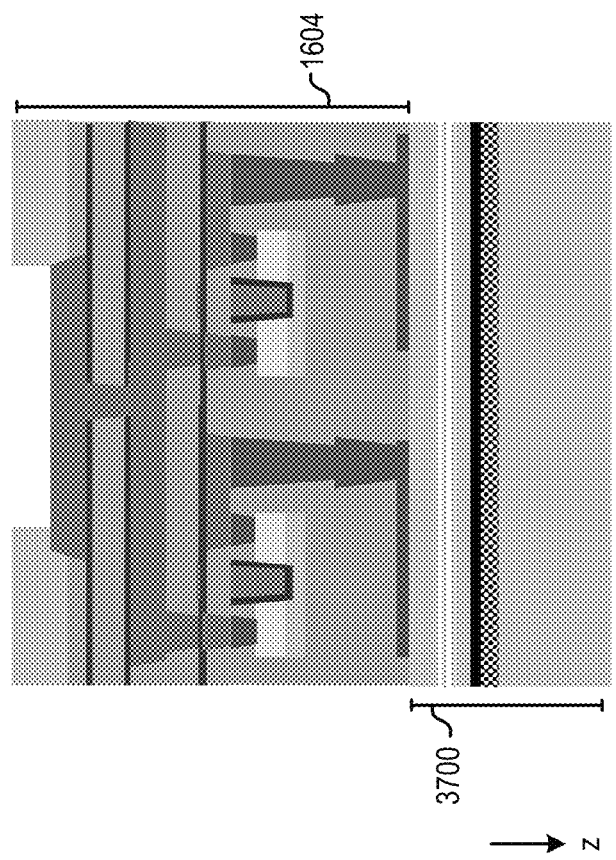
FIG. 43 is a simplified cross section of an embodiment of depositing a thin-film circuit layer to the epitaxial structure before etching the epitaxial structure.

FIGS. 43-47 depict simplified cross sections of an embodiment of a process of etching the epitaxial structure after bonding the epitaxial structure to a backplane. FIG. 43 is a simplified cross section of an embodiment of the thin-film circuit layer 1604 deposited on the intermediate structure 3700. FIG. 43 is similar to FIG. 39, except the trench 3802 in FIG. 38 has not been formed before depositing the thin-film circuit layer 1604 on the intermediate structure 3700 in FIG. 43.

Figure 44:
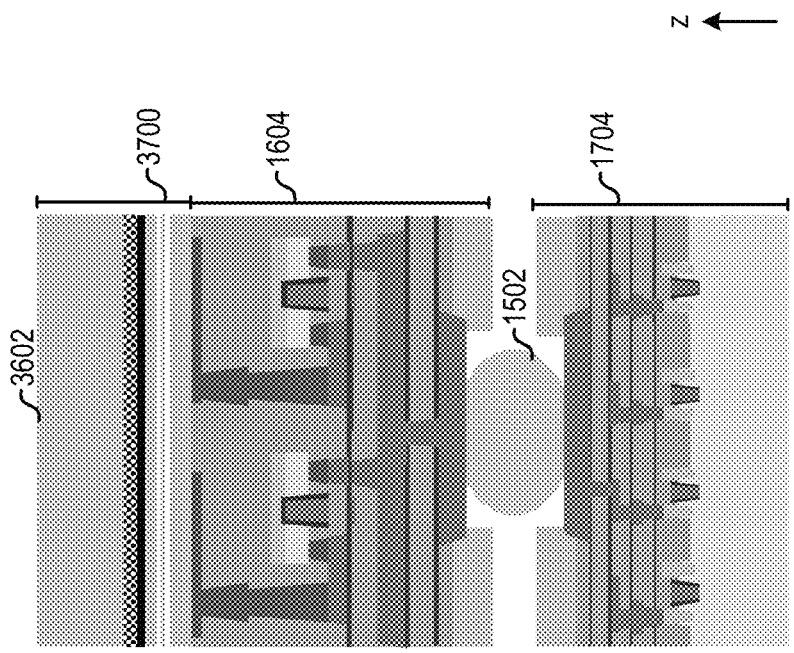
FIG. 44 is a simplified cross section of an embodiment of bonding the thin-film circuit layer to a backplane.

FIG. 44 is a simplified cross section of an embodiment of bonding the thin-film circuit layer 1604 to the backplane 1704. Bumps 1502 are used to bond the thin-film circuit layer 1604 to the backplane 1704 and/or to provide electrical connections from the backplane 1704 to the thin-film circuit layer 1604. The temporary carrier 3602 can be used as a handle while bonding. The thin-film circuit layer 1604 is between the intermediate structure 3700 and the backplane 1704.

FIG. 45 is a simplified cross section of an embodiment of the temporary carrier (e.g., temporary carrier 3602 in FIG. 44) removed after bonding the thin-film circuit layer 1604 to the backplane 1704. In FIG. 46, a simplified cross section of an embodiment of a trench 3802 etched in the epitaxial structure 3400 is shown. The trench 3802 is etched in the epitaxial structure 3400 after removing the temporary carrier and/or after bonding the backplane 1704 to the thin-film circuit layer 1604. FIG. 47 is a simplified cross section of an embodiment of adding optical elements 4202 to the epitaxial structure 3400 (e.g., similar to FIG. 42).

Figure 48:
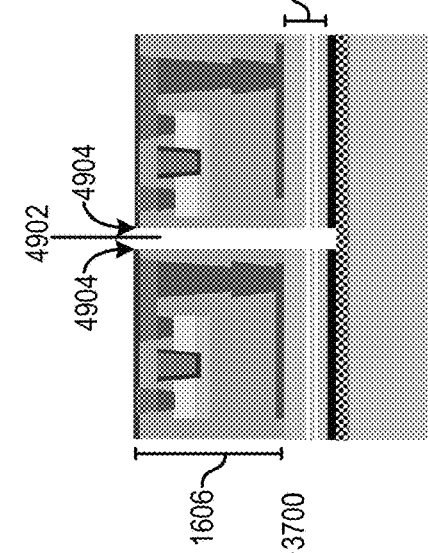
FIG. 48 is a simplified cross section of an embodiment of depositing a first thin-film layer of a thin-film circuit layer to the epitaxial structure.

Referring next to FIGS. 48-53, cross sections an embodiment of a process that etches the epitaxial structure between depositing layers of the thin-film circuit layer to the epitaxial structure are shown. FIG. 48 is a simplified cross section of an embodiment of a transistor layer 1606 deposited on the intermediate structure 3700. The transistor layer 1606 can be referred to as a first thin-film layer of a thin-film circuit layer. The transistor layer 1606 is deposited on the first doped semiconductor layer 3402 (e.g., n-doped).

Figure 49:
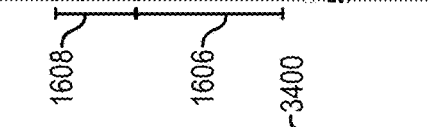
FIG. 49 is a simplified cross section of an embodiment of etching through both the first thin-film layer and the epitaxial structure.

FIG. 49 is a simplified cross section of an embodiment of etching through both the transistor layer 1606 and the epitaxial structure 3400. A trench 4902 is formed in both the transistor layer 1606 and the epitaxial structure. Walls 4904 in the transistor layer 1606 and the epitaxial structure 3400 define sides of the trench 4902. Trench 4902 is similar to trench 3802, except trench 4902 extends though the transistor layer 1606 as well as the epitaxial structure 3400. The trench isolates the epitaxial structure 3400 for forming a plurality of LEDs.

An isolation process that etches through the transistor layer 1606 to etch the epitaxial structure 3400 may have some limitations. For example, the isolation process in FIGS. 48-53 assumes that the transistor layer 1606 is isolated for separate LEDs, which might not be a valid assumption in some embodiments. For example, the transistor layer 1606 may be used to implement circuitry shared by multiple LEDs (e.g., circuitry for performing functions such as multiplexing, modulation, memory, etc.).

Figure 50:
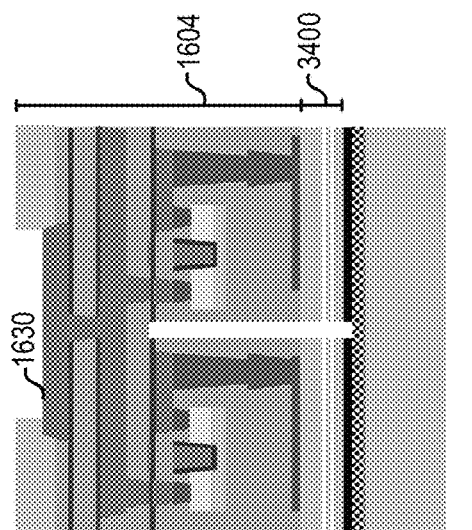
FIG. 50 is a simplified cross section of an embodiment of depositing a second thin-film layer of the thin-film circuit layer to the first thin-film layer after etching both the first thin-film layer and the epitaxial structure.

FIG. 50 is a simplified cross section of an embodiment the interconnect layer 1608 deposited on the transistor layer 1606, after the transistor layer 1606 is etched to isolate the epitaxial structure 3400. The interconnect layer 1608 can be referred to as a second thin-film layer of the thin-film circuit layer 1604.

In FIG. 51, a backplane 1704 is bonded to the thin-film circuit layer 1604 using bumps 1502. The backplane 1704 can comprise driver circuitry. The epitaxial structure 3400, the thin-film circuit layer 1604, and the backplane 1704 are arranged vertically (e.g., a stacked structure). FIG. 51 shows the temporary carrier 3602 extending above (in the z direction) the epitaxial structure 3400.

FIG. 52 is a simplified cross section of an embodiment of the temporary carrier (e.g. temporary carrier 3602 in FIG. 51) removed after bonding the backplane 1704 to the thin-film circuit layer 1604. In some embodiments, the temporary carrier and/or the temporary bonding layer are removed by a solvent (e.g., a solvent that dissolves the temporary bonding layer). Removing the temporary carrier exposes the second doped semiconductor layer 3404 and/or the contact layer 3502

FIG. 53 is a simplified cross section of an embodiment of adding optical elements 4202 to the epitaxial structure 3400. The optical elements 4202 can be used to more efficiently extract light from the epitaxial structure 3400. For example, the optical elements 4202 can be diffraction gratings. Though the optical elements 4202 are shown in FIG. 53 to resemble diffraction gratings, optical elements 4202 could be other optical features, such as lenses.

Figure 54:
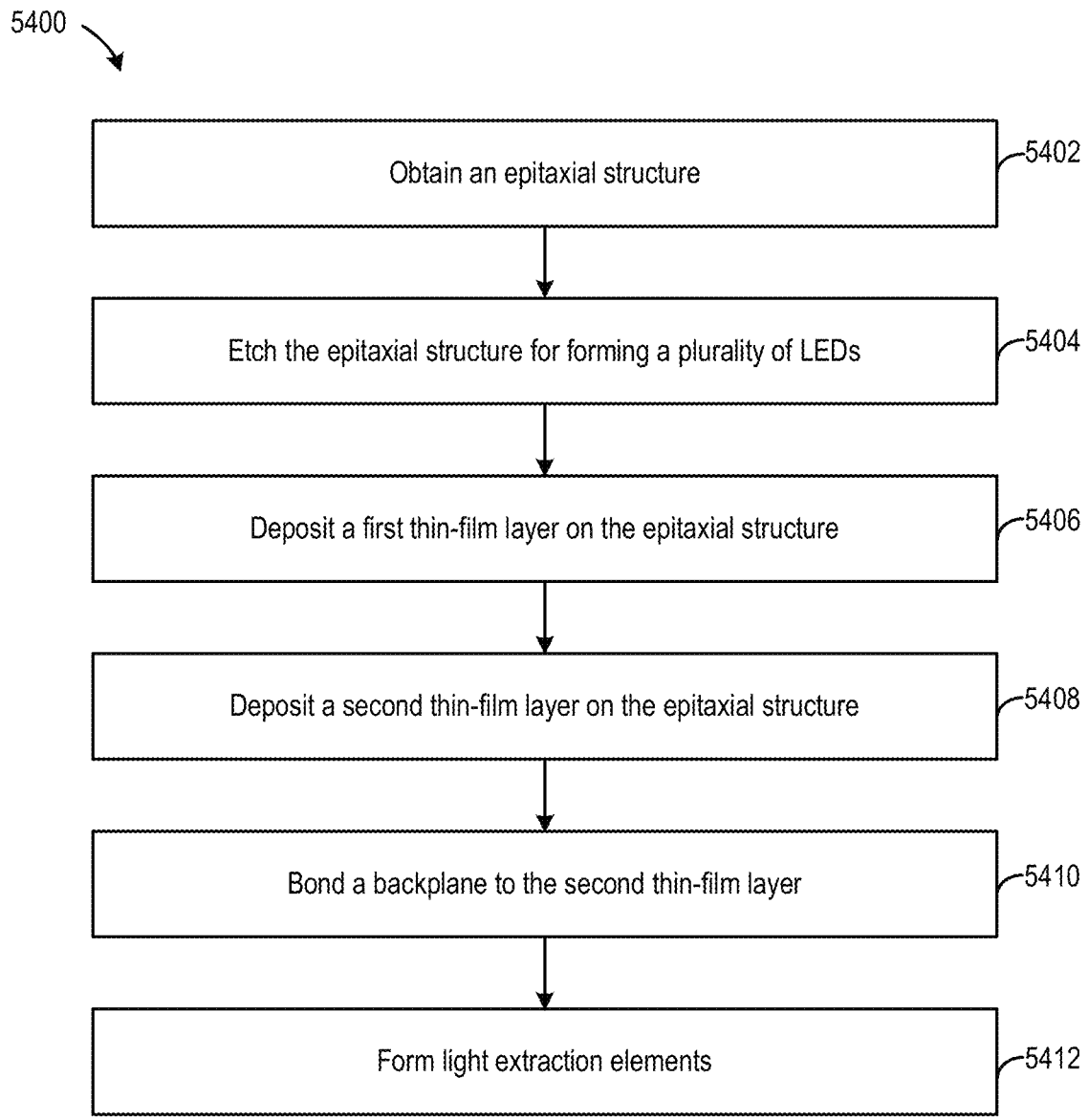
FIG. 54 is a flowchart of an embodiment of a process of etching to isolate portions of the epitaxial structure.

FIG. 54 is a flowchart of an embodiment of a process 5400 of etching to isolate portions of an epitaxial structure. Process 5400 begins in step 5402 with obtaining an epitaxial structure (e.g., epitaxial structure 3400 in FIG. 34). The epitaxial structure can be a layered structure including a first doped semiconductor layer (e.g., the first doped semiconductor layer 3402 in FIG. 32), a second doped semiconductor layer (e.g., the second doped semiconductor layer 3404 in FIG. 32), and/or a light-emitting layer (e.g., the light-emitting layer 3408 in FIG. 32) between the first doped semiconductor layer and the second doped semiconductor layer. In some embodiments, the epitaxial structure is obtained by growing the first doped semiconductor layer, light-emitting layer, and the second doped semiconductor layer on a substrate (e.g., substrate 3406 in FIG. 34).

In step 5404 the epitaxial structure is etched to singulate the epitaxial structure for forming a plurality of LEDs. For example, the epitaxial structures 3400 in FIGS. 38, 46, and 52 are etched to form mesas 3808 (as shown in FIG. 38). Though only two mesas are pictured in FIG. 38, it is to be understood that are many mesas (e.g., one mesa for each light source 1402 in the array 1400 in FIG. 14).

In step 5406 a first thin-film layer is deposited on the epitaxial structure (e.g., the transistor layer 1606 is formed on the epitaxial structure 3400 in FIG. 39). In step 5408 a second thin-film layer is deposited on the epitaxial structure (e.g., the interconnect layer 1608 is formed on the transistor layer 1606 in FIG. 39). In step 5410, the second thin-film layer is bonded to a backplane (e.g., the backplane 1704 is bonded to thin-film circuit layer 1604 by bumps 1502 in FIG. 40). In step 5412, light-extraction elements are formed (e.g., optical element 4202 in FIG. 442).

In some embodiments, the second doped semiconductor layer can be p-doped, and the method further comprises bonding a temporary carrier to the second doped semiconductor layer and removing a substrate from the epitaxial structure, wherein the substrate was closer to the first doped semiconductor layer than the second doped semiconductor layer before removal of the substrate (e.g., removing the substrate as described in FIG. 37). Etching the epitaxial structure can occur before depositing the thin-film circuit layer to the epitaxial structure (e.g., FIG. 38). Etching the epitaxial structure can occur after bonding the thin-film circuit layer to the backplane (e.g., FIG. 41). Etching the epitaxial structure can occur after depositing the first thin-film layer and before applying the second thin-film layer (e.g., FIG. 49).

Figure 55:
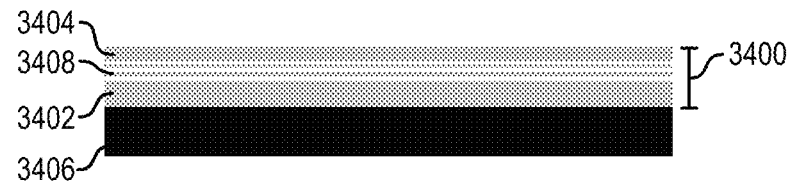
FIG. 55 is a simplified cross section of an embodiment of an epitaxial structure.

Instead of etching to isolate the epitaxial structure for forming an array of LEDs, other forms of isolation can be used. For example, ion implantation can be used to isolate the epitaxial structure for forming a plurality of LEDs. Referring next to FIGS. 55-64, cross sections of an embodiment for a process of isolating an epitaxial structure by ion implantation are shown. FIG. 55 is a simplified cross section of an embodiment of an epitaxial structure 3400 similar to the epitaxial structure 3400 in FIG. 34. The epitaxial structure 3400 comprises a first doped semiconductor layer 3402 and a second doped semiconductor layer 3404. The first doped semiconductor layer 3402 and the second doped semiconductor layer 3404 are on a substrate 3406. In some embodiments, the substrate 3406 is part of the epitaxial structure 3400. The epitaxial structure 3400 can also contain a light-emitting layer 3408 between the first doped semiconductor layer 3402 and the second doped semiconductor layer 3404. In the embodiment shown, the first doped semiconductor layer 3402 in n-doped and the second doped semiconductor layer 3404 is p-doped. In other embodiments, the first doped semiconductor layer 3402 can be p-doped, and/or the second doped semiconductor layer 3404 can be n-doped.

Figure 56:
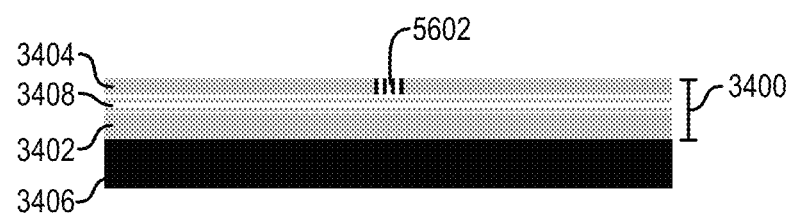
FIG. 56 is a simplified cross section of an embodiment of p-side isolation of the epitaxial structure by ion implantation.

FIG. 56 is a simplified cross section of an embodiment of p-side isolation of the epitaxial structure by ion implantation. Ions are implanted into the second doped semiconductor layer 3404, altering a portion of the second doped semiconductor layer 3404 to form a blocking region 5602. The blocking region 5602 isolates adjacent portions of the second doped semiconductor layer 3404 for forming a plurality of LEDs. In some embodiments, other processes for isolation are used (e.g., chemical or GaN modification) instead of, or in conjunction with, ion implantation. The blocking region 5602 can have a two-dimensional shape (e.g., in the x/y plane) similar to the trench 3802 in FIG. 38.

Figure 57:
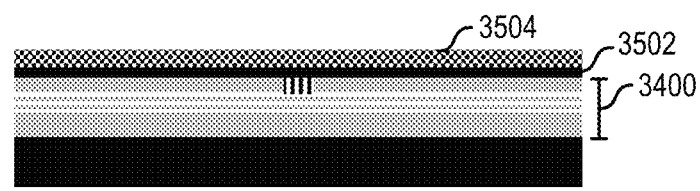
FIG. 57 is a simplified cross section of an embodiment of the epitaxial structure with a contact layer and a temporary bonding layer deposited on the epitaxial structure.

FIG. 57 is a simplified cross section of an embodiment of the epitaxial structure 3400 with a contact layer 3502 and a temporary bonding layer 3504 deposited on the epitaxial structure 3400. The contact layer 3502 and temporary bonding layer 3504 are applied to the epitaxial structure 3400 similarly as described in FIG. 35.

Figure 58:
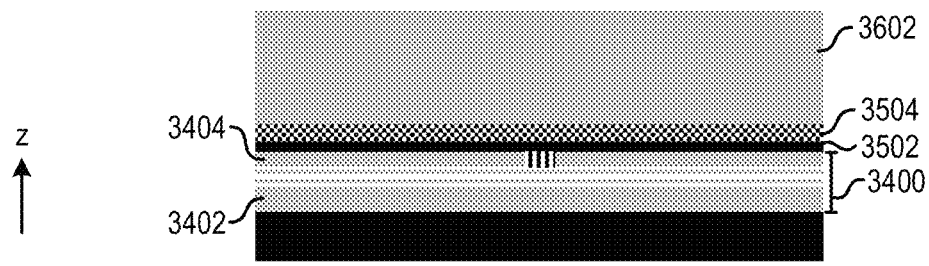
FIG. 58 is a simplified cross section of an embodiment of the epitaxial structure with a temporary carrier bonded to the epitaxial structure.

FIG. 58 is a simplified cross section of an embodiment of the epitaxial structure 3400 with a temporary carrier 3602 bonded to the epitaxial structure 3400. The temporary carrier 3602 is secured to the epitaxial structure 3400 by the temporary bonding layer 3504. The temporary carrier 3602 is attached to a p-side of the epitaxial structure 3400 (e.g., the second doped semiconductor layer 3404, which is p-doped, is closer to the temporary carrier 3602 than the first doped semiconductor layer 3402, which is n-doped).

Figure 59:
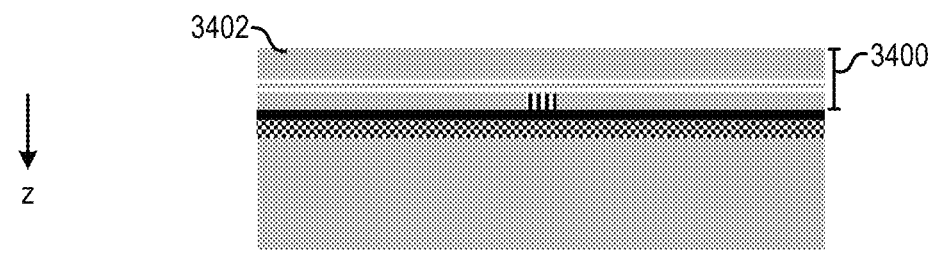
FIG. 59 is a simplified cross section of an embodiment of etching the epitaxial structure with a substrate removed from the epitaxial structure.

FIG. 59 is a simplified cross section of an embodiment of the epitaxial structure 3400 with the substrate (e.g., substrate 3406 in FIG. 58) removed from the epitaxial structure 3400. After the substrate is removed, the epitaxial structure 3400 is planarized (e.g., by a chemical mechanical planarization (CMP)). The first doped semiconductor layer 3402, which is n-doped, is exposed and planarized.

Figure 60:
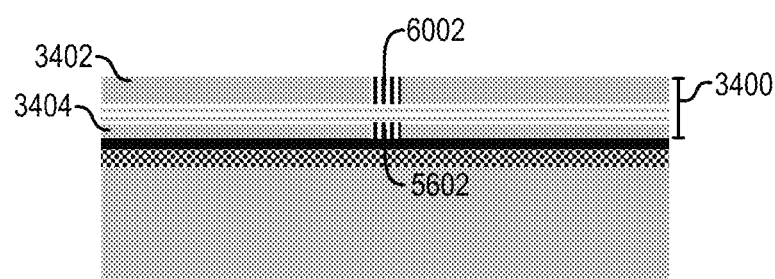
FIG. 60 is a simplified cross section of an embodiment of n-side isolation of the epitaxial structure by ion implantation.

FIG. 60 is a simplified cross section of an embodiment of n-side isolation of the epitaxial structure 3400 by ion implantation. Ions are implanted into the first doped semiconductor layer 3402, altering a portion of the first doped semiconductor layer 3402 to form a blocking region 6002. The blocking region 6002 isolates adjacent portions of the first doped semiconductor layer 3402 for forming a plurality of LEDs. In some embodiments, other processes for isolation are used (e.g., chemical or GaN modification) instead of, or in conjunction with, ion implantation. The blocking region 6002 can have a two-dimensional shape (e.g., in the x/y plane) similar to blocking region 5602 in the second doped semiconductor layer 3404.

Figure 61:
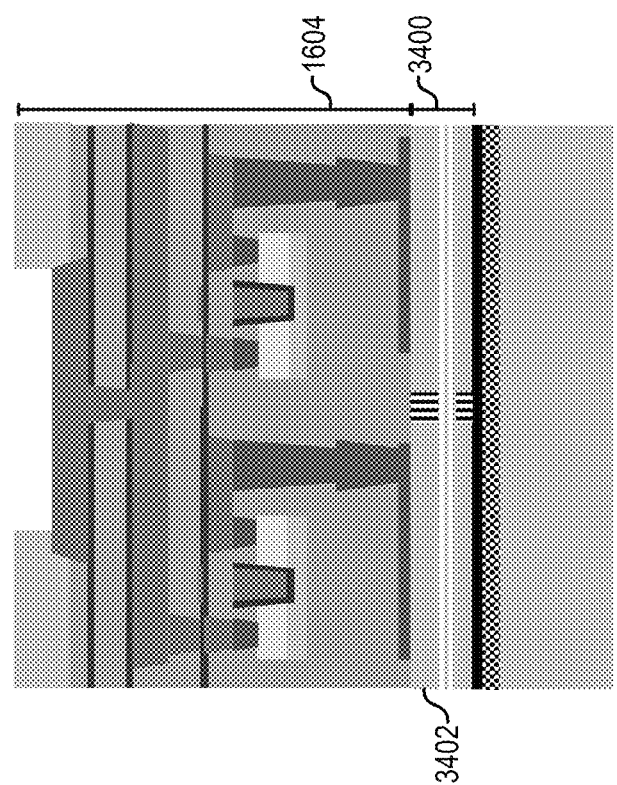
FIG. 61 is a simplified cross section of an embodiment of a thin-film circuit layer deposited on the epitaxial structure.

FIG. 61 is a simplified cross section of an embodiment of a thin-film circuit layer 1604 deposited on the epitaxial structure 3400, similar to FIG. 39. The thin-film circuit layer 1604 comprises a transistor layer 1606 and an interconnect layer 1608. The transistor layer 1606 is formed on an exposed surface of the first doped semiconductor layer 3402 (e.g., n-type). The transistor layer 1606 can include thin-film transistor semiconductor material.

Figure 62:
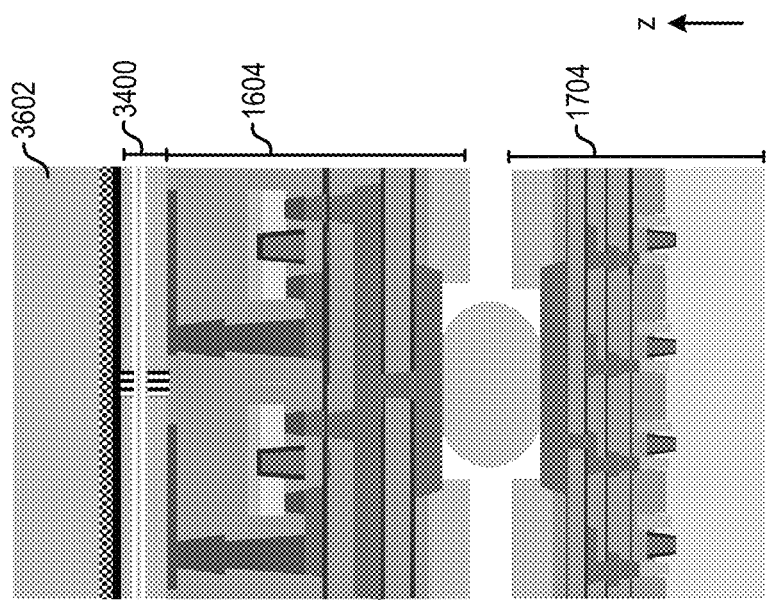
FIG. 62 is a simplified cross section of an embodiment of the thin-film circuit layer bonded to a backplane.

FIG. 62 is a simplified cross section of an embodiment of the thin-film circuit layer 1604 bonded to a backplane 1704, similar to FIG. 40. The epitaxial structure 3400, the thin-film circuit layer 1604, and the backplane 1704 are arranged vertically (e.g., a stacked structure). FIG. 62 shows the temporary carrier 3602 extending above (in the z direction) the epitaxial structure 3400.

Figure 63:
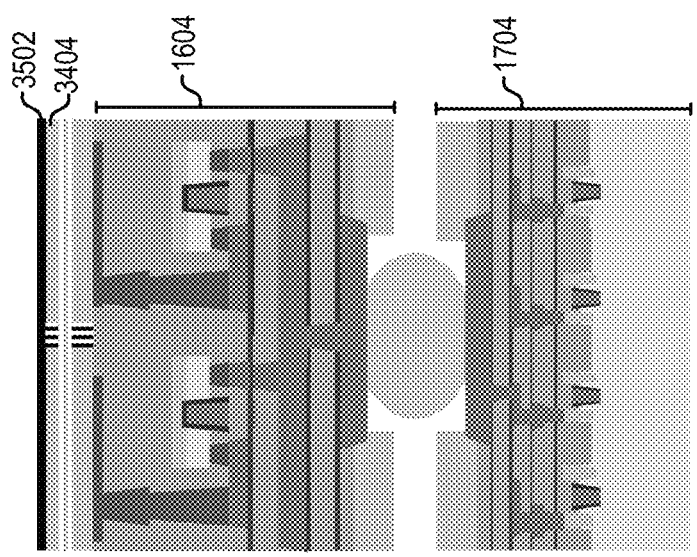
FIG. 63 is a simplified cross section of an embodiment of the temporary carrier removed after bonding.

FIG. 63 is a simplified cross section of an embodiment of the temporary carrier (e.g., temporary carrier 3602 in FIG. 62) removed after bonding the backplane 1704 to the thin-film circuit layer 1604, similar to FIG. 41. In some embodiments, the temporary carrier and/or the temporary bonding layer are removed by a solvent (e.g., a solvent that dissolves the temporary bonding layer). Removing the temporary carrier exposes the second doped semiconductor layer 3404 and/or the contact layer 3502.

Figure 64:
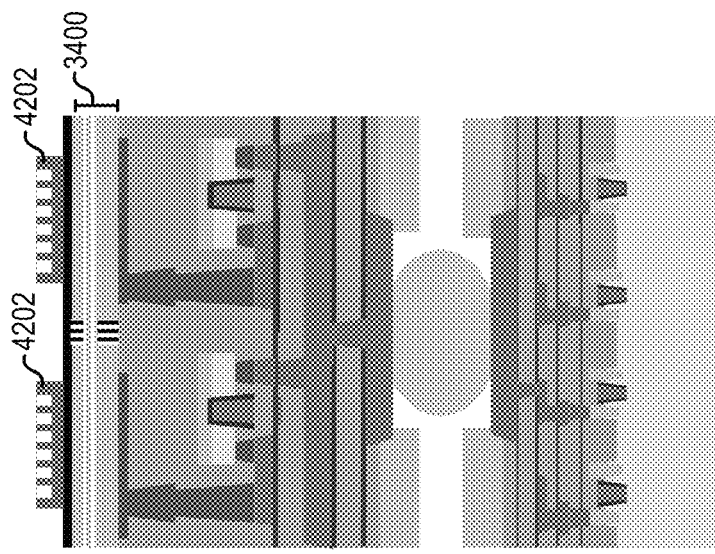
FIG. 64 is a simplified cross section of an embodiment of adding light-extracting elements to the epitaxial structure.

FIG. 64 is a simplified cross section of an embodiment of adding optical elements 4202 to the epitaxial structure 3400, similar to FIG. 42. The optical elements 4202 can be used to more efficiently extract light from the epitaxial structure 3400. For example, the optical elements 4202 can be diffraction gratings. Though the optical elements 4202 are shown in FIG. 64 to resemble diffraction gratings, optical elements 4202 could be other optical features, such as lenses.

Though FIGS. 58-64 depict isolating (e.g., by ion implantation) both the first doped semiconductor layer 3402 and the second doped semiconductor layer 3404, in some embodiments, only one doped semiconductor layer is isolated. For example, only the first doped semiconductor layer 3402, or only the second doped semiconductor layer 3404, but not both are isolated by ion implantation.

Figure 65:
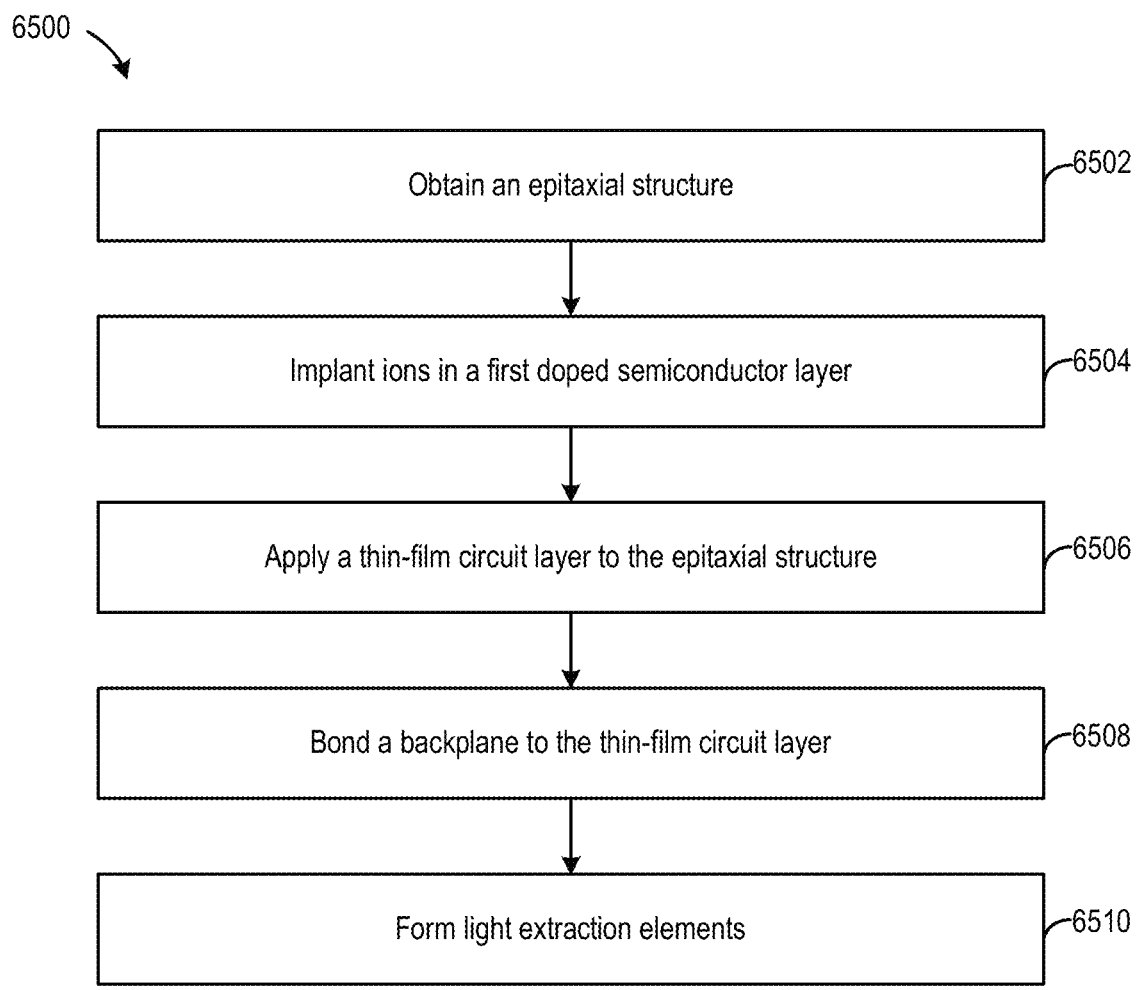
FIG. 65 is a flowchart of an embodiment of a process of using ion implantation to isolate portions of the epitaxial structure.

FIG. 65 is a flowchart of an embodiment of a process 6500 of using ion implantation to isolate portions of the epitaxial structure for forming an array of LEDs. Process 6500 begins in step 6502 with obtaining an epitaxial structure (e.g., epitaxial structure 3400 in FIG. 55). The epitaxial structure can be a layered structure having a first doped semiconductor layer, a second doped semiconductor layer, and/or a light-emitting layer between the first doped semiconductor layer and the second doped semiconductor layer. A temporary carrier can be bonded to the epitaxial structure, wherein the second doped semiconductor structure is between the first doped semiconductor structure and the temporary carrier, and the first doped semiconductor structure is between the second doped semiconductor structure and a substrate of the epitaxial structure (e.g., FIG. 58). The substrate can be removed (e.g., FIG. 59).

In step 6504, ions are implanted in the first doped semiconductor layer to isolate portions of the first doped semiconductor layer for forming a plurality of LEDs (e.g., FIG. 60). In step 6506, a thin-film circuit layer is applied to the epitaxial structure (e.g., FIG. 61). The thin-film circuit layer is bonded to a backplane (e.g., FIG. 62) in step 6508. The temporary carrier can be removed (e.g., FIG. 63). In step 6510, light extraction elements are formed (e.g., FIG. 64).

In some embodiments, the process 6500 can also include implanting ions in the second doped semiconductor layer before bonding the temporary carrier to the epitaxial structure (e.g., FIG. 56). In some embodiments, the first doped semiconductor layer is not implanted with ions.

Figure 66:
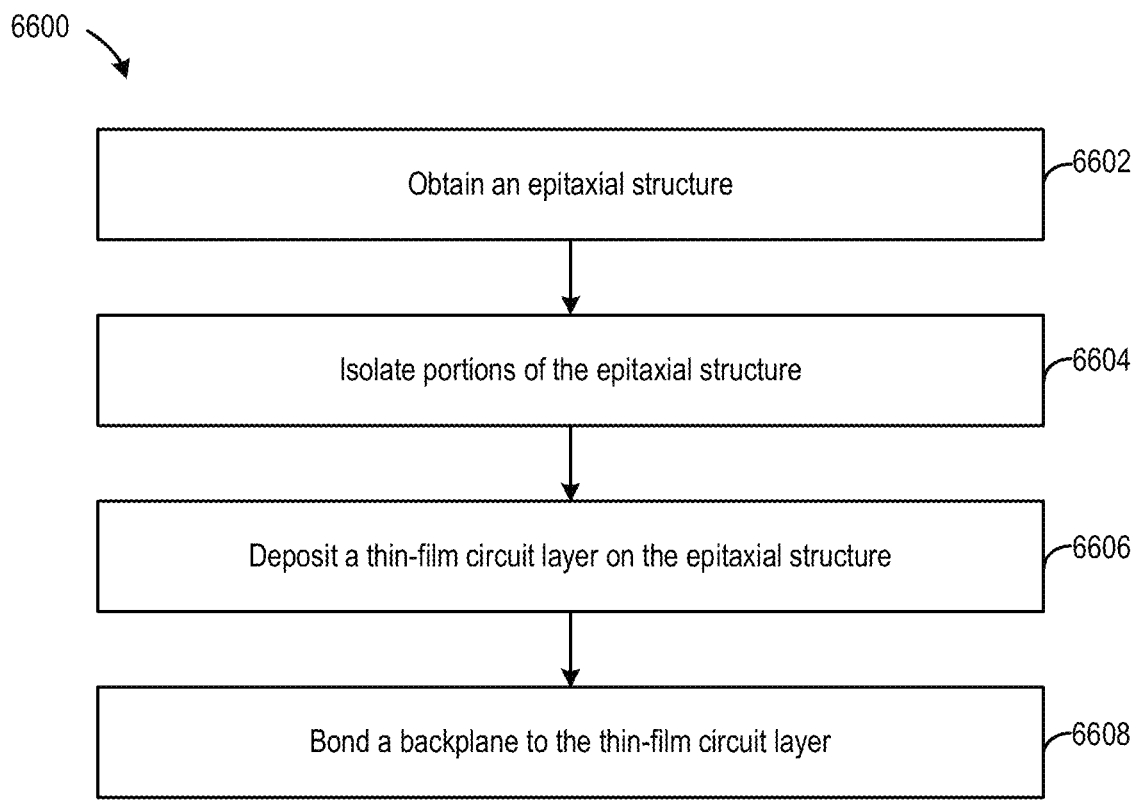
FIG. 66 is a flowchart of an embodiment of a process of isolating portions of the epitaxial structure.

FIG. 66 is a flowchart of an embodiment of a process 6600 for isolating portions of an epitaxial structure. Process 6600 beings in step 6602 with obtaining an epitaxial structure (e.g., epitaxial structure 34 in FIG. 35 or FIG. 55). The epitaxial structure is a layered structure that includes a first doped semiconductor layer (e.g., the first doped semiconductor layer 3402 in FIG. 35 or FIG. 55); a second doped semiconductor layer (e.g., the second doped semiconductor layer 3404 in FIG. 35 or FIG. 55); and/or a light-emitting layer (e.g., the light-emitting layer 3408 in FIG. 35 or FIG. 55) between the first doped semiconductor layer and the second doped semiconductor layer.

In step 6604, portions of the epitaxial structure are isolated. For example, isolating the epitaxial structure can include isolating portions of the first doped semiconductor layer, isolating portions of the second doped semiconductor layer, or isolating portions of both the first doped semiconductor layer and the second doped semiconductor layer for forming a plurality of LEDs. Examples of isolating portions of the epitaxial structure are described in FIGS. 38, 46, 49, 56, and 60. Isolating portions of the epitaxial structure can be done by various processes, including etching and ion implantation.

In step 6606, a thin-film circuit layer (e.g., thin-film circuit layer 1604) is deposited on the epitaxial structure. The thin-film circuit layer can comprise a first thin-film layer (e.g., transistor layer 1606), wherein the first thin-film layer comprises a plurality of transistors, and/or a second thin-film layer (e.g., interconnect layer 1608), wherein the second thin-film layer comprises interconnects for the plurality of transistors.

In step 6608, the thin-film circuit layer is bonded to a backplane (e.g., backplane 1704 is bonded to the thin-film circuit layer 1604 in FIG. 40, 44, 51, or 62). In some embodiments, light extraction elements can be formed to the epitaxial structure to couple light out of the light-emitting layer. For example, optical elements 4202 in FIG. 42, 47, 53, or 64 can be formed.

A temporary carrier (e.g., temporary carrier 3602 in FIG. 36 or FIG. 58) can be bonded to the epitaxial structure before bonding the thin-film circuit layer to the epitaxial structure, and/or the temporary carrier can be removed after bonding the thin-film circuit layer to the backplane.

In embodiments of FIGS. 34 and 55, the first doped semiconductor layer 3402 is n-doped, and the second doped semiconductor layer 3404 is p-doped. The p-doped layer can be used as the common (e.g., the cathode 3014 in FIG. 30). In some embodiments, the first doped semiconductor layer 3402 can be p-doped, and the second doped semiconductor layer 3404 can be n-doped. If so, the temporary carrier 3602 in FIG. 36 or FIG. 58 would not be used. However, more transistors might be used if the n-doped side is the common rather than using the p-doped side as the common. The thin-film circuit layer is on the non-common side, though in some embodiments, the thin-film circuit layer could be on the common side using vias.

FIG. 67 is a simplified cross section of an embodiment of an etched epitaxial structure 3400 bonded to a transparent substrate 6702. A transparent display allows a user to see through the display and can be useful in AR applications. In FIG. 67, two mesas used to form LEDs 6704 are shown for illustrative purposes, although a large number of LEDs 6704 are envisioned for an actual display. A trench 3802 is etched through the epitaxial structure 3400 to separate the LEDs 6704. While FIG. 67 presents a cross-sectional view, the same or similar singulation process may be implemented on multiple sides and thus define perimeters of each LED 6704. For example, from a top-down view (looking in a negative z direction), LEDs 6704 (e.g., in the x/y plane) may have a square or other shape.

A thin-film circuit layer 1604 is deposited on the epitaxial structure 3400. The thin-film circuit layer 1604 is bonded to the transparent substrate 6702. The transparent substrate 6702 can be made of glass or other transparent material. The thin-film circuit layer 1604 is electrically coupled with a trace 6708 that electrically connects the thin-film circuit layer with a pad 6710 on the transparent substrate 6702. Though only one trace 6708 and one pad 6710 are shown in FIG. 67, it is to be understood that there can be many traces 6708 electrically coupling the thin-film circuit layer 1604 with many pads 6710. Traces 6708 can be made of transparent, conductive material, such as indium tin oxide (ITO). Pad 6710 is electrically coupled with the backplane by one or more bumps 1502.

In FIG. 67, the epitaxial structure 3400 is arranged horizontally, not vertically, with the backplane 1704. The epitaxial structure 3400 is placed next to the backplane 1704 on the transparent substrate 6702. Horizontal arrangement allows the backplane 1704, which has a silicon substrate, to be located at a periphery of a display, thereby retaining overall transparency of the display.

Though epitaxial structure 3400 has portions isolated by trenches 3802, other isolation processes (e.g., ion implantation discussed in FIG. 56 or 60) could be used to singulate LEDs 6704. In some embodiments, an apparatus comprises a transparent substrate 6702, a plurality of LEDs 6704; a thin-film circuit layer 1604 comprising a plurality of transistors electrically coupled with the plurality of LEDs, wherein: the plurality of transistors are configured to control operation of the plurality of LEDs, and the thin-film circuit layer 1604 is bonded to the transparent substrate 6702; and/or a backplane 1704 bonded to the transparent substrate 6702, wherein: the backplane 1704 is electrically coupled with the thin-film circuit layer 1604 (e.g., by bump 1502, pad 6710, and trace 6708), and/or the backplane 1704 is on a same side of the transparent substrate 6702 as the thin-film circuit layer 1604. In some embodiments, the apparatus further comprises a frame (e.g., frame 305 in FIG. 3) of an augmented-reality system, the frame holding the plurality of LEDs, wherein the plurality of LEDs are part of a display (e.g., part of image source 412 in FIG. 4) for the augmented-reality system.

FIG. 68 is a simplified illustration of traces 6708 from LEDs 6704 in an array on a transparent substrate 6702 to a backplane 1704. One trace 6708 can electrically couple a group 6802 of LEDs 6704 to a backplane 1704. A group 6802 of LEDs 6704 can share a trace 6708 in FIG. 68 similarly as a plurality of LEDs 3010 share a control line 3006 in FIG. 30. In some embodiments, a group 6802 of LEDs 6704 is considered a plurality of LEDs. Traces 6708 can be between groups 6802 of LEDs 6704.

In some embodiments, multiple dies of LEDs 6704 can be bonded to the transparent substrate 6702 to build an array of LEDs 6704. There can be one or more backplanes 1704 bonded to the transparent substrate 6702. Backplanes 1704 can be arranged on one, two, three, or more sides of the array of LEDs 6704. Backplanes 1704 are bonded to a side of the transparent substrate 6702 to not be in an optical path of a user.

Note that figures are not necessarily to scale, and relative thickness of layers may be different from relative thicknesses shown in the figures. For example, the epitaxial structure may be significantly thicker than the thin-film circuit layer, even though some figures depict the thin-film circuit layer as being thicker than the epitaxial structure.

Figure 69:
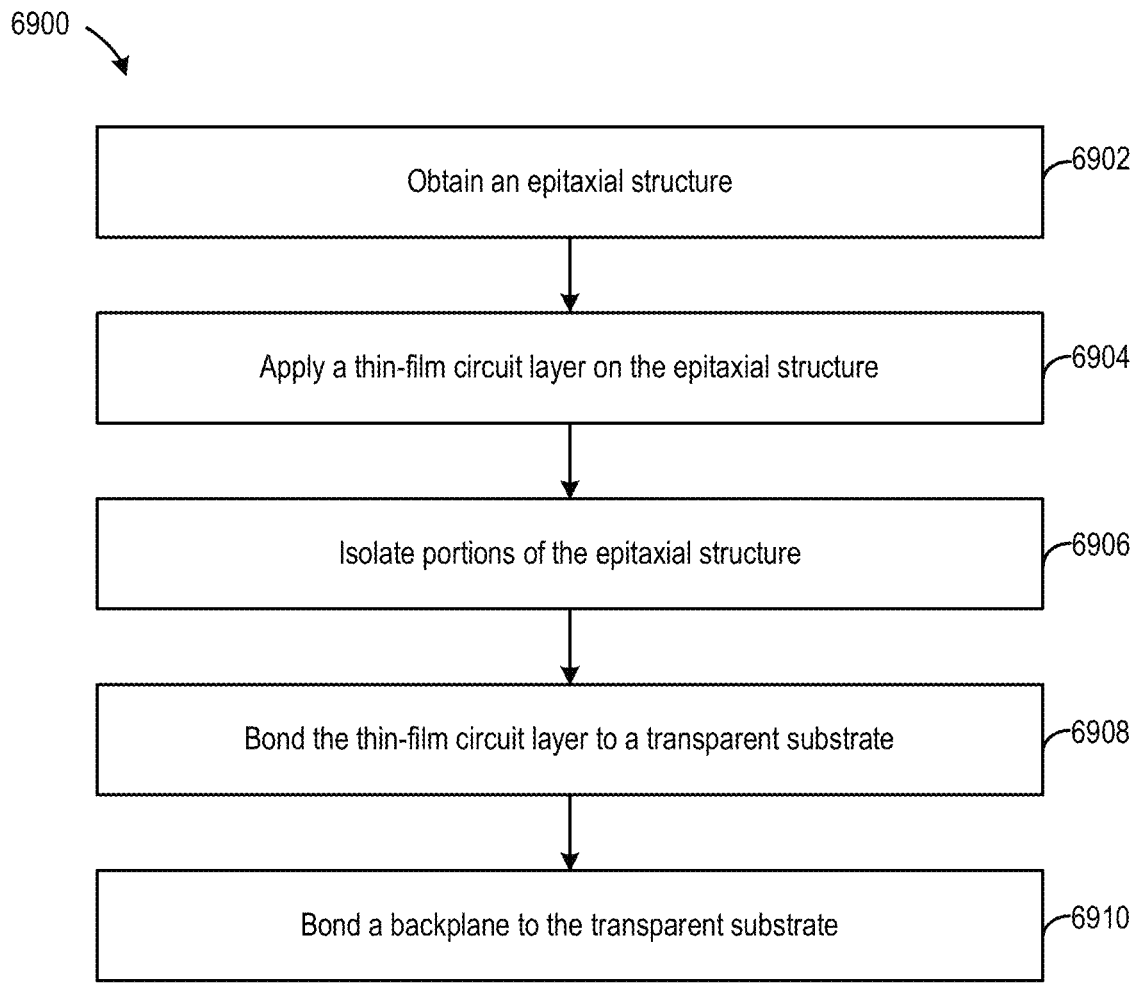
FIG. 69 is a flowchart of an embodiment for bonding an LED array to a transparent substrate.

FIG. 69 is a flowchart of an embodiment of a process 6900 for bonding an LED array to a transparent substrate. Process 6900 begins in step 6902 with obtaining an epitaxial structure (e.g., epitaxial structure 34 in FIG. 35 or FIG. 55). The epitaxial structure is a layered structure that includes a first doped semiconductor layer (e.g., the first doped semiconductor layer 3402 in FIG. 35 or FIG. 55); a second doped semiconductor layer (e.g., the second doped semiconductor layer 3404 in FIG. 35 or FIG. 55); and/or a light-emitting layer (e.g., the light-emitting layer 3408 in FIG. 35 or FIG. 55) between the first doped semiconductor layer and the second doped semiconductor layer.

In step 6904, a thin-film circuit layer (e.g., thin-film circuit layer 1604) is applied to the epitaxial structure. In step 6906, portions of the epitaxial structure are isolated. For example, isolating the epitaxial structure can include isolating portions of the first doped semiconductor layer, isolating portions of the second doped semiconductor layer, or isolating portions of both the first doped semiconductor layer and the second doped semiconductor layer for forming a plurality of LEDs. Examples of isolating portions of the epitaxial structure are described in FIGS. 38, 46, 49, 56, and 60. Isolating portions of the epitaxial structure can be done by various processes, including etching and ion implantation. Isolating the thin-film circuit layer can be done before, after, or between applying layers of the thin-film circuit layer.

In step 6908, the thin-film circuit layer is bonded to a transparent substrate (e.g., the thin-film circuit layer 1604 is bonded to the transparent substrate 6702 in FIG. 67), after applying the thin-film circuit layer to the epitaxial structure. The transparent substrate is transparent (e.g., 75%, 85%, 90%, 95%, 99% or higher transmission for light having a wavelength between 450 and 700 nm; such as red, green, and/or blue wavelengths of light having a transmission greater than 75%, 85%, 90%, 95%, or 99% through the transparent substrate).

In step 6910, a backplane (e.g., backplane 1704 in FIG. 67) is bonded to the transparent substrate, wherein the backplane is electrically coupled with the thin-film circuit layer, and/or the thin-film circuit layer and the backplane are on a same side of the transparent substrate.

Figure 70:
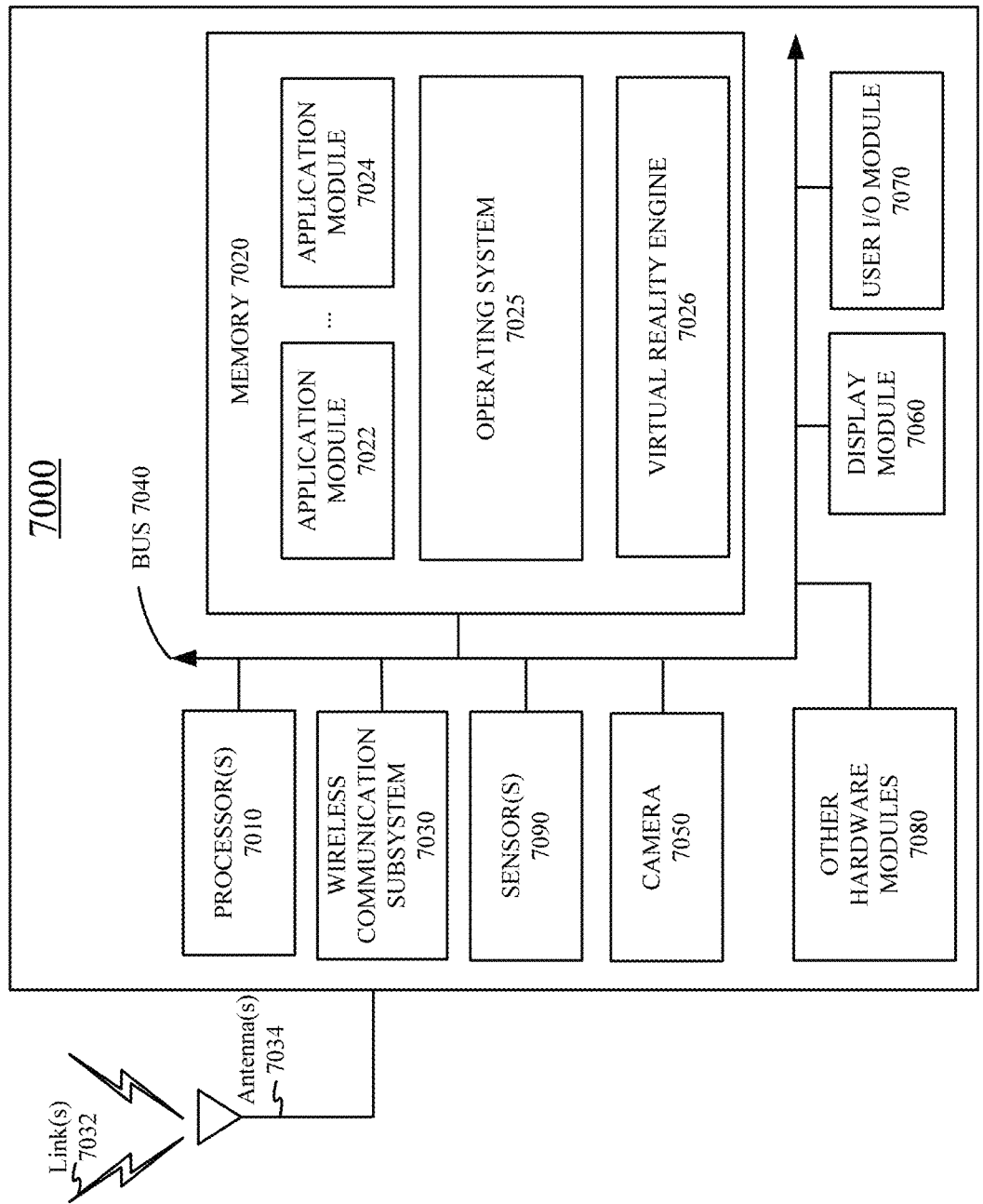
FIG. 70 is a simplified block diagram of an electronic system of an example of a near-eye display according to certain embodiments.

FIG. 70 is a simplified block diagram of an example electronic system 7000 of an example near-eye display (e.g., HMD device) for implementing some of the examples disclosed herein. Electronic system 7000 may be used as the electronic system of an HMD device or other near-eye displays described above. In this example, electronic system 7000 may include one or more processor(s) 7010 and a memory 7020. Processor(s) 7010 may be configured to execute instructions for performing operations at a number of components, and can be, for example, a general-purpose processor or microprocessor suitable for implementation within a portable electronic device. Processor(s) 7010 may be communicatively coupled with a plurality of components within electronic system 7000. To realize this communicative coupling, processor(s) 7010 may communicate with the other illustrated components across a bus 7040. Bus 7040 may be any subsystem adapted to transfer data within electronic system 7000. Bus 7040 may include a plurality of computer buses and additional circuitry to transfer data.

Memory 7020 may be coupled to processor(s) 7010. In some embodiments, memory 7020 may offer both short-term and long-term storage and may be divided into several units. Memory 7020 may be volatile, such as static random access memory (SRAM) and/or dynamic random access memory (DRAM) and/or non-volatile, such as read-only memory (ROM), flash memory, and the like. Furthermore, memory 7020 may include removable storage devices, such as secure digital (SD) cards. Memory 7020 may provide storage of computer-readable instructions, data structures, program modules, and other data for electronic system 7000. In some embodiments, memory 7020 may be distributed into different hardware modules. A set of instructions and/or code might be stored on memory 7020. The instructions might take the form of executable code that may be executable by electronic system 7000, and/or might take the form of source and/or installable code, which, upon compilation and/or installation on electronic system 7000 (e.g., using any of a variety of generally available compilers, installation programs, compression/decompression utilities, etc.), may take the form of executable code.

In some embodiments, memory 7020 may store a plurality of application modules 7022 through 7024, which may include any number of applications. Examples of applications may include gaming applications, conferencing applications, video playback applications, or other suitable applications. The applications may include a depth sensing function or eye tracking function. Application modules 7022-7024 may include particular instructions to be executed by processor(s) 7010. In some embodiments, certain applications or parts of application modules 7022-7024 may be executable by other hardware modules 7080. In certain embodiments, memory 7020 may additionally include secure memory, which may include additional security controls to prevent copying or other unauthorized access to secure information.

In some embodiments, memory 7020 may include an operating system 7025 loaded therein. Operating system 7025 may be operable to initiate the execution of the instructions provided by application modules 7022-7024 and/or manage other hardware modules 7080 as well as interfaces with a wireless communication subsystem 7030 which may include one or more wireless transceivers. Operating system 7025 may be adapted to perform other operations across the components of electronic system 7000 including threading, resource management, data storage control and other similar functionality.

Wireless communication subsystem 7030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 7000 may include one or more antennas 7034 for wireless communication as part of wireless communication subsystem 7030 or as a separate component coupled to any portion of the system. Depending on desired functionality, wireless communication subsystem 7030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 7030 may permit data to be exchanged with a network, other computer systems, and/or any other devices described herein. Wireless communication subsystem 7030 may include a means for transmitting or receiving data, such as identifiers of HMD devices, position data, a geographic map, a heat map, photos, or videos, using antenna(s) 7034 and wireless link(s) 7032. Wireless communication subsystem 7030, processor(s) 7010, and memory 7020 may together comprise at least a part of one or more of a means for performing some functions disclosed herein.

Embodiments of electronic system 7000 may also include one or more sensors 7090. Sensor(s) 7090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 7090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 7000 may include a display module 7060. Display module 7060 may be a near-eye display, and may graphically present information, such as images, videos, and various instructions, from electronic system 7000 to a user. Such information may be derived from one or more application modules 7022-7024, virtual reality engine 7026, one or more other hardware modules 7080, a combination thereof, or any other suitable means for resolving graphical content for the user (e.g., by operating system 7025). Display module 7060 may use LCD technology, LED technology (including, for example, OLED, ILED, μ-LED, AMOLED, TOLED, etc.), light emitting polymer display (LPD) technology, or some other display technology.

Electronic system 7000 may include a user input/output module 7070. User input/output module 7070 may allow a user to send action requests to electronic system 7000. An action request may be a request to perform a particular action. For example, an action request may be to start or end an application or to perform a particular action within the application. User input/output module 7070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 7000. In some embodiments, user input/output module 7070 may provide haptic feedback to the user in accordance with instructions received from electronic system 7000. For example, the haptic feedback may be provided when an action request is received or has been performed.

Electronic system 7000 may include a camera 7050 that may be used to take photos or videos of a user, for example, for tracking the user's eye position. Camera 7050 may also be used to take photos or videos of the environment, for example, for VR, AR, or MR applications. Camera 7050 may include, for example, a complementary metal-oxide-semiconductor (CMOS) image sensor with a few millions or tens of millions of pixels. In some implementations, camera 7050 may include two or more cameras that may be used to capture 3-D images.

In some embodiments, electronic system 7000 may include a plurality of other hardware modules 7080. Each of other hardware modules 7080 may be a physical module within electronic system 7000. While each of other hardware modules 7080 may be permanently configured as a structure, some of other hardware modules 7080 may be temporarily configured to perform specific functions or temporarily activated. Examples of other hardware modules 7080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 7080 may be implemented in software.

In some embodiments, memory 7020 of electronic system 7000 may also store a virtual reality engine 7026. Virtual reality engine 7026 may execute applications within electronic system 7000 and receive position information, acceleration information, velocity information, predicted future positions, or any combination thereof of the HMD device from the various sensors. In some embodiments, the information received by virtual reality engine 7026 may be used for producing a signal (e.g., display instructions) to display module 7060. For example, if the received information indicates that the user has looked to the left, virtual reality engine 7026 may generate content for the HMD device that mirrors the user's movement in a virtual environment. Additionally, virtual reality engine 7026 may perform an action within an application in response to an action request received from user input/output module 7070 and provide feedback to the user. The provided feedback may be visual, audible, or haptic feedback. In some implementations, processor(s) 7010 may include one or more GPUs that may execute virtual reality engine 7026.

In various implementations, the above-described hardware and modules may be implemented on a single device or on multiple devices that can communicate with one another using wired or wireless connections. For example, in some implementations, some components or modules, such as GPUs, virtual reality engine 7026, and applications (e.g., tracking application), may be implemented on a console separate from the head-mounted display device. In some implementations, one console may be connected to or support more than one HMD.

In alternative configurations, different and/or additional components may be included in electronic system 7000. Similarly, functionality of one or more of the components can be distributed among the components in a manner different from the manner described above. For example, in some embodiments, electronic system 7000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An apparatus comprising:
    a semiconductor die including an array of light emitting diodes (LEDs), each LED of the array of LEDs comprising a layered epitaxial structure including a first doped semiconductor layer, a second doped semiconductor layer, and a light-emitting layer between the first doped semiconductor layer and the second doped semiconductor layer;
    a thin-film circuit layer deposited on the array of LEDs, wherein the array of LEDs is a support structure for depositing the thin-film circuit layer, and the thin-film circuit layer comprises thin-film transistor circuitry for controlling operation of LEDs in the array of LEDs;
    a plurality of metal bonds; and
    a backplane coupled with the thin-film circuit layer using the plurality of metal bonds, wherein the backplane includes complementary metal-oxide-semiconductor (CMOS) transistor circuitry for supplying electrical current to the thin-film circuit layer through the plurality of metal bonds, and wherein a number of metal bonds of the plurality of metal bonds coupling the backplane with the thin-film circuit layer is less than a number of LEDs in the array of LEDs.

2. The apparatus of claim 1, wherein the plurality of metal bonds comprises nanoporous copper.

3. The apparatus of claim 1, wherein spacing between metal bonds of the plurality of metal bonds is equal to or greater than 5 microns and equal to or less than 18 microns.

4. The apparatus of claim 1, wherein:
    the array of LEDs comprises a count of LEDs,
    the plurality of metal bonds includes a count of metal bonds, and the count of metal bonds is at least two orders of magnitude less than the count of LEDs.

5. The apparatus of claim 1, wherein the array of LEDs occupies a footprint, and the plurality of metal bonds is dispersed over the footprint.

6. The apparatus of claim 1, wherein each LED in the array of LEDs is formed of a crystalline semiconductor structure, and the thin-film circuit layer is not lattice matched to the crystalline semiconductor structure of the array of LEDs.

7. The apparatus of claim 6, wherein the thin-film circuit layer comprises a semiconductor material having an amorphous or polycrystalline structure.

8. The apparatus of claim 1, wherein the thin-film circuit layer includes material comprising at least one of: c-axis aligned crystal Indium-Gallium-Zinc oxide (CAAC-IGZO), amorphous indium gallium zinc oxide (a-IGZO), low-temperature polycrystalline silicon (LTPS), or amorphous silicon (a-Si).

9. The apparatus of claim 1, wherein the array of LEDs includes material comprising at least one of: Gallium Nitride (GaN), Indium Gallium Arsenide (InGaAs), Indium Gallium Phosphide (AlInGaP), or Gallium Arsenide (GaAs).

10. The apparatus of claim 1, wherein the CMOS transistor circuitry in the backplane is formed in single crystal silicon.

11. The apparatus of claim 1, wherein the plurality of metal bonds comprises a metal material that has a melting point or bonding temperature less than 300 degrees Celsius.

12. A method comprising:
obtaining a semiconductor structure, wherein the semiconductor structure is a layered epitaxial structure including a first doped semiconductor layer, a second doped semiconductor layer, and a light-emitting layer between the first doped semiconductor layer and the second doped semiconductor layer;
forming an array of light emitting diodes (LEDs) from the semiconductor structure;
depositing a thin-film circuit layer on the semiconductor structure, wherein the semiconductor structure is a support structure for depositing the thin-film circuit layer;
forming thin-film transistor circuitry in the thin-film circuit layer for controlling operation of LEDs in the array of LEDs;
obtaining a backplane, the backplane comprising complementary metal-oxide-semiconductor (CMOS) transistor drive circuitry for supplying electrical current to the thin-film circuit layer through a plurality of metal bonds;
forming a plurality of metal bumps on the thin-film circuit layer or on the backplane; and
bonding the backplane to the thin-film circuit layer using the plurality of metal bumps, wherein the plurality of metal bumps becomes the plurality of metal bonds after bonding, and wherein a number of metal bonds of the plurality of metal bonds is less than a number of LEDs in the array of LEDs.

13. The method of claim 12, wherein the bonding the backplane to the thin-film circuit layer uses a temperature of no more than 300 degrees Celsius.

14. The method of claim 12, wherein multiple LEDs in the array of LEDs are configured to receive electrical current from the backplane through one metal bond of the plurality of metal bonds after bonding the backplane to the thin-film circuit layer.

15. The method of claim 12, wherein:
the array of LEDs is divided into a plurality of tiles, each tile of the plurality of tiles comprises a plurality of rows of LEDs; and
rows of the plurality of rows of LEDs are configured to be activated at different times.

16. The method of claim 12, wherein spacing between metal bonds of the plurality of metal bonds is equal to or greater than 5 microns and equal to or less than 18 microns.

17. The method of claim 12, wherein forming circuitry in the thin-film circuit layer comprises forming a plurality of transistors in the thin-film circuit layer and one control line electrically coupled with the plurality of transistors.

18. A system comprising:
a frame of a head-mounted device; and
a display integrated with the frame, wherein the display is configured to present content to a user of the head-mounted device, the display comprising:
project optics configured to couple light from a light source into a waveguide; and
the light source, wherein the light source comprises:
a semiconductor die including an array of light emitting diodes (LEDs), each LED of the array of LEDs comprising a layered epitaxial structure including a first doped semiconductor layer, a second doped semiconductor layer, and a light-emitting layer between the first doped semiconductor layer and the second doped semiconductor layer;
a thin-film circuit layer deposited on the array of LEDs, wherein the array of LEDs is a support structure for depositing the thin-film circuit layer, and the thin-film circuit layer comprises thin-film transistor circuitry for controlling operation of LEDs in the array of LEDs;
a plurality of metal bonds; and
a backplane coupled with the thin-film circuit layer using the plurality of metal bonds, wherein the backplane includes complementary metal-oxide-semiconductor (CMOS) transistor circuitry for supplying electrical current to the thin-film circuit layer through the plurality of metal bonds, and wherein a number metal bonds of the plurality of metal bonds coupling the backplane with the thin-film circuit layer is less than a number of LEDs in the array of LEDs.

19. The system of claim 18, wherein the plurality of metal bonds comprises a metal material that has a melting point or bonding temperature less than 300 degrees Celsius.

20. The system of claim 18, wherein the backplane comprises silicon, and the layered epitaxial structure comprises III-V or III-nitride material.

* * * * *